(12) United States Patent
Yamazaki et al.

(10) Patent No.: US 9,231,110 B2
(45) Date of Patent: *Jan. 5, 2016

(54) SEMICONDUCTOR DEVICE AND METHOD FOR MANUFACTURING THE SAME

(71) Applicant: Semiconductor Energy Laboratory Co., Ltd., Atsugi-shi, Kanagawa-ken (JP)

(72) Inventors: Shunpei Yamazaki, Setagaya (JP); Junichiro Sakata, Atsugi (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/515,792

(22) Filed: Oct. 16, 2014

(65) Prior Publication Data

US 2015/0037933 A1    Feb. 5, 2015

Related U.S. Application Data

(60) Continuation of application No. 13/731,546, filed on Dec. 31, 2012, now Pat. No. 8,980,665, which is a division of application No. 12/612,096, filed on Nov. 4, 2009, now Pat. No. 8,395,148.

(30) Foreign Application Priority Data

Nov. 7, 2008 (JP) .................. 2008-286384

(51) Int. Cl.
*H01L 21/00* (2006.01)
*H01L 21/16* (2006.01)
(Continued)

(52) U.S. Cl.
CPC .... *H01L 29/78669* (2013.01); *H01L 21/02565* (2013.01); *H01L 29/66742* (2013.01);
(Continued)

(58) Field of Classification Search
CPC .................. H01L 29/66742; H01L 29/66969; H01L 29/78669; H01L 29/7869; H01L 29/78678; H01L 29/78696; H01L 27/1225; H01L 21/02565
USPC ........................................ 438/104, 30, 31, 48
See application file for complete search history.

(56) References Cited

U.S. PATENT DOCUMENTS 5,561,074 A    10/1996    Koide et al.
5,710,055 A    1/1998     Kizilyalli
(Continued)

FOREIGN PATENT DOCUMENTS

CN    001132941 A    10/1996
CN    001934712 A    3/2007
(Continued)

OTHER PUBLICATIONS

Chinese Office Action (Application No. 200910220877.0) Dated Dec. 27, 2012.

(Continued)

*Primary Examiner* — Long K Tran
(74) *Attorney, Agent, or Firm* — Robinson Intellectual Property Law Office; Eric J. Robinson

(57) ABSTRACT

It is an object to provide a highly reliable semiconductor device including a thin film transistor whose electric characteristics are stable. In addition, it is another object to manufacture a highly reliable semiconductor device at low cost with high productivity. In a semiconductor device including a thin film transistor, a semiconductor layer of the thin film transistor is formed with an oxide semiconductor layer to which a metal element is added. As the metal element, at least one of metal elements of iron, nickel, cobalt, copper, gold, manganese, molybdenum, tungsten, niobium, and tantalum is used. In addition, the oxide semiconductor layer contains indium, gallium, and zinc.

10 Claims, 32 Drawing Sheets

(51) Int. Cl.
 *H01L 29/786* (2006.01)
 *H01L 29/66* (2006.01)
 *H01L 21/02* (2006.01)
 *H01L 27/12* (2006.01)

(52) U.S. Cl.
 CPC ...... *H01L29/66969* (2013.01); *H01L 29/7869* (2013.01); *H01L 29/78678* (2013.01); *H01L 29/78696* (2013.01); *H01L 27/1225* (2013.01)

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 5,767,557 A | 6/1998 | Kizilyalli |
| 5,847,410 A | 12/1998 | Nakajima |
| 6,294,274 B1 | 9/2001 | Kawazoe et al. |
| 6,452,213 B1 | 9/2002 | Kimura et al. |
| 6,563,174 B2 | 5/2003 | Kawasaki et al. |
| 6,586,346 B1 | 7/2003 | Yamazaki et al. |
| 6,727,522 B1 | 4/2004 | Kawasaki et al. |
| 6,960,812 B2 | 11/2005 | Yamazaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,301,211 B2 | 11/2007 | Yamazaki et al. |
| 7,323,356 B2 | 1/2008 | Hosono et al. |
| 7,378,286 B2 | 5/2008 | Hsu et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,576,394 B2 | 8/2009 | Furuta et al. |
| 7,601,984 B2 | 10/2009 | Sano et al. |
| 7,674,650 B2 | 3/2010 | Akimoto et al. |
| 7,732,251 B2 | 6/2010 | Hoffman et al. |
| 7,732,819 B2 | 6/2010 | Akimoto et al. |
| 7,981,734 B2 | 7/2011 | Furuta et al. |
| 8,013,331 B2 | 9/2011 | Wakita |
| 8,143,115 B2 | 3/2012 | Omura et al. |
| 8,143,678 B2 | 3/2012 | Kim et al. |
| 8,148,721 B2 | 4/2012 | Hayashi et al. |
| 8,164,700 B2 | 4/2012 | Hatta et al. |
| 8,203,144 B2 | 6/2012 | Hoffman et al. |
| 8,395,148 B2 | 3/2013 | Yamazaki et al. |
| 8,558,323 B2 | 10/2013 | Kim et al. |
| 8,618,543 B2 | 12/2013 | Lee et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0039670 A1 | 2/2005 | Hosono et al. |
| 2005/0199959 A1 | 9/2005 | Chiang et al. |
| 2006/0035452 A1 | 2/2006 | Carcia et al. |
| 2006/0038242 A1 | 2/2006 | Hsu et al. |
| 2006/0043377 A1 | 3/2006 | Hoffman et al. |
| 2006/0091394 A1 | 5/2006 | Honda |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0184576 A1 | 8/2007 | Chang et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0032444 A1 | 2/2008 | Wu et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0191204 A1 | 8/2008 | Kim et al. |
| 2008/0203387 A1 | 8/2008 | Kang et al. |
| 2008/0224133 A1 | 9/2008 | Park et al. |
| 2008/0237600 A1 | 10/2008 | Miyazaki et al. |
| 2008/0239189 A1 | 10/2008 | Hatta et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0020753 A1 | 1/2009 | Jeong et al. |
| 2009/0065771 A1 | 3/2009 | Iwasaki et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0179199 A1 | 7/2009 | Sano et al. |
| 2009/0184315 A1 | 7/2009 | Lee et al. |
| 2009/0186437 A1 | 7/2009 | Akimoto |
| 2009/0186445 A1 | 7/2009 | Akimoto |
| 2009/0189155 A1 | 7/2009 | Akimoto |
| 2009/0189156 A1 | 7/2009 | Akimoto |
| 2009/0239335 A1 | 9/2009 | Akimoto et al. |
| 2009/0242881 A1 | 10/2009 | Yoon et al. |
| 2009/0278122 A1 | 11/2009 | Hosono et al. |
| 2009/0280600 A1 | 11/2009 | Hosono et al. |
| 2010/0025676 A1 | 2/2010 | Yamazaki et al. |
| 2010/0025678 A1 | 2/2010 | Yamazaki et al. |
| 2010/0025679 A1 | 2/2010 | Yamazaki et al. |

(56) References Cited

U.S. PATENT DOCUMENTS

| | | |
|---|---|---|
| 2010/0032665 A1 | 2/2010 | Yamazaki et al. |
| 2010/0032666 A1 | 2/2010 | Yamazaki et al. |
| 2010/0035379 A1 | 2/2010 | Miyairi et al. |
| 2010/0051940 A1 | 3/2010 | Yamazaki et al. |
| 2010/0051949 A1 | 3/2010 | Yamazaki et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0123136 A1 | 5/2010 | Lee et al. |
| 2012/0168750 A1 | 7/2012 | Hayashi et al. |
| 2012/0208318 A1 | 8/2012 | Hoffman et al. |

FOREIGN PATENT DOCUMENTS

| | | |
|---|---|---|
| EP | 0678907 A | 10/1995 |
| EP | 1443130 A | 8/2004 |
| EP | 1737044 A | 12/2006 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-231472 A | 10/1991 |
| JP | 04-348533 A | 12/1992 |
| JP | 04-367277 A | 12/1992 |
| JP | 05-235354 A | 9/1993 |
| JP | 05-251705 A | 9/1993 |
| JP | 08-008440 A | 1/1996 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-137692 A | 5/2003 |
| JP | 2004-103957 A | 4/2004 |
| JP | 2004-273614 A | 9/2004 |
| JP | 2004-273732 A | 9/2004 |
| JP | 2006-060209 A | 3/2006 |
| JP | 2007-073705 A | 3/2007 |
| JP | 2007-096055 A | 4/2007 |
| JP | 2007-123861 A | 5/2007 |
| JP | 2007-150158 A | 6/2007 |
| JP | 2007-250983 A | 9/2007 |
| JP | 2008-199005 A | 8/2008 |
| JP | 2008-270744 A | 11/2008 |
| JP | 2010-135773 A | 6/2010 |
| KR | 2008-0094483 A | 10/2008 |
| TW | 200802888 | 1/2008 |
| TW | 200841475 | 10/2008 |
| WO | WO-2004/114391 | 12/2004 |
| WO | WO-2005/093850 | 10/2005 |
| WO | WO-2007/089048 | 8/2007 |
| WO | WO-2007/119386 | 10/2007 |
| WO | WO-2007/148601 | 12/2007 |
| WO | WO-2008/069056 | 6/2008 |
| WO | WO-2008/069255 | 6/2008 |

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.

Kimizuka.N. et al., "Syntheses and Single-Crystal Data of Homologous Compounds, $In_2O_3(ZnO)m$ (m = 3, 4, and 5), $InGaO_3(ZnO)_3$, and $Ga_2O_3(ZnO)m$ (m = 7, 8, 9, and 16) in the $In_2O_3$—$ZnGa_2O_4$—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Li.C et al., "Modulated Structures of Homologous Compounds $InMO_3(ZnO)m$ (M=In,Ga; m=Integer) Described by Four-Dimensional Superspace Group", Journal of Solid State Chemistry, 1998, vol. 139, pp. 347-355.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MoO_3$ as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LDCs", IDW'02 : Proceedings of the 9th International Display Workshops, Dec. 4, 2002, pp. 295-298.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

(56) References Cited

OTHER PUBLICATIONS

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by Peald Grown ZnO TFT", IMID '07 Digest, 2007, pp. 1249-1252.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic NANO-Structured Liquid Crystal Composites for Display Applications", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liqiud Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kimizuka.N et al., "Spinel,YbFe2O4, andYb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures Over 1000° C.", Journal of Solid State Chemistry, 1985, vol. 60, pp. 382-384.

Kitzerow.H et al., "Observation of Blue Phases in Chiral Networks", Liqiud Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m <4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters), 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(56) References Cited

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Taiwanese Office Action (Application No. 98137143) Dated Sep. 19, 2014.

Korean Office Action (Application No. 2009-0105988) Dated Oct. 20, 2015.

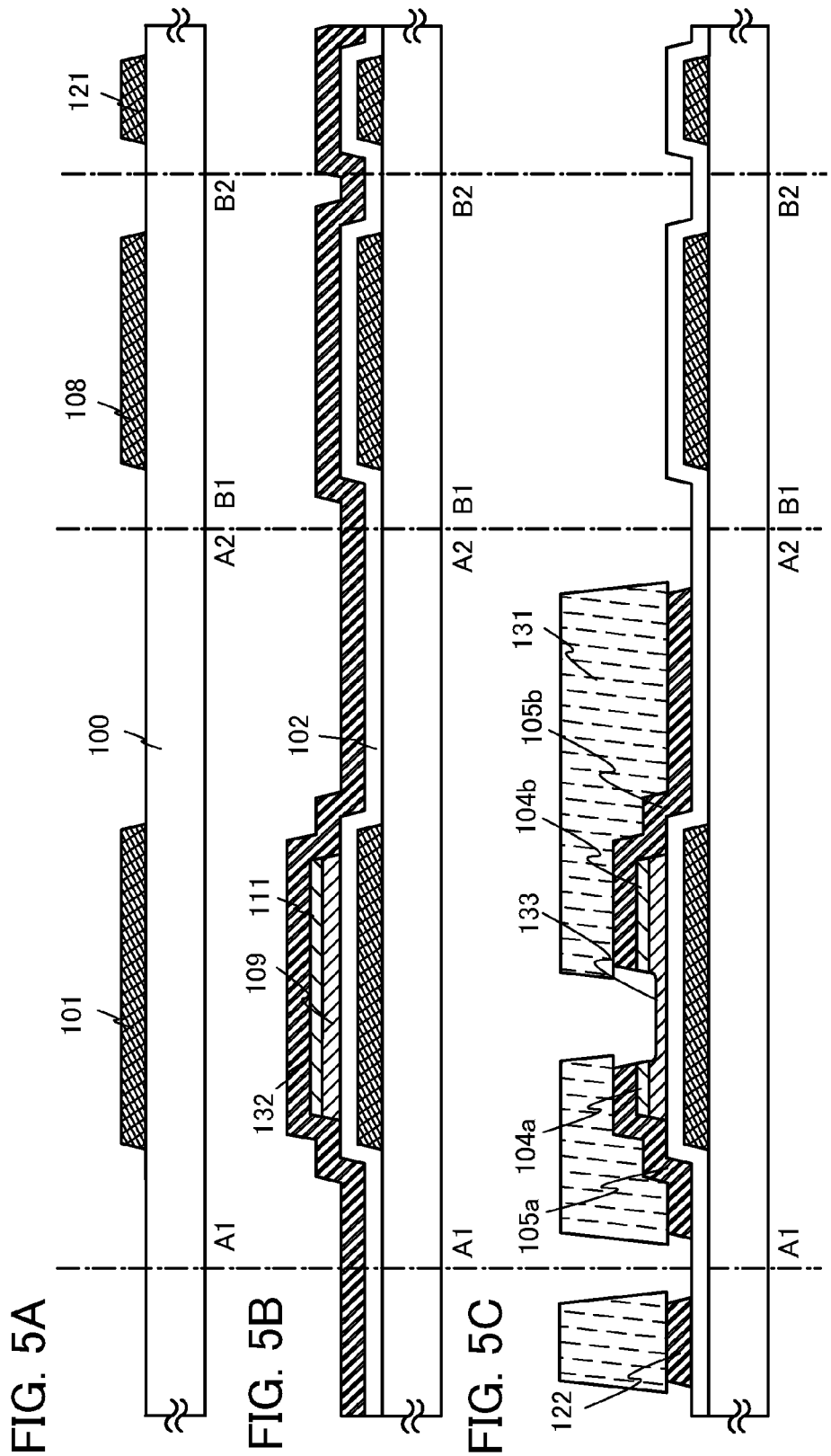

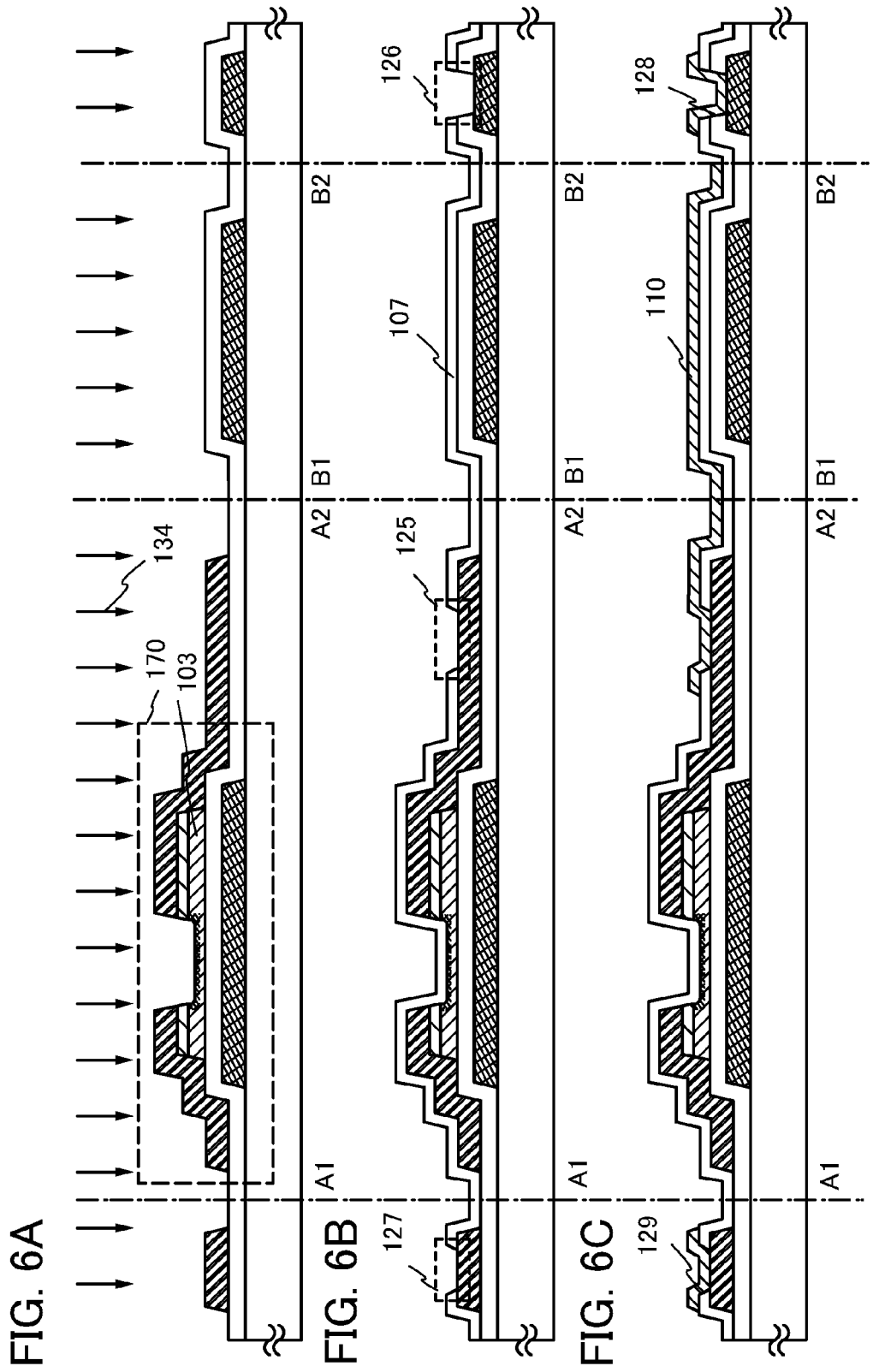

FIG. 11A1
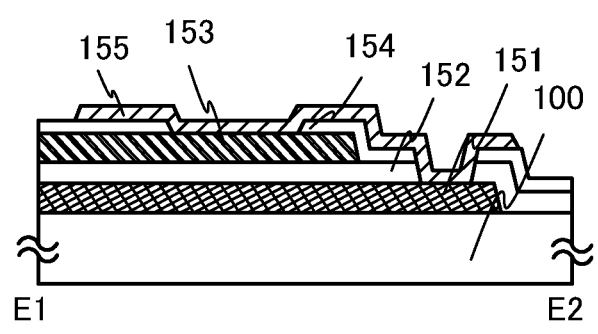
FIG. 11A2
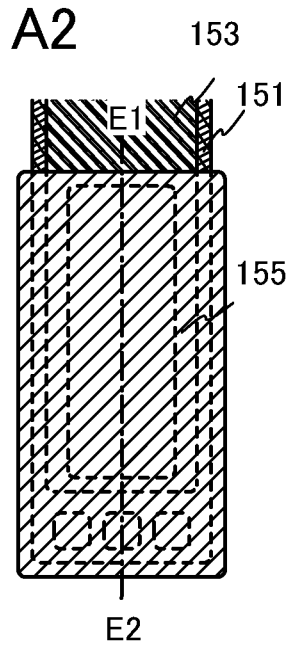
FIG. 11B1
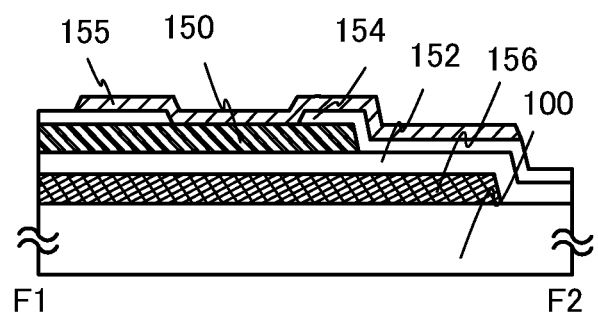
FIG. 11B2
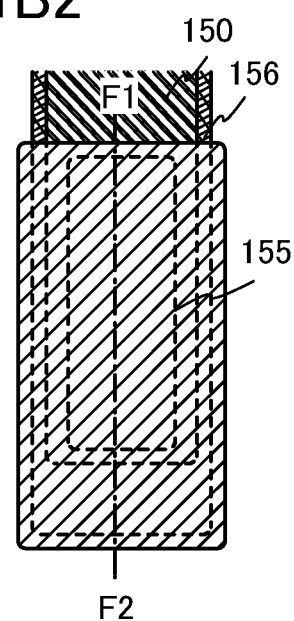

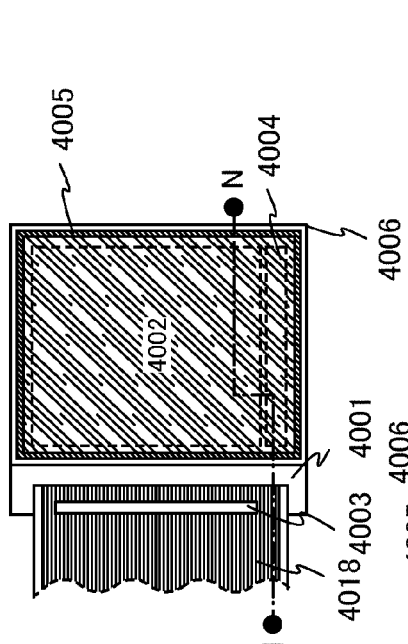
FIG. 22A1
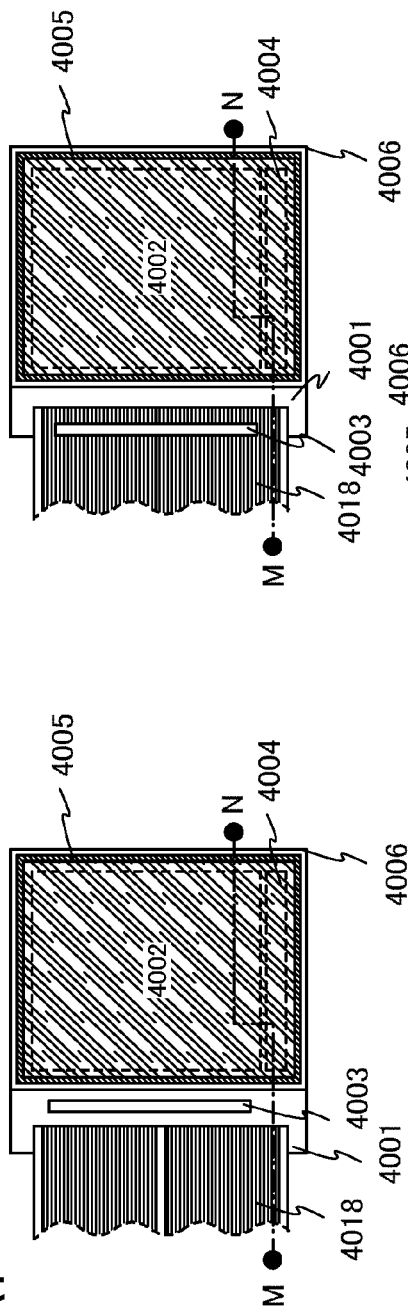
FIG. 22A2
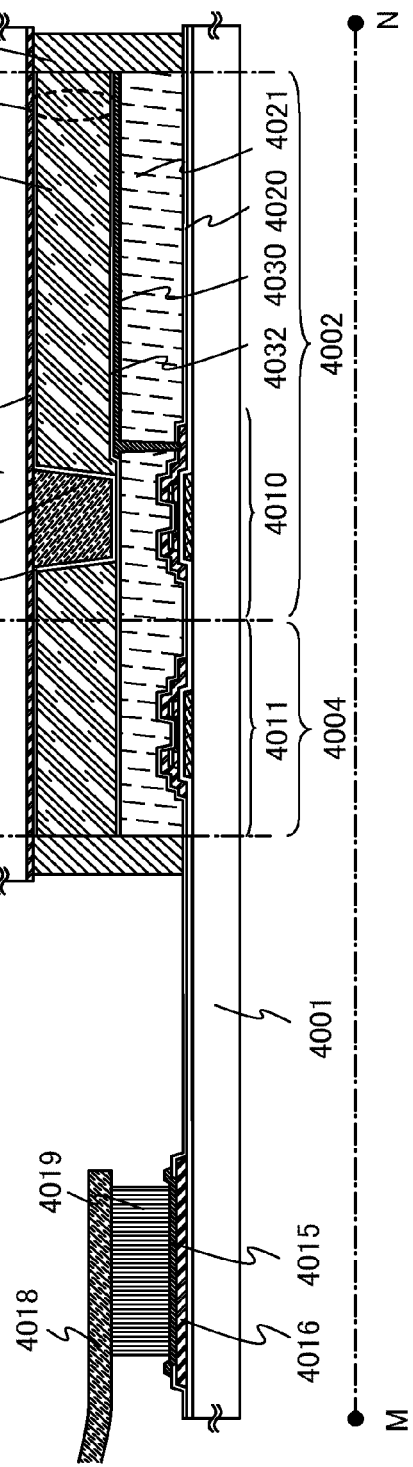
FIG. 22B

2631

2632

SEMICONDUCTOR DEVICE AND METHOD FOR MANUFACTURING THE SAME

BACKGROUND OF THE INVENTION

1. Field of the Invention

The present invention relates to a semiconductor device including an oxide semiconductor and a manufacturing method thereof.

2. Description of the Related Art

A thin film transistor formed over a flat plate such as a glass substrate is manufactured using amorphous silicon or polycrystalline silicon, as typically seen in a liquid crystal display device. A thin film transistor using amorphous silicon has low field effect mobility, but such a transistor can be formed over a glass substrate with a larger area. On the other hand, a thin film transistor using polycrystalline silicon has high field effect mobility, but a crystallization step such as laser annealing is necessary and such a transistor is not always suitable for a larger glass substrate.

In view of the foregoing, attention has been paid to a technique by which a thin film transistor is manufactured using an oxide semiconductor, and such a transistor is applied to an electronic device or an optical device. For example, Patent Document 1 and Patent Document 2 disclose a technique by which a thin film transistor is manufactured using zinc oxide or an In—Ga—Zn—O-based oxide semiconductor as an oxide semiconductor film, and such a transistor is used as a switching element or the like of an image display device.

REFERENCE

Patent Document

[Patent Document 1] Japanese Published Patent Application No. 2007-123861
[Patent Document 2] Japanese Published Patent Application No. 2007-96055

SUMMARY OF THE INVENTION

The field effect mobility of a thin film transistor using an oxide semiconductor for a channel formation region is higher than that of a thin film transistor using amorphous silicon. An oxide semiconductor film can be formed by a sputtering method or the like at a temperature of 300° C. or lower. Its manufacturing process is easier than that of a thin film transistor using polycrystalline silicon.

Such an oxide semiconductor is expected to be used for forming a thin film transistor over a glass substrate, a plastic substrate, or the like, and to be applied to a liquid crystal display, an electroluminescent display, electronic paper, or the like.

It is important that electric characteristics of a thin film transistor, such as threshold voltage, should not be varied. In particular, when the photosensitivity of a semiconductor layer is high, electric characteristics of the thin film transistor are varied, which could lower the reliability of a semiconductor device.

It is an object to provide a highly reliable semiconductor device including a thin film transistor whose electric characteristics are stable. In addition, it is another object to manufacture a highly reliable semiconductor device at low cost with high productivity.

In a semiconductor device including a thin film transistor, a semiconductor layer of the thin film transistor is formed using an oxide semiconductor layer containing at least one of metal elements of iron, nickel, cobalt, copper, gold, manganese, molybdenum, tungsten, niobium, and tantalum.

As an oxide semiconductor film used in this specification, a thin film of a material denoted by $InMO_3(ZnO)_m$ (m>0) is formed, and a thin film transistor in which the thin film is used as a semiconductor layer is manufactured. Note that M denotes one or more metal elements selected from gallium (Ga), iron (Fe), nickel (Ni), manganese (Mn), and cobalt (Co). In addition to the case where only Ga is contained as M, there is a case where Ga and any of the above metal elements other than Ga, for example, Ga and Ni or Ga and Fe are contained as M. Moreover, in the oxide semiconductor, in some cases, a transition metal element such as Fe or Ni or an oxide of the transition metal element is contained as an impurity element in addition to the metal element contained as M. In this specification, the metal element denoted by M and the above impurity element are contained during deposition of the oxide semiconductor film. For example, a target containing the metal element denoted by M and the impurity element is used, and a film of $InMO_3(ZnO)_m$ (m>0) is formed by a sputtering method.

In this specification, when M is gallium (Ga) in the thin film (layer) of $InMO_3(ZnO)_m$ (m>0), this thin film is also referred to as an In—Ga—Zn—O-based non-single-crystal film. An amorphous structure is observed as a crystal structure of the In—Ga—Zn—O-based non-single-crystal film by X-ray diffraction (XRD). Note that heat treatment is performed on the In—Ga—Zn—O-based non-single-crystal film of the examined sample at 200° C. to 500° C., typically 300° C. to 400° C., for 10 minutes to 100 minutes after the film is formed by a sputtering method. In addition, a thin film transistor having electric characteristics such as an on/off ratio of $10^9$ or more and a mobility of 10 or more at a gate voltage of ±20 V can be manufactured. An In—Ga—Zn—O-based non-single-crystal film formed by a sputtering method using a target in which $In_2O_3:Ga_2O_3:ZnO$ is 1:1:1 has a photosensitivity at a wavelength of 450 nm or lower.

At least one of metal elements of iron, nickel, cobalt, copper, gold, manganese, molybdenum, tungsten, niobium, and tantalum is added to a thin oxide semiconductor layer such as the above-described film of $InMO_3(ZnO)_m$ (m>0). By selecting a condition and a method for adding the metal element, a region where the metal element is added and a concentration distribution of the metal element in the oxide semiconductor layer can be controlled.

By addition of the metal element to the oxide semiconductor layer, the metal element serves as a recombination center in the oxide semiconductor layer; therefore, the photosensitivity of the oxide semiconductor layer can be lowered. With the low photosensitivity, electric characteristics of the thin film transistor can be stable, which prevents an increase in off current due to variation in threshold voltage or the like.

The metal element becomes a recombination center in the film of $InMO_3(ZnO)_m$ (m>0) by being added thereto, whereby the photosensitivity of the film can be lowered. As the metal element, at least one of metal elements of iron, nickel, cobalt, copper, gold, manganese, molybdenum, tungsten, niobium, and tantalum can be used. By adding these metals regardless of the kind of a metal element contained in the film of $InMO_3(ZnO)_m$ (m>0), electric characteristics of the thin film transistor can be stabilized. In addition, a region where the metal element is added or a concentration distribution of the metal element in the oxide semiconductor layer can be controlled, whereby the photosensitivity can be lowered and electric characteristics of the thin film transistor can be stabilized efficiently.

A method for adding the metal element to the oxide semiconductor layer is not limited to a particular method, and any of various methods, such as a dry method or a wet method (coating method) can be used. Preferably, an ion implantation method or an ion doping method is used.

One embodiment of the structure of the invention disclosed in this specification includes a gate electrode layer; a gate insulating layer; an oxide semiconductor layer containing indium, gallium, and zinc; a source electrode layer; and a drain electrode layer, wherein the oxide semiconductor layer containing indium, gallium, and zinc contains at least one of metal elements of iron, nickel, cobalt, copper, gold, manganese, molybdenum, tungsten, niobium, and tantalum.

Another embodiment of the structure of the invention disclosed in this specification includes a gate electrode layer over a substrate having an insulating surface; a gate insulating layer over the gate electrode layer; an oxide semiconductor layer containing indium, gallium, and zinc over the gate insulating layer; and a source electrode layer and a drain electrode layer over the oxide semiconductor layer containing indium, gallium, and zinc, wherein the oxide semiconductor layer containing indium, gallium, and zinc contains at least one of metal elements of iron, nickel, cobalt, copper, gold, manganese, molybdenum, tungsten, niobium, and tantalum.

The metal element may be added to the entire surface of the oxide semiconductor layer or may be added selectively. For example, a structure may be employed in which the oxide semiconductor layer has a region with a thin thickness, and the metal element is contained in the region with a thin thickness of the oxide semiconductor layer. The metal element is also added to a film other than the oxide semiconductor layer, depending on when the metal element is added in the process or a mask condition. For example, in an inverted staggered thin film transistor, when a metal element is added to an exposed region of an oxide semiconductor layer by using a source electrode layer and a drain electrode layer as masks, the metal element is also added to the source electrode layer and the drain electrode layer.

Another embodiment of the structure of the invention disclosed in this specification includes a gate electrode layer over a substrate having an insulating surface; a gate insulating layer over the gate electrode layer; a source electrode layer and a drain electrode layer over the gate insulating layer; and an oxide semiconductor layer containing indium, gallium, and zinc over the source electrode layer and the drain electrode layer, wherein the oxide semiconductor layer containing indium, gallium, and zinc contains at least one of metal elements of iron, nickel, cobalt, copper, gold, manganese, molybdenum, tungsten, niobium, and tantalum.

Another embodiment of the structure of the invention disclosed in this specification includes the steps of: forming a gate electrode layer over a substrate having an insulating surface; forming a gate insulating layer over the gate electrode layer; forming an oxide semiconductor layer over the gate insulating layer; forming a source electrode layer and a drain electrode layer over the oxide semiconductor layer; and adding a metal element to a region which is not covered with the source electrode layer or the drain electrode layer in the oxide semiconductor layer.

Another embodiment of the structure of the invention disclosed in this specification includes the steps of: forming a gate electrode layer over a substrate having an insulating surface; forming a gate insulating layer over the gate electrode layer; forming an oxide semiconductor layer over the gate insulating layer; adding a metal element to the oxide semiconductor layer; and forming a source electrode layer and a drain electrode layer over the oxide semiconductor layer to which the metal element is added.

Another embodiment of the structure of the invention disclosed in this specification includes the steps of: forming a gate electrode layer over a substrate having an insulating surface; forming a gate insulating layer over the gate electrode layer; forming a source electrode layer and a drain electrode layer over the gate insulating layer; forming an oxide semiconductor layer over the source electrode layer and the drain electrode layer; and adding a metal element to the oxide semiconductor layer.

A semiconductor device and a method for manufacturing a semiconductor device which are disclosed in this specification achieve at least one of the above objects.

In addition, a source region may be provided between the oxide semiconductor layer (also referred to as a first oxide semiconductor layer) and the source electrode layer, and a drain region may be provided between the oxide semiconductor layer and the drain electrode layer. As the source region and the drain region, an oxide semiconductor layer having n-type conductivity (also referred to as a second oxide semiconductor layer) can be used.

In addition, the second oxide semiconductor layer used for the source region and the drain region of the thin film transistor is preferably thinner than the first oxide semiconductor layer used for a channel formation region and preferably has higher conductivity (electrical conductivity) than the first oxide semiconductor layer.

Further, the first oxide semiconductor layer used for the channel formation region has an amorphous structure and the second oxide semiconductor layer used for the source region and the drain region includes a crystal grain (nanocrystal) in an amorphous structure in some cases. The crystal grain (nanocrystal) in the second oxide semiconductor layer used for the source region and the drain region has a diameter of 1 nm to 10 nm, typically about 2 nm to 4 nm.

As the second oxide semiconductor layer used for the source region and the drain region ($n^+$ layer), an In—Ga—Zn—O-based non-single-crystal film can be used.

An insulating film may be formed so as to cover the thin film transistor including the oxide semiconductor layer and the source and drain electrode layers and so as to be in contact with the oxide semiconductor layer including the channel formation region.

Since a thin film transistor is easily broken by static electricity and the like, a protection circuit for protecting a driver circuit is preferably provided over the same substrate as a gate line or a source line. The protection circuit is preferably formed using a nonlinear element in which an oxide semiconductor is used.

Note that ordinal numbers such as "first" and "second" are used for convenience. Therefore, they do not denote the order of steps, the stacking order of layers, and particular names which specify the invention in this specification.

Moreover, as a display device including a driver circuit, a light-emitting display device in which a light-emitting element is used and a display device in which an electrophoretic display element is used, which is also referred to as electronic paper, are given in addition to a liquid crystal display device.

In the light-emitting display device in which a light-emitting element is used, a plurality of thin film transistors are included in a pixel portion, and in the pixel portion, there is a region where a gate electrode of a thin film transistor is connected to a source wiring or a drain wiring of another thin film transistor. In addition, in a driver circuit of the light-emitting display device in which a light-emitting element is used, there is a region where a gate electrode of a thin film transistor is connected to a source wiring or a drain wiring of the thin film transistor.

Note that the semiconductor device in this specification means all the devices which can operate by using semiconductor characteristics, and an electro-optical device, a semiconductor circuit, and an electronic appliance are all included in the semiconductor devices.

A thin film transistor with stable electric characteristics can be obtained and a thin film transistor with favorable dynamic characteristics can be manufactured. Therefore, a semiconductor device including a highly reliable thin film transistor with high electric characteristics can be provided.

BRIEF DESCRIPTION OF THE DRAWINGS

FIGS. 5A to 5C illustrate a method for manufacturing a semiconductor device.
FIGS. 6A to 6C illustrate a method for manufacturing a semiconductor device.
FIGS. 11A1 to 11B2 each illustrate a semiconductor device.
FIGS. 22A1 to 22B each illustrate a semiconductor device.

DETAILED DESCRIPTION OF THE INVENTION

Figure 1A:
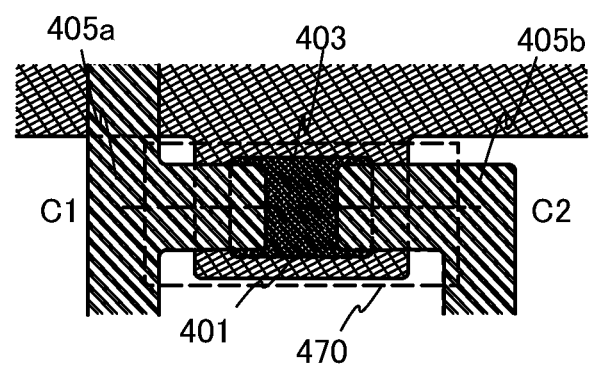
FIGS. 1A and 1B illustrate a semiconductor device.

Embodiments will be described in detail with reference to the accompanying drawings. However, the present invention is not limited to the following description, and various changes for the modes and details thereof will be apparent to those skilled in the art unless such changes depart from the spirit and the scope of the invention. Therefore, the present invention should not be interpreted as being limited to what is described in the embodiments. In the structures of the present invention to be described below, identical portions or portions having similar functions may be marked by the same reference numerals throughout the drawings so as to omit repeated explanation.

Embodiment 1

A semiconductor device and a method for manufacturing a semiconductor device will be described with reference to FIGS. 1A and 1B and FIGS. 2A to 2D.

Figure 1B:
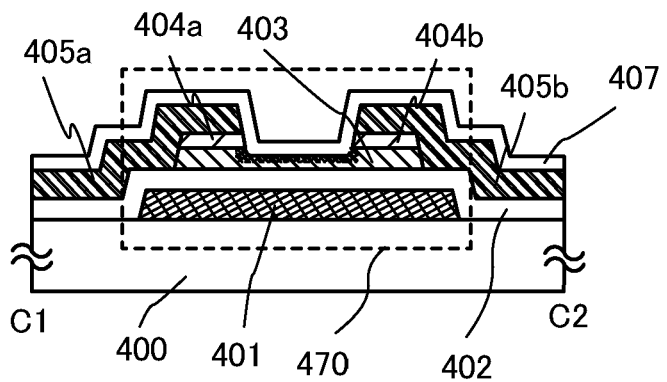

FIG. 1A is a top view of a thin film transistor 470 of a semiconductor device, and FIG. 1B is a cross-sectional view along line C1-C2 of FIG. 1A. The thin film transistor 470 is an inverted staggered thin film transistor and includes, over a substrate 400 which is a substrate having an insulating surface, a gate electrode layer 401, a gate insulating layer 402, a semiconductor layer 403, n$^+$ layers 404a and 404b each serving as a source region or a drain region, and source or drain electrode layers 405a and 405b. In addition, an insulating film 407 is provided so as to cover the thin film transistor 470 and be in contact with the semiconductor layer 403.

The semiconductor layer 403 is an oxide semiconductor layer containing a metal element, to which at least one of metal elements of iron, nickel, cobalt, copper, gold, manganese, molybdenum, tungsten, niobium, and tantalum is added. In the drawings of this specification, a shaded region of the semiconductor layer 403 is a region to which the metal element is added.

When the metal element is added to the oxide semiconductor layer, the metal element becomes a recombination center in the oxide semiconductor layer, whereby the photosensitivity of the oxide semiconductor layer can be lowered. The low photosensitivity can stabilize electric characteristics of the thin film transistor and can prevent an increase in off current due to variation in threshold voltage or the like.

FIGS. 2A to 2D are cross-sectional views illustrating steps of manufacturing the thin film transistor 470.

Figure 2A:
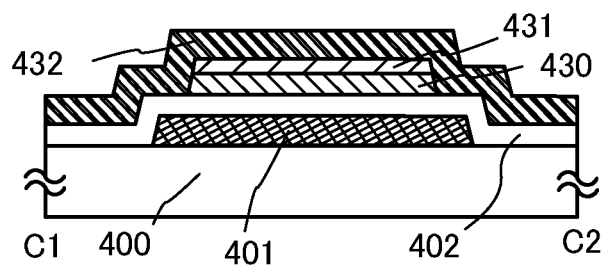
FIGS. 2A to 2D illustrate a method for manufacturing a semiconductor device.

In FIG. 2A, the gate electrode layer 401 is provided over the substrate 400 which is a substrate having an insulating surface. An insulating film serving as a base film may be provided between the substrate 400 and the gate electrode layer 401. The base film has a function of preventing diffusion of an impurity element from the substrate 400, and can be formed to have a single-layer or stacked-layer structure using one or more of a silicon nitride film, a silicon oxide film, a silicon nitride oxide film, and a silicon oxynitride film. The gate electrode layer 401 can be formed to have a single-layer or stacked-layer structure using a metal material such as molybdenum, titanium, chromium, tantalum, tungsten, aluminum, copper, neodymium, or scandium, or an alloy material which contains any of these materials as its main component.

For example, as a two-layer structure of the gate electrode layer 401, the following structures are preferable: a two-layer structure in which a molybdenum layer is stacked over an aluminum layer, a two-layer structure in which a molybdenum layer is stacked over a copper layer, a two-layer structure in which a titanium nitride layer or a tantalum nitride layer is stacked over a copper layer, and a two-layer structure in which a titanium nitride layer and a molybdenum layer are stacked. As a three-layer structure, it is preferable to stack a tungsten layer or a tungsten nitride layer, a layer of an alloy of aluminum and silicon or an alloy of aluminum and titanium, and a titanium nitride layer or a titanium layer.

The gate insulating layer 402 is formed over the gate electrode layer 401.

The gate insulating layer 402 can be formed using a silicon oxide layer, a silicon nitride layer, a silicon oxynitride layer, or a silicon nitride oxide layer to have a single-layer or stacked-layer structure by a plasma CVD method, a sputtering method, or the like. Alternatively, the gate insulating layer 402 can be formed using a silicon oxide layer by a CVD method in which an organosilane gas is used. As the organosilane gas, a silicon-containing compound such as tetraethoxysilane (TEOS: chemical formula, $Si(OC_2H_5)_4$), tetramethylsilane (TMS: chemical formula, $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), or trisdimethylaminosilane ($SiH(N(CH_3)_2)_3$) can be used.

Over the gate insulating layer 402, a first oxide semiconductor film 430 and a second oxide semiconductor film 431 are stacked in this order. The first oxide semiconductor film 430 and the second oxide semiconductor film 431 are island-shaped oxide semiconductor layers patterned by a photolithography step.

Note that before the first oxide semiconductor film 430 is formed by a sputtering method, dust attached to a surface of the gate insulating layer 402 is preferably removed by reverse sputtering in which an argon gas is introduced and plasma is generated. The reverse sputtering is a method in which voltage is applied to a substrate side using an RF power source to generate plasma on the substrate side in an argon atmosphere without applying voltage to a target side, so that a surface is modified. Nitrogen, helium, or the like may be used instead of the argon atmosphere. Alternatively, oxygen, hydrogen, $N_2O$, or the like may be added to the argon atmosphere. Further alternatively, $Cl_2$, $CF_4$, or the like may be added to the argon atmosphere.

A region where the second oxide semiconductor film 431 and a conductive film 432 are in contact with each other is preferably modified through plasma treatment.

The plasma treatment may be performed using nitrogen, helium, or the like instead of the argon atmosphere. Alternatively, oxygen, hydrogen, $N_2O$, or the like may be added to the argon atmosphere. Further alternatively, $Cl_2$, $CF_4$, or the like may be added to the argon atmosphere.

An In—Ga—Zn—O-based non-single-crystal film is used as each of the first oxide semiconductor film 430 and the second oxide semiconductor film 431. The first oxide semiconductor film 430 and the second oxide semiconductor film 431 are formed under different conditions, and the second oxide semiconductor film 431 has higher conductivity and lower resistance than the first oxide semiconductor film 430. For example, the second oxide semiconductor film 431 is formed using an oxide semiconductor film obtained by a sputtering method in which the argon gas flow rate is set to be 40 sccm. The second oxide semiconductor film 431 has n-type conductivity and has an activation energy (ΔE) of 0.01 eV to 0.1 eV inclusive. Note that the second oxide semiconductor film 431 is an In—Ga—Zn—O-based non-single-crystal film and includes at least an amorphous component. In some cases, the second oxide semiconductor film 431 has a crystal grain (nanocrystal) in an amorphous structure. The crystal grain (nanocrystal) in this second oxide semiconductor film 431 has a diameter of 1 nm to 10 nm, typically about 2 nm to 4 nm.

By providing the second oxide semiconductor film 431 serving as an $n^+$ layer, the conductive film 432 formed using a metal layer and the first oxide semiconductor film 430 serving as a channel formation region have a favorable junction, which allows more thermally-stable operation than in Schottky junction. In addition, willing provision of the $n^+$ layer is effective in supplying carriers to the channel (on the source side), stably absorbing carriers from the channel (on the drain side), or preventing a resistance component from being formed at an interface with the wiring. Further, by the decrease in resistance, high mobility can be maintained even at high drain voltage.

The conductive film 432 is formed over the gate insulating layer 402, the first oxide semiconductor film 430, and the second oxide semiconductor film 431.

As the material of the conductive film 432, there are an element selected from Al, Cr, Ta, Ti, Mo, and W, an alloy containing any of these elements as its component, an alloy containing a combination of any of these elements, and the like. If heat treatment at 200° C. to 600° C. is performed, it is preferable that the conductive film have heat resistance enough to withstand the heat treatment. Since aluminum alone has the disadvantages of low heat resistance, being easily corroded, and the like, it is used in combination with a conductive material having heat resistance. As the conductive material having heat resistance which is combined with aluminum, an element selected from titanium (Ti), tantalum (Ta), tungsten (W), molybdenum (Mo), chromium (Cr), neodymium (Nd), and scandium (Sc), an alloy containing any of these elements as its component, an alloy containing a combination of any of these elements, or a nitride containing any of these elements as its component is used.

The gate insulating layer 402, the first oxide semiconductor film 430, the second oxide semiconductor film 431, and the conductive film 432 may be formed successively without being exposed to the air. When the gate insulating layer 402, the first oxide semiconductor film 430, the second oxide semiconductor film 431, and the conductive film 432 are formed successively without being exposed to the air, an interface between the stacked films can be formed without being contaminated with atmospheric components or impurity elements contained in the air. Thus, variation in characteristics of the thin film transistor can be reduced.

Figure 2B:
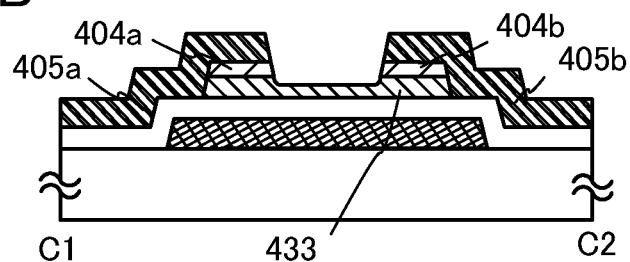

The first oxide semiconductor film 430, the second oxide semiconductor film 431, and the conductive film 432 are etched by an etching step to form a semiconductor layer 433, $n^+$ layers 404a and 404b, and source or drain electrode layers 405a and 405b (FIG. 2B). Note that the semiconductor layer 433 is a semiconductor layer obtained by being only partly etched to have a groove (depression) and an end portion which is also partly etched and exposed.

Figure 2C:
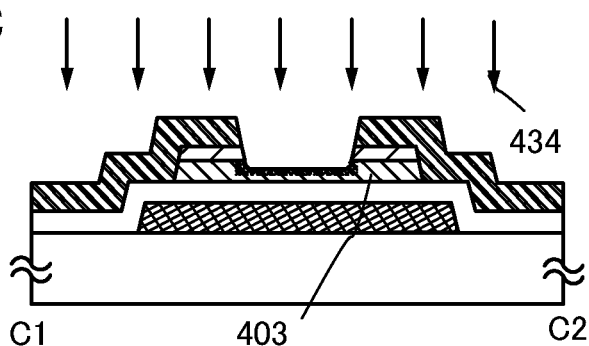

Next, a metal element 434 is added to the semiconductor layer 433 which is an oxide semiconductor layer, whereby a semiconductor layer 403 is formed (FIG. 2C).

As the metal element 434, at least one of metal elements of iron, nickel, cobalt, copper, gold, manganese, molybdenum, tungsten, niobium, and tantalum can be used. For example, iron is used as the metal element 434 and added by an ion implantation method. Iron is added with the use of an ion implantation apparatus which is provided with an ion source chamber including a heater capable of vaporizing a solid state source.

Since the source or drain electrode layers 405a and 405b are formed over the semiconductor layer 433, the source or drain electrode layers 405a and 405b serve as masks and the metal element 434 is added to an exposed region of the semiconductor layer 433. When the metal element is selectively added to the semiconductor layer 433 in this manner, the concentration of the added metal element has a distribution and a region to which the metal element is not added also exists in the semiconductor layer 403.

In addition, the metal element is also added to a film other than the oxide semiconductor layer, depending on when the metal element is added in the process or a mask condition. For example, in an inverted staggered thin film transistor, when a metal element is added to an exposed region of an oxide semiconductor layer by using a source electrode layer and a drain electrode layer as masks, the metal element is also added to the source electrode layer and the drain electrode layer. In a similar manner, since a metal element is added to an exposed region, the metal element is also added to an exposed region of a gate insulating layer. In addition, depending on the condition of adding the metal element, the metal element is also added to a base film below the gate insulating layer in some cases. Of course, when a mask is formed, a region covered with the mask can be a region to which the metal element is not added; thus, the metal element can be selectively contained only in the oxide semiconductor layer.

By addition of the metal element, the photosensitivity of the oxide semiconductor layer is lowered. Further, by addition of the metal element only in the vicinity of a surface of the oxide semiconductor layer, photosensitivity of the oxide semiconductor layer is lowered while degradation of mobility in the oxide semiconductor layer is suppressed. Therefore, variation in electric characteristics such as an increase in off current can be prevented.

After that, heat treatment is preferably performed at 200° C. to 600° C., typically 300° C. to 500° C. For example, heat treatment is performed at 350° C. for 1 hour under a nitrogen atmosphere. By this heat treatment, rearrangement at an atomic level of the In—Ga—Zn—O based oxide semiconductor included in the semiconductor layer 403 and the n$^+$ layers 404a and 404b is performed. This heat treatment (including photo annealing and the like) is important because this heat treatment enables release of distortion which interrupts transfer of carriers in the semiconductor layer 403 and the n$^+$ layers 404a and 404b. Note that there is no particular limitation on timing of the above heat treatment as long as the heat treatment is performed after formation of the first oxide semiconductor film 430 and the second oxide semiconductor film 431.

In addition, the depression of the exposed part of the semiconductor layer 403 may be subjected to oxygen radical treatment. By performing the oxygen radical treatment, the thin film transistor in which the semiconductor layer 403 is a channel formation region can be normally off. Further, by performing the radical treatment, damage to the semiconductor layer 403 due to etching can be repaired. The radical treatment is preferably performed in an atmosphere of $O_2$ or $N_2O$, or an atmosphere of $N_2$, He, Ar, or the like which contains oxygen. In addition, the radical treatment may be performed under the above atmosphere to which $Cl_2$ or $CF_4$ is added. Note that the radical treatment is preferably performed without application of a bias voltage to the substrate 400 side.

Figure 2D:
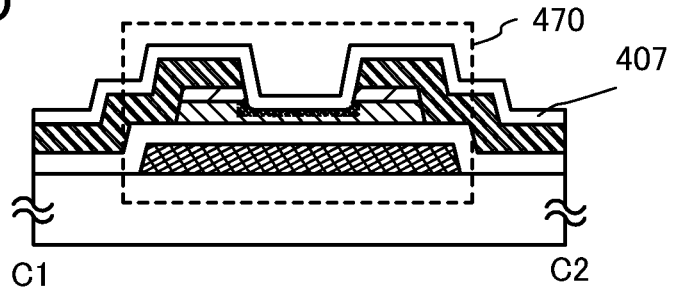

Through the above process, as illustrated in FIG. 2D, the inverted staggered thin film transistor 470 in which the semiconductor layer 403 to which the metal element is added serves as a channel formation region can be manufactured. In addition, the insulating film 407 is formed so as to cover the thin film transistor 470 and be in contact with the semiconductor layer 403.

A thin film transistor with stable electric characteristics can be obtained by adding a metal element to an oxide semiconductor layer, and a thin film transistor with favorable dynamic characteristics can be manufactured. Therefore, a semiconductor device including a highly reliable thin film transistor can be provided.

Embodiment 2

In this embodiment, FIGS. 30A to 30E illustrate an example of a semiconductor device including a thin film transistor in which a metal element is added to a semiconductor layer before formation of source and drain electrode layers, which is different from Embodiment 1.

FIGS. 30A to 30E are cross-sectional views illustrating a manufacturing process of a thin film transistor 440.

Figure 30A:
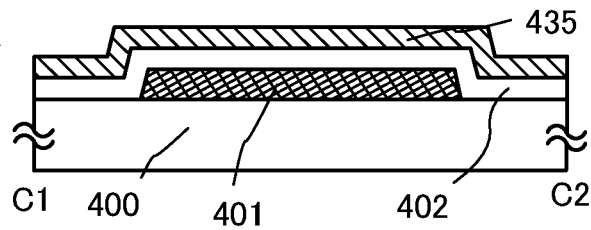
FIGS. 30A to 30E illustrate a method for manufacturing a semiconductor device.

In FIG. 30A, a gate electrode layer 401 is formed over a substrate 400, and a gate insulating layer 402 is formed over the gate electrode layer 401.

A first oxide semiconductor film 435 is formed over the gate insulating layer 402.

Figure 30B:
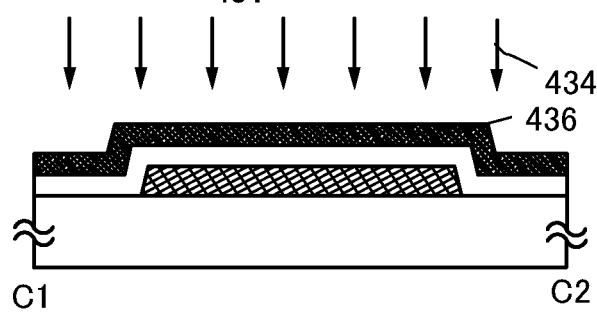

Next, a metal element 434 is added to the first oxide semiconductor film 435, whereby a first oxide semiconductor film 436 is formed (FIG. 30B).

As the metal element 434, at least one of metal elements of iron, nickel, cobalt, copper, gold, manganese, molybdenum, tungsten, niobium, and tantalum can be used. For example, iron is used as the metal element 434 and added by an ion implantation method. Iron is added with the use of an ion implantation apparatus which is provided with an ion source chamber including a heater capable of vaporizing a solid state source.

The metal element 434 is added to the entire surface of the first oxide semiconductor film 435. Although an example in which the metal element is added entirely in the thickness direction of the first oxide semiconductor film 435 is shown, the metal element may also be added only in the vicinity of the surface of the first oxide semiconductor film 435.

By addition of the metal element, the photosensitivity of the oxide semiconductor film is lowered, which can prevent variation in electric characteristics such as an increase in off current.

Over the first oxide semiconductor film 436, a second oxide semiconductor film is formed. The first oxide semiconductor film 436 and the second oxide semiconductor film are patterned by a photolithography step into island-shaped first oxide semiconductor film 437 and second oxide semiconductor film 431, respectively.

Figure 30C:
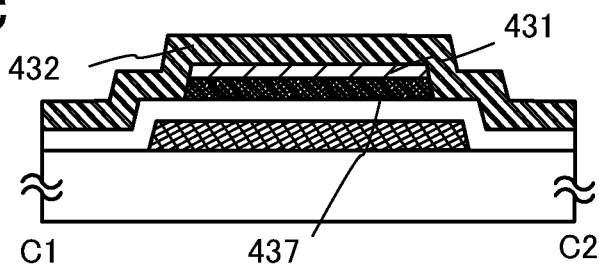

A conductive film 432 is formed over the gate insulating layer 402, the first oxide semiconductor film 437, and the second oxide semiconductor film 431 (FIG. 30C).

Figure 30D:
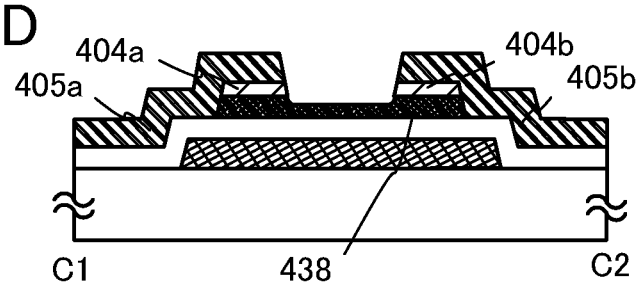

The first oxide semiconductor film 437, the second oxide semiconductor film 431, and the conductive film 432 are etched by an etching step to form a semiconductor layer 438, n$^+$ layers 404a and 404b, and source or drain electrode layers 405a and 405b (FIG. 30D). Note that the semiconductor layer 438 is a semiconductor layer obtained by being only partly etched to have a groove (depression) and an end portion which is also partly etched and exposed.

By addition of the metal element, the photosensitivity of the oxide semiconductor layer 438 is lowered, which can prevent variation in electric characteristics such as an increase in off current.

After that, heat treatment is preferably performed at 200° C. to 600° C., typically 300° C. to 500° C. For example, heat treatment is performed at 350° C. for 1 hour under a nitrogen atmosphere.

Figure 30E:
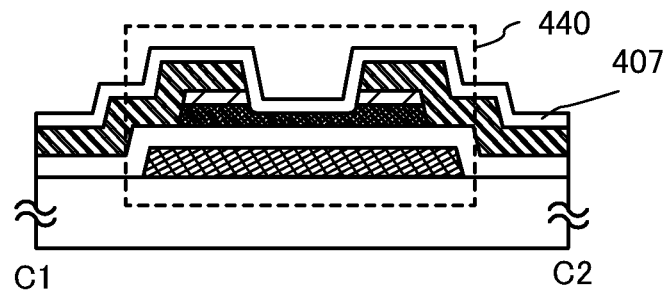

Through the above process, as illustrated in FIG. 30E, the inverted staggered thin film transistor 440 in which the semiconductor layer 483 to which the metal element is added serves as a channel formation region can be manufactured. In addition, an insulating film 407 is formed so as to cover the thin film transistor 440 and be in contact with the semiconductor layer 438.

A thin film transistor with stable electric characteristics can be obtained by adding a metal element to an oxide semiconductor layer, and a thin film transistor with favorable dynamic characteristics can be manufactured. Therefore, a semiconductor device including a highly reliable thin film transistor can be provided.

Embodiment 3

In this embodiment, FIGS. 31A to 31D illustrate an example of a semiconductor device including a thin film transistor in which source and drain electrode layers are in contact with a semiconductor layer without $n^+$ layers interposed therebetween, which is different from Embodiment 1.

FIGS. 31A to 31D are cross-sectional views illustrating a manufacturing process of a thin film transistor 471.

Figure 31A:
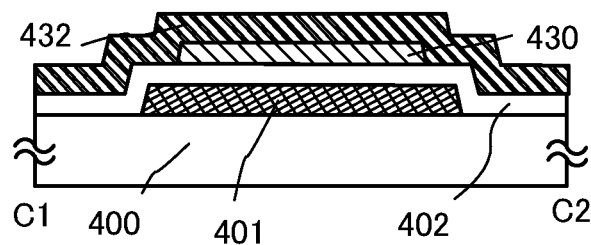
FIGS. 31A to 31D illustrate a method for manufacturing a semiconductor device.

In FIG. 31A, a gate electrode layer 401 is formed over a substrate 400, and a gate insulating layer 402 is formed over the gate electrode layer 401.

Over the gate insulating layer 402, a first oxide semiconductor film 430 is formed. The first oxide semiconductor film 430 is an island-shaped oxide semiconductor layer patterned by a photolithography step.

A conductive film 432 is formed over the gate insulating layer 402 and the first oxide semiconductor film 430.

Figure 31B:
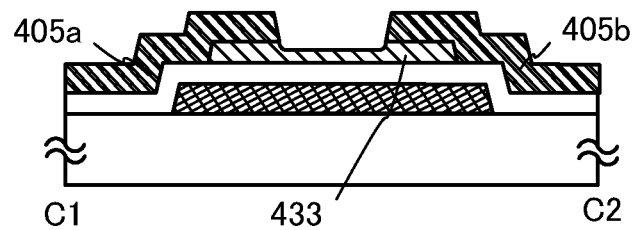

The first oxide semiconductor film 430 and the conductive film 432 are etched by an etching step to form a semiconductor layer 433 and source or drain electrode layers 405a and 405b (FIG. 31B). Note that the semiconductor layer 433 is a semiconductor layer obtained by being only partly etched to have a groove (depression) and an end portion which is also partly etched and exposed.

Figure 31C:
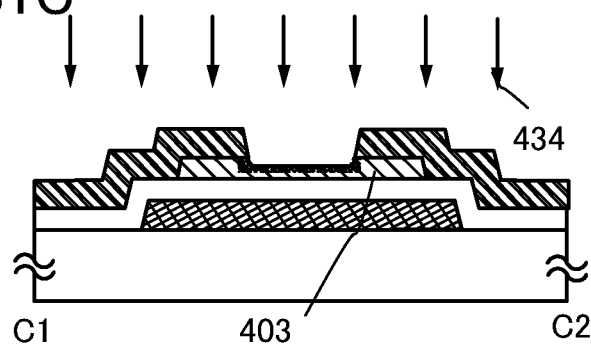

Next, a metal element 434 is added to the semiconductor layer 433 which is an oxide semiconductor layer, whereby a semiconductor layer 403 is formed (FIG. 31C).

As the metal element 434, at least one of metal elements of iron, nickel, cobalt, copper, gold, manganese, molybdenum, tungsten, niobium, and tantalum can be used. For example, iron is used as the metal element 434 and added by an ion implantation method. Iron can be added with the use of an in implantation apparatus which is provided with an ion source chamber including a heater capable of vaporizing a solid state source.

Since the source or drain electrode layers 405a and 405b are formed over the semiconductor layer 433, the source or drain electrode layers 405a and 405b serve as masks and the metal element 434 is added to an exposed region of the semiconductor layer 433. When the metal element is selectively added to the semiconductor layer 433 in this manner, the concentration of the added metal element has a distribution and a region to which the metal element is not added also exists in the semiconductor layer 403. Although an example in which the metal element is added only in the vicinity of the surface of the semiconductor layer 433 is shown, the metal element may also be added entirely in the thickness direction of the semiconductor layer 433.

By addition of the metal element, the photosensitivity of the oxide semiconductor layer is lowered, which can prevent variation in electric characteristics such as an increase in off current.

After that, heat treatment is preferably performed at 200° C. to 600° C., typically 300° C. to 500° C. For example, heat treatment is performed at 350° C. for 1 hour under a nitrogen atmosphere.

Figure 31D:
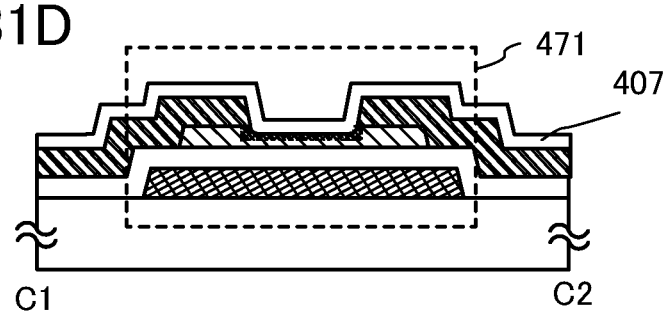

Through the above process, as illustrated in FIG. 31D, the inverted staggered thin film transistor 471 in which the semiconductor layer 403 to which the metal element is added serves as a channel formation region can be manufactured. In addition, an insulating film 407 is formed so as to cover the thin film transistor 471 and be in contact with the semiconductor layer 403.

A thin film transistor with stable electric characteristics can be obtained by adding a metal element to an oxide semiconductor layer, and a thin film transistor with favorable dynamic characteristics can be manufactured. Therefore, a semiconductor device including a highly reliable thin film transistor can be provided.

Embodiment 4

A semiconductor device and a method for manufacturing a semiconductor device will be described with reference to FIGS. 3A and 3B and FIGS. 4A to 4D.

Figure 3A:
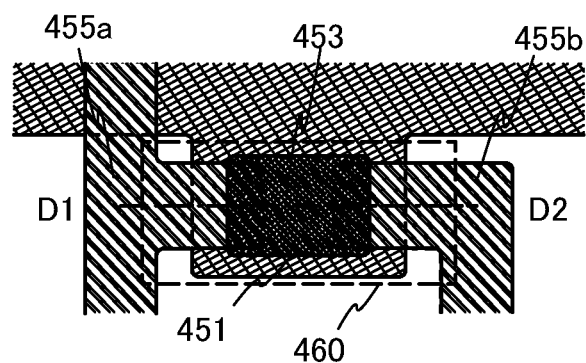
FIGS. 3A and 3B illustrate a semiconductor device.
Figure 3B:
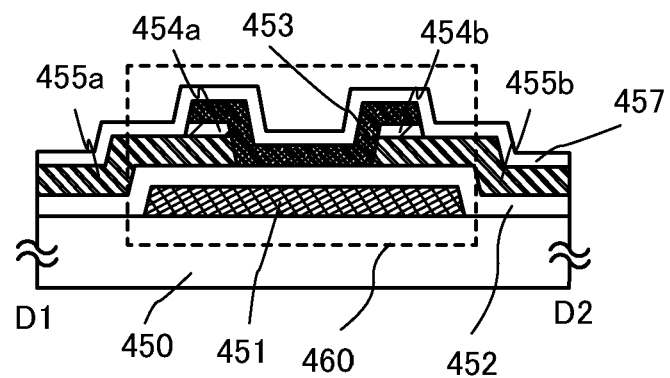

FIG. 3A is a top view of a thin film transistor 460 included in a semiconductor device, and FIG. 3B is a cross-sectional view along line D1-D2 of FIG. 3A. The thin film transistor 460 is a bottom gate thin film transistor and includes, over a substrate 450 which is a substrate having an insulating surface, a gate electrode layer 451, a gate insulating layer 452, source or drain electrode layers 455a and 455b, $n^+$ layers 454a and 454b each serving as a source region or a drain region, and a semiconductor layer 453. In addition, an insulating film 457 is provided so as to cover the thin film transistor 460 and be in contact with the semiconductor layer 453. For the semiconductor layer 453 and the $n^+$ layers 454a and 454b, an In—Ga—Zn—O-based non-single-crystal film is used.

In the thin film transistor 460, the gate insulating layer 452 exists throughout the region including the thin film transistor 460, and the gate electrode layer 451 is provided between the gate insulating layer 452 and the substrate 450 which is a substrate having an insulating surface. Over the gate insulating layer 452, the source or drain electrode layers 455a and 455b and the $n^+$ layers 454a and 454b are provided. Further, over the gate insulating layer 452, the source or drain electrode layers 455a and 455b, and the $n^+$ layers 454a and 454b, the semiconductor layer 453 is provided. Although not illustrated, in addition to the source or drain electrode layers 455a and 455b, a wiring layer is provided over the gate insulating layer 452, and the wiring layer extends beyond the peripheral portion of a semiconductor layer in the semiconductor device.

The semiconductor layer 453 is an oxide semiconductor layer containing a metal element, to which at least one of metal elements of iron, nickel, cobalt, copper, gold, manganese, molybdenum, tungsten, niobium, and tantalum is added. In the drawings of this specification, a shaded region of the semiconductor layer 453 is a region to which the metal element is added.

When the metal element is added to the oxide semiconductor layer, the metal element becomes a recombination center in the oxide semiconductor layer, whereby the photosensitivity of the oxide semiconductor layer can be lowered. The low photosensitivity can stabilize electric characteristics of the thin film transistor and can prevent an increase in off current due to variation in threshold voltage or the like.

FIGS. 4A to 4D are cross-sectional views illustrating steps of manufacturing the thin film transistor 460.

The gate electrode layer 451 is provided over the substrate 450 which is a substrate having an insulating surface. An insulating film serving as a base film may be provided between the substrate 450 and the gate electrode layer 451. The base film has a function of preventing diffusion of an impurity element from the substrate 450, and can be formed to have a single-layer or stacked-layer structure using one or more of a silicon nitride film, a silicon oxide film, a silicon nitride oxide film, and a silicon oxynitride film. The gate electrode layer 451 can be formed to have a single-layer or stacked-layer structure using a metal material such as molybdenum, titanium, chromium, tantalum, tungsten, aluminum, copper, neodymium, or scandium, or an alloy material which contains any of these materials as its main component.

The gate insulating layer 452 is formed over the gate electrode layer 451.

The gate insulating layer 452 can be formed using a silicon oxide layer, a silicon nitride layer, a silicon oxynitride layer, or a silicon nitride oxide layer to have a single-layer or stacked-layer structure by a plasma CVD method, a sputtering method, or the like. Alternatively, the gate insulating layer 452 can be formed using a silicon oxide layer by a CVD method in which an organosilane gas is used.

Figure 4A:
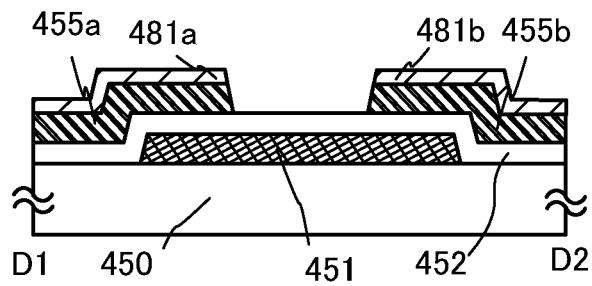
FIGS. 4A to 4D illustrate a method for manufacturing a semiconductor device.

Over the gate insulating layer 452, a conductive film and a first oxide semiconductor film are stacked in this order. The conductive film and the first oxide semiconductor film are patterned into island-shaped source or drain electrode layers 455a and 455b and oxide semiconductor films 481a and 481b, respectively, by a photolithography step (FIG. 4A). The oxide semiconductor films 481a and 481b serve as n$^+$ layers and are thus formed in a manner similar to the second oxide semiconductor film 431 in Embodiment 1.

As the material of the source or drain electrode layers 455a and 455b, there are an element selected from Al, Cr, Ta, Ti, Mo, and W, an alloy containing any of these elements as its component, an alloy containing a combination of any of these elements, and the like. If heat treatment at 200° C. to 600° C. is performed, it is preferable that the conductive film have heat resistance enough to withstand the heat treatment. Since aluminum alone has the disadvantages of low heat resistance, being easily corroded, and the like, it is used in combination with a conductive material having heat resistance. As the conductive material having heat resistance which is combined with aluminum, an element selected from titanium (Ti), tantalum (Ta), tungsten (W), molybdenum (Mo), chromium (Cr), neodymium (Nd), and scandium (Sc), an alloy containing any of these elements as its component, an alloy containing a combination of any of these elements, or a nitride containing any of these elements as its component is used.

Figure 4B:
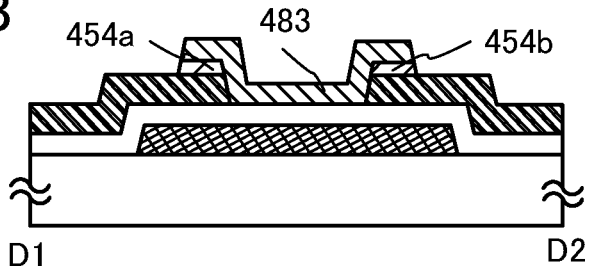

Then, a second oxide semiconductor film is formed over the gate insulating layer 452, the source or drain electrode layers 455a and 455b, and the oxide semiconductor films 481a and 481b, and an island-shaped semiconductor layer 483 and n$^+$ layers 454a and 454b are formed by a photolithography step (FIG. 4B).

The semiconductor layer 483 serves as a channel formation region and is thus formed in a manner similar to the first oxide semiconductor film 430 in Embodiment 1.

Note that before the semiconductor layer 483 is formed by a sputtering method, dust attached to a surface of the gate insulating layer 452 is preferably removed by reverse sputtering in which an argon gas is introduced and plasma is generated.

Figure 4C:
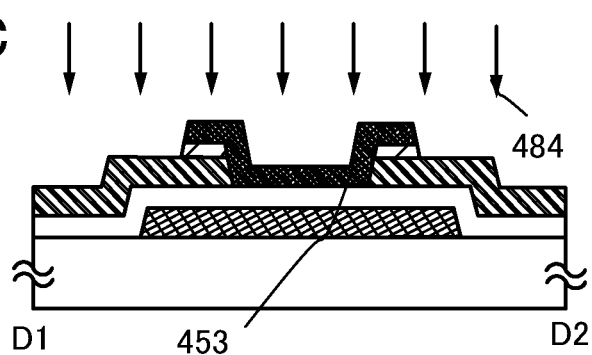

Next, a metal element 484 is added to the semiconductor layer 483 which is an oxide semiconductor layer, whereby a semiconductor layer 453 is formed (FIG. 4C).

As the metal element 484, at least one of metal elements of iron, nickel, cobalt, copper, gold, manganese, molybdenum, tungsten, niobium, and tantalum can be used. For example, iron is used as the metal element 484 and added by an ion implantation method. Iron is added with the use of an ion implantation apparatus which is provided with an ion source chamber including a heater capable of vaporizing a solid state source.

The metal element 484 is added to the entire surface of the semiconductor layer 483 which is exposed. Although an example in which the metal element is added entirely in the thickness direction of the semiconductor layer 483 is shown, the metal element may also be added only in the vicinity of the surface of the semiconductor layer 483.

By addition of the metal element, the photosensitivity of the oxide semiconductor layer is lowered, which can prevent variation in electric characteristics such as an increase in off current.

After that, heat treatment is preferably performed at 200° C. to 600° C., typically 300° C. to 500° C. For example, heat treatment is performed at 350° C. for 1 hour under a nitrogen atmosphere. There is no particular limitation on timing for this heat treatment as long as it is performed after formation of the oxide semiconductor film.

Further, the semiconductor layer 453 may be subjected to oxygen radical treatment.

Figure 4D:
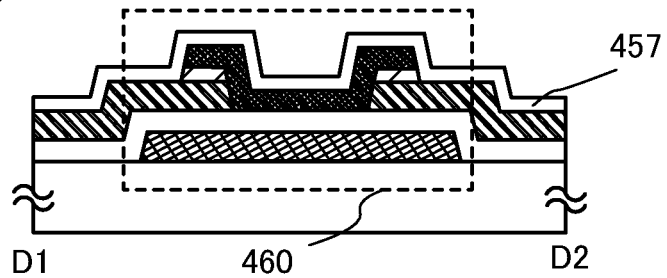

Through the above process, as illustrated in FIG. 4D, the bottom gate thin film transistor 460 in which the semiconductor layer 453 to which the metal element is added serves as a channel formation region can be manufactured. In addition, an insulating film 457 is formed so as to cover the thin film transistor 460 and be in contact with the semiconductor layer 453.

A thin film transistor with stable electric characteristics can be obtained by adding a metal element to an oxide semiconductor layer, and a thin film transistor with favorable dynamic characteristics can be manufactured. Therefore, a semiconductor device including a highly reliable thin film transistor can be provided.

Embodiment 5

FIGS. 32A to 32D illustrate an example of a semiconductor device including a thin film transistor in which source and drain electrode layers are in contact with a semiconductor layer without n$^+$ layers interposed therebetween, which is different from Embodiment 4.

FIGS. 32A to 32D are cross-sectional views illustrating a manufacturing process of a thin film transistor 461.

A gate electrode layer 451 is formed over a substrate 450 which is a substrate having an insulating surface. An insulating film serving as a base film may be provided between the substrate 450 and the gate electrode layer 451.

A gate insulating layer 452 is formed over the gate electrode layer 451.

Figure 32A:
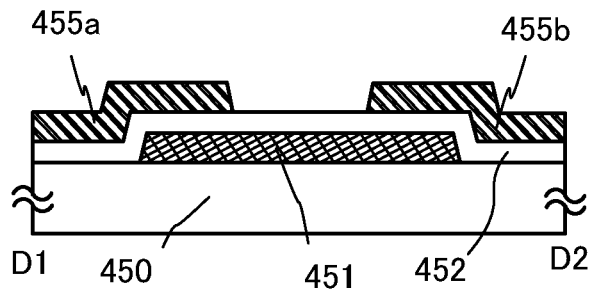
FIGS. 32A to 32D illustrate a method for manufacturing a semiconductor device.

Over the gate insulating layer 452, a conductive film is stacked and patterned into island-shaped source or drain electrode layers 455a and 455b by a photolithography step (FIG. 32A).

Figure 32B:
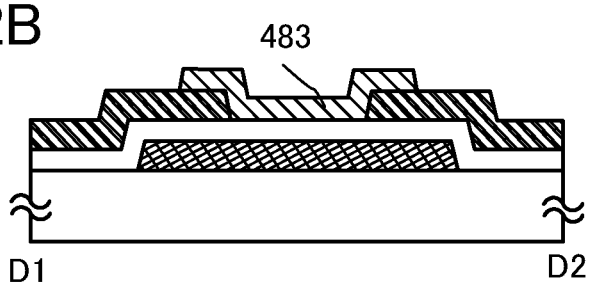

Then, an oxide semiconductor film is formed over the gate insulating layer 452 and the source or drain electrode layers 455a and 455b, and patterned into an island-shaped semiconductor layer 483 by a photolithography step (FIG. 32B).

The semiconductor layer 483 serves as a channel formation region and is thus formed in a manner similar to the first oxide semiconductor film 430 in Embodiment 1.

Note that before the semiconductor layer 483 is formed by a sputtering method, dust attached to a surface of the gate insulating layer 452 is preferably removed by reverse sputtering in which an argon gas is introduced and plasma is generated.

Figure 32C:
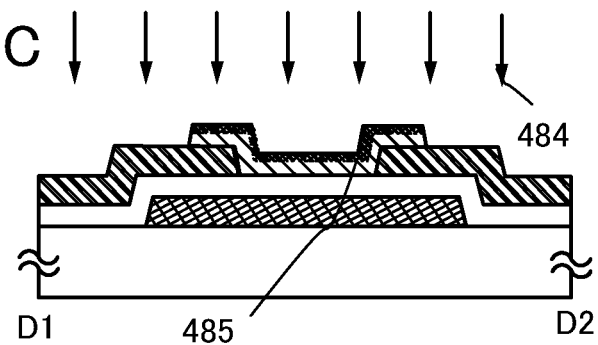

Next, a metal element 484 is added to the semiconductor layer 483 which is an oxide semiconductor layer, whereby a semiconductor layer 485 is formed (FIG. 32C).

As the metal element 484, at least one of metal elements of iron, nickel, cobalt, copper, gold, manganese, molybdenum, tungsten, niobium, and tantalum can be used. For example, iron is used as the metal element 484 and added by an ion implantation method. Iron is added with the use of an ion implantation apparatus which is provided with an ion source chamber including a heater capable of vaporizing a solid state source.

The metal element 484 is added to the entire surface of the semiconductor layer 483 which is exposed. Although an example in which the metal element is added only in the vicinity of the surface of the semiconductor layer 483 is shown, the metal element may also be added entirely in the thickness direction of the semiconductor layer 483.

By addition of the metal element, the photosensitivity of the oxide semiconductor layer is lowered, which can prevent variation in electric characteristics such as an increase in off current.

After that, heat treatment is preferably performed at 200° C. to 600° C., typically 300° C. to 500° C. For example, heat treatment is performed at 350° C. for 1 hour under a nitrogen atmosphere. There is no particular limitation on timing for this heat treatment as long as it is performed after formation of the oxide semiconductor film.

Further, the semiconductor layer 485 may be subjected to oxygen radical treatment.

Figure 32D:
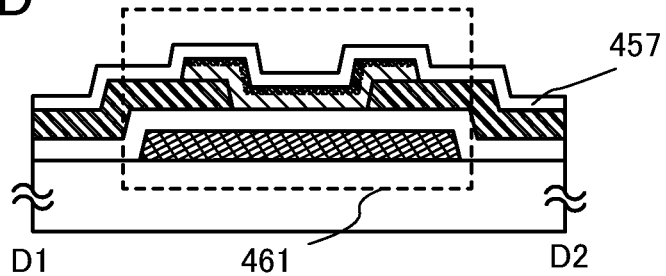

Through the above process, as illustrated in FIG. 32D, the bottom gate thin film transistor 461 in which the semiconductor layer 485 to which the metal element is added serves as a channel formation region can be manufactured. In addition, an insulating film 457 is formed so as to cover the thin film transistor 461 and be in contact with the semiconductor layer 485.

In the thin film transistor 461, the gate insulating layer 452 exists throughout the region including the thin film transistor 461, and the gate electrode layer 451 is provided between the gate insulating layer 452 and the substrate 450 which is a substrate having an insulating surface. Over the gate insulating layer 452, the source or drain electrode layers 455a and 455b are provided. Further, over the gate insulating layer 452 and the source or drain electrode layers 455a and 455b, the semiconductor layer 485 is provided. Although not illustrated, in addition to the source or drain electrode layers 455a and 455b, a wiring layer is provided over the gate insulating layer 452, and the wiring layer extends beyond the peripheral portion of a semiconductor layer in the semiconductor device.

A thin film transistor with stable electric characteristics can be obtained by adding a metal element to an oxide semiconductor layer, and a thin film transistor with favorable dynamic characteristics can be manufactured. Therefore, a semiconductor device including a highly reliable thin film transistor can be provided.

Embodiment 6

A manufacturing process of a semiconductor device including a thin film transistor will be described with reference to FIGS. 5A to 5C, FIGS. 6A to 6C, FIG. 7, FIG. 8, FIG. 9, FIG. 10, FIGS. 11A1 to 11B2, and FIG. 12.

In FIG. 5A, for a substrate 100 having a light-transmitting property, a glass substrate formed of barium borosilicate glass, alumino-borosilicate glass, or the like can be used.

Figure 7:
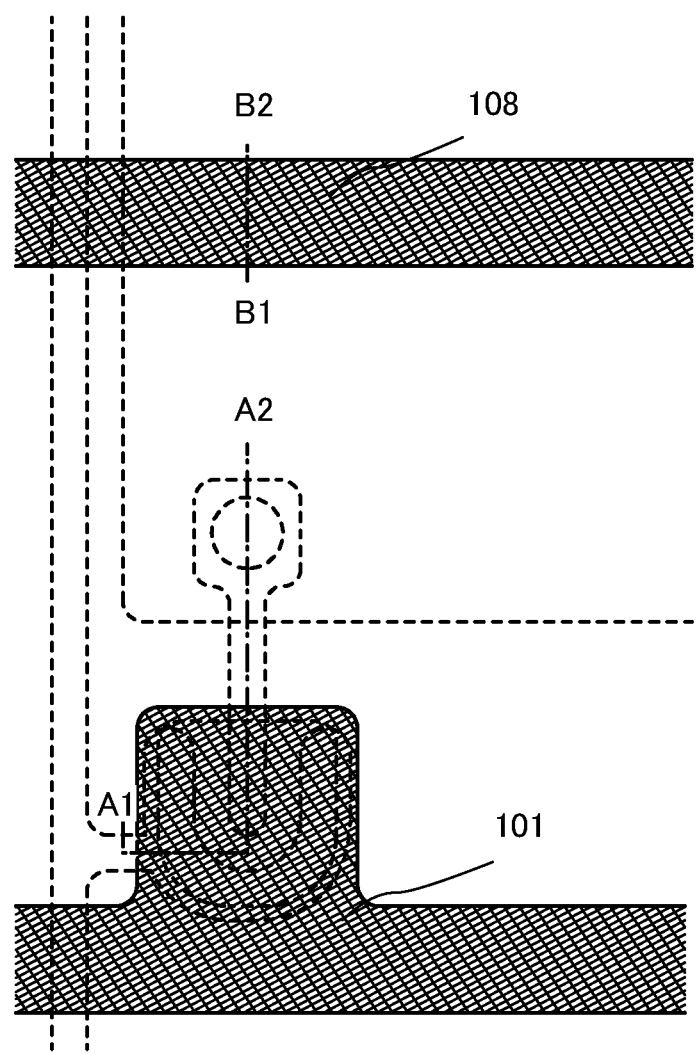
FIG. 7 illustrates a method for manufacturing a semiconductor device.
Figure 8:
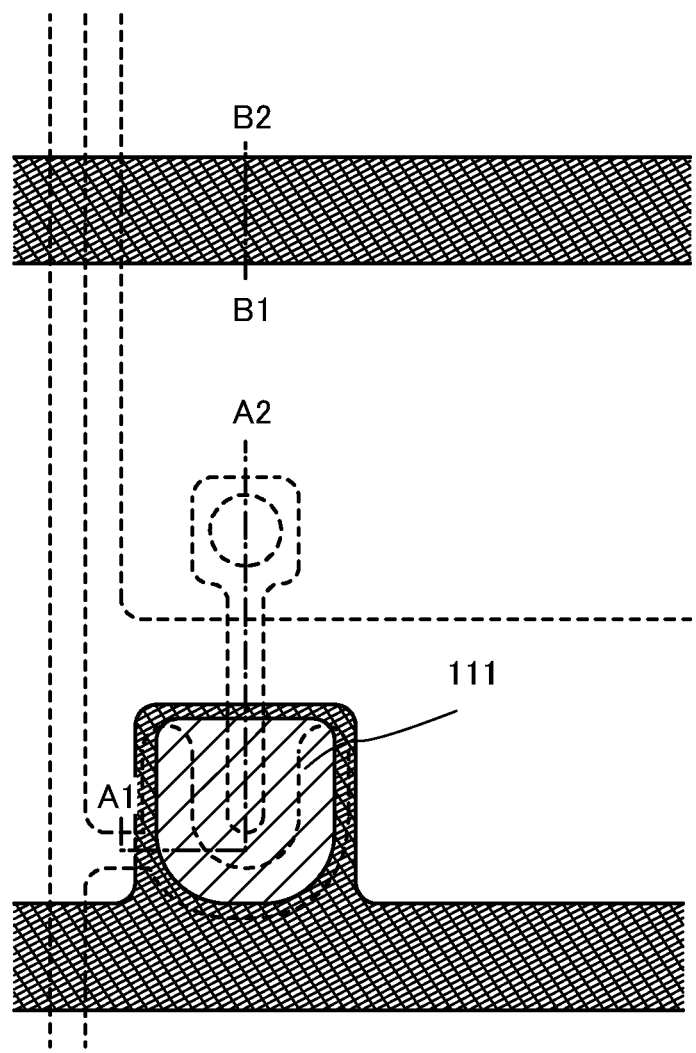
FIG. 8 illustrates a method for manufacturing a semiconductor device.

After a conductive layer is formed over the entire surface of the substrate 100, a resist mask is formed by a first photolithography step. Then, unnecessary portions are removed by etching, thereby forming wirings and electrodes (a gate wiring including a gate electrode layer 101, a capacitor wiring 108, and a first terminal 121). At that time, etching is performed so that at least the edge of the gate electrode layer 101 is tapered. A cross-sectional view at this stage is illustrated in FIG. 5A. Note that FIG. 7 is a top view at this stage.

Each of the gate wiring including the gate electrode layer 101, the capacitor wiring 108, and the first terminal 121 at a terminal portion is preferably formed using a heat-resistant conductive material such as an element selected from titanium (Ti), tantalum (Ta), tungsten (W), molybdenum (Mo), chromium (Cr), neodymium (Nd), and scandium (Sc); an alloy containing any of these elements as its component; an alloy film containing a combination of any of these elements; or a nitride containing any of these elements as its component. In the case of using a low-resistant conductive material such as aluminum (Al) or copper (Cu), the low-resistant conductive material is used in combination with the above heat-resistant conductive material because Al alone has problems of low heat resistance, being easily corroded, and the like.

Then, a gate insulating layer 102 is formed throughout the surface over the gate electrode layer 101. The gate insulating layer 102 is formed to a thickness of 50 nm to 250 nm by a sputtering method or the like.

For example, as the gate insulating layer 102, a silicon oxide film is formed to a thickness of 100 nm by a sputtering method. It is needless to say that the gate insulating layer 102 is not limited to such a silicon oxide film, and other insulating films such as a silicon oxynitride film, a silicon nitride film, an aluminum oxide film, and a tantalum oxide film may be used to form a single-layer structure or a stacked-layer structure.

Note that reverse sputtering in which an argon gas is introduced and plasma is generated is preferably performed before the formation of an oxide semiconductor film, in order to remove dust attached to the surface of the gate insulating layer. Nitrogen, helium, or the like may be used instead of the argon atmosphere. Alternatively, oxygen, hydrogen, $N_2O$, or the like may be added to the argon atmosphere. Further alternatively, $Cl_2$, $CF_4$, or the like may be added to the argon atmosphere.

Next, a first oxide semiconductor film (a first In—Ga—Zn—O-based non-single-crystal film) is formed over the gate insulating layer 102. It is effective to deposit the first In—Ga—Zn—O-based non-single-crystal film without exposure to the air after the plasma treatment because dust and moisture are not attached to the interface between the gate insulating layer and the semiconductor film. Here, the first In—Ga—Zn—O-based non-single-crystal film is formed under the following condition: the target is an oxide semiconductor target including In, Ga, and Zn ($In_2O_3$:$Ga_2O_3$:ZnO=1:1:1) with a diameter of 8 inches, the distance between the substrate and the target is 170 mm, the pressure is 0.4 Pa, the direct current (DC) power is 0.5 kW, and the atmosphere is argon or oxygen. A pulsed direct current (DC) power source is preferable because dust can be reduced and film thickness becomes uniform. The thickness of the first In—Ga—Zn—O-based non-single-crystal film is set in the range of 5 nm to 200 nm. Here, the thickness of the first In—Ga—Zn—O-based non-single-crystal film is 100 nm.

Next, a second oxide semiconductor film (a second In—Ga—Zn—O-based non-single-crystal film) is formed without exposure to the air by a sputtering method. Here, sputtering deposition is performed under the following condition: the target is an oxide semiconductor target including In, Ga, and Zn ($In_2O_3:Ga_2O_3:ZnO=1:1:1$), the pressure is 0.4 Pa, the amount of electric power is 500 W, the deposition temperature is room temperature, and the argon gas flow rate is 40 sccm. Although the target in which $In_2O_3:Ga_2O_3:ZnO$ is 1:1:1 is used intentionally, an In—Ga—Zn—O-based non-single-crystal film including a crystal grain which has a size of 1 nm to 10 nm just after the deposition is obtained in some cases. By adjusting the target composition ratio, the deposition pressure (0.1 Pa to 2.0 Pa), the amount of electric power (250 W to 3000 W: 8 inches $\phi$), the temperature (room temperature to 100° C.), the deposition condition of reactive sputtering, and the like as appropriate, the presence or absence of the crystal grains and the density of the crystal grains can be controlled and the diameter of the crystal grain can be adjusted within the range of 1 nm to 10 nm. The thickness of the second In—Ga—Zn—O-based non-single-crystal film is 5 nm to 20 nm. Needless to say, in the case where the film includes the crystal grain, the size of the crystal grain does not exceed the film thickness. Here, the thickness of the second In—Ga—Zn—O-based non-single-crystal film is 5 nm.

The first In—Ga—Zn—O-based non-single-crystal film and the second In—Ga—Zn—O-based non-single-crystal film are formed under different conditions from each other. For example, the flow ratio of an oxygen gas to an argon gas under the deposition condition of the first In—Ga—Zn—O-based non-single-crystal film is higher than that under the deposition condition of the second In—Ga—Zn—O-based non-single-crystal film. Specifically, the second In—Ga—Zn—O-based non-single-crystal film is formed in a rare gas (such as argon or helium) atmosphere (or an atmosphere including an oxygen gas at 10% or less and an argon gas at 90% or more), and the first In—Ga—Zn—O-based non-single-crystal film is formed in an oxygen atmosphere (or an atmosphere where an argon gas-to-oxygen gas flow ratio is 1 to 1 or more).

The second In—Ga—Zn—O-based non-single-crystal film may be formed in the chamber where reverse sputtering has been performed previously, or in a different chamber from the chamber where reverse sputtering has been performed previously.

Examples of a sputtering method include an RF sputtering method in which a high-frequency power source is used for a sputtering power source, a DC sputtering method, and a pulsed DC sputtering method in which a bias is applied in a pulsed manner. The RF sputtering method is mainly used in the case of forming an insulating film, and the DC sputtering method is mainly used in the case of forming a metal film.

In addition, there is also a multi-source sputtering apparatus in which a plurality of targets of different materials can be set. With the multi-source sputtering apparatus, films of different materials can be deposited to be stacked in the same chamber, or a plurality of kinds of materials can be deposited by electric discharge at the same time in the same chamber.

In addition, there are a sputtering apparatus provided with a magnet system inside the chamber and used for a magnetron sputtering method, and a sputtering apparatus used for an ECR sputtering method in which plasma generated with the use of microwaves is used without using glow discharge.

Furthermore, as a deposition method by a sputtering method, there are also a reactive sputtering method in which a target substance and a sputtering gas component are chemically reacted with each other during deposition to form a thin compound film thereof, and a bias sputtering method in which voltage is also applied to a substrate during deposition.

Next, a second photolithography step is performed to form a resist mask, and the first In—Ga—Zn—O-based non-single-crystal film and the second In—Ga—Zn—O-based non-single-crystal film are etched. For example, by wet etching using a solution in which phosphoric acid, acetic acid, and nitric acid are mixed, unnecessary portions are removed, thereby forming an oxide semiconductor film 109 which is the first In—Ga—Zn—O-based non-single-crystal film and an oxide semiconductor film 111 which is the second In—Ga—Zn—O-based non-single-crystal film. Note that etching here is not limited to wet etching and may be dry etching. Note that a top view at this stage corresponds to FIG. 8.

As the etching gas for dry etching, a gas containing chlorine (chlorine-based gas such as chlorine ($Cl_2$), boron chloride ($BCl_3$), silicon chloride ($SiCl_4$), or carbon tetrachloride ($CCl_4$)) is preferably used.

Alternatively, a gas containing fluorine (fluorine-based gas such as carbon tetrafluoride ($CF_4$), sulfur fluoride ($SF_6$), nitrogen fluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As the dry etching method, a parallel plate RIE (reactive ion etching) method or an ICP (inductively coupled plasma) etching method can be used. In order to etch the films into desired shapes, the etching condition (the amount of electric power applied to a coil-shaped electrode, the amount of electric power applied to an electrode on a substrate side, the temperature of the electrode on the substrate side, or the like) is adjusted as appropriate.

As an etchant used for wet etching, a solution obtained by mixing phosphoric acid, acetic acid, and nitric acid, an ammonia peroxide mixture (hydrogen peroxide:ammonia:water=5:2:2), or the like can be used. In addition, ITO07N (produced by KANTO CHEMICAL CO., INC.) may also be used.

The etchant used in the wet etching is removed by cleaning together with the material which is etched off. The waste liquid including the etchant and the material etched off may be purified and the material may be reused. When a material such as indium included in the oxide semiconductor layer is collected from the waste liquid after the etching and reused, the resources can be efficiently used and the cost can be reduced.

The etching conditions (such as an etchant, etching time, and temperature) are appropriately adjusted depending on the material so that the material can be etched into a desired shape.

Next, a third photolithography step is conducted to form a resist mask, and unnecessary portions are removed by etching to form a contact hole which reaches an electrode layer or a wiring made of the same material as the gate electrode layer. The contact hole is provided for direct connection with a conductive film to be formed later. For example, a contact hole is formed when a thin film transistor whose gate electrode layer is in direct contact with the source or drain electrode layer in the driver circuit portion is formed, or when a terminal that is electrically connected to a gate wiring of a terminal portion is formed.

Next, over the oxide semiconductor film 109 and the oxide semiconductor film 111, a conductive film 132 formed from a metal material is formed by a sputtering method or a vacuum evaporation method. A cross-sectional view at this stage is illustrated in FIG. 5B.

As the material of the conductive film 132, there are an element selected from Al, Cr, Ta, Ti, Mo, and W, an alloy containing any of these elements as its component, an alloy containing a combination of any of these elements, and the like. Further, in the case of performing heat treatment at 200° C. to 600° C., it is preferable that the conductive film have heat resistance enough to withstand the heat treatment. Since aluminum alone has the disadvantages of low heat resistance, being easily corroded, and the like, it is used in combination with a conductive material having heat resistance. As the conductive material having heat resistance which is used in combination with Al, any of the following materials may be used: an element selected from titanium (Ti), tantalum (Ta), tungsten (W), molybdenum (Mo), chromium (Cr), neodymium (Nd), and scandium (Sc), an alloy containing any of these elements as its component, an alloy containing a combination of any of these elements, and a nitride containing any of these elements as its component.

Here, the conductive film 132 has a single-layer structure of a titanium film. Alternatively, the conductive film 132 may have a two-layer structure: an aluminum film and a titanium film stacked thereover. Still alternatively, the conductive film 132 may have a three-layer structure: a Ti film, an aluminum film containing Nd (Al—Nd) which is stacked over the Ti film, and a Ti film formed over these films. The conductive film 132 may have a single-layer structure of an aluminum film containing silicon.

Next, a resist mask 131 is formed by a fourth photolithography step, and unnecessary portions are removed by etching, thereby forming source or drain electrode layers 105a and 105b, n+ layers 104a and 104b each serving as a source region or a drain region, and a second terminal 122. Wet etching or dry etching is used as an etching method at this time. For example, when an aluminum film or an aluminum-alloy film is used as the conductive film 132, wet etching using a mixed solution of phosphoric acid, acetic acid, and nitric acid can be carried out. Here, by wet etching using an ammonia hydrogen peroxide mixture (with the ratio of hydrogen peroxide to ammonia and water being 5:2:2), the conductive film 132 which is a Ti film is etched to form the source or drain electrode layers 105a and 105b, and the oxide semiconductor film 111 is etched to form the n+ layers 104a and 104b. In this etching step, an exposed region of the oxide semiconductor film 109 is also partly etched to be a semiconductor layer 133. Thus, a channel region of the semiconductor layer 133 between the n+ layers 104a and 104b has a small thickness. In FIG. 5C, the etching for forming the source or drain electrode layers 105a and 105b and the n+ layers 104a and 104b is performed at a time by using an etchant of an ammonia hydrogen peroxide mixture. Accordingly, an end portion of the source or drain electrode layer 105a and an end portion of the source or drain electrode layer 105b are aligned with an end portion of the n+ layer 104a and an end portion of the n+ layer 104b, respectively; thus, continuous structures are formed. In addition, wet etching allows the layers to be etched isotropically, so that the end portions of the source or drain electrode layers 105a and 105b are positioned more inwardly than those of the resist mask 131.

Next, a metal element 134 which is at least one of metal elements of iron, nickel, cobalt, copper, gold, manganese, molybdenum, tungsten, niobium, and tantalum is added to the semiconductor layer 133 which is an oxide semiconductor layer, whereby a semiconductor layer 103 is formed (FIG. 6A). As the metal element 134, at least one of metal elements of iron, nickel, cobalt, copper, gold, manganese, molybdenum, tungsten, niobium, and tantalum can be used. For example, iron is used as the metal element 134 and added by an ion implantation method. Iron is added with the use of an ion implantation apparatus which is provided with an ion source chamber including a heater capable of vaporizing a solid state source.

Since the source or drain electrode layers 105a and 105b are formed over the semiconductor layer 133, the source or drain electrode layers 105a and 105b serve as masks and the metal element 134 is added to an exposed region of the semiconductor layer 133. When the metal element is selectively added to the semiconductor layer 133 in this manner, the concentration of the added metal element has a distribution and a region to which the metal element is not added also exists in the semiconductor layer 103.

By addition of the metal element, the oxide semiconductor layer is stabilized and the photosensitivity of the oxide semiconductor layer is lowered, which can prevent variation in electric characteristics such as an increase in off current.

Figure 9:
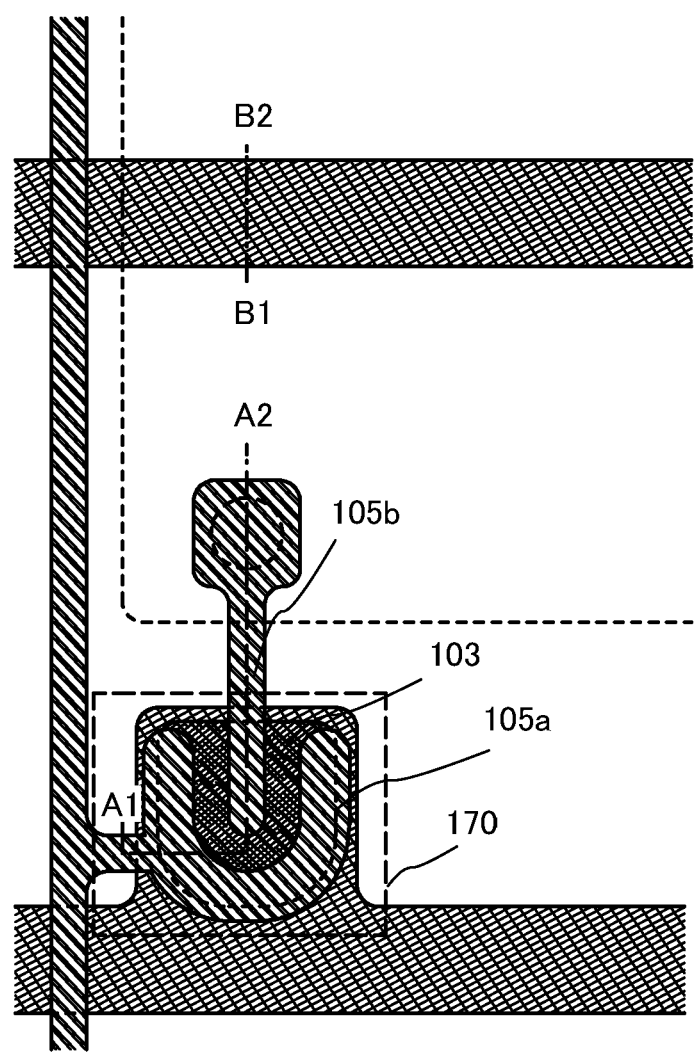
FIG. 9 illustrates a method for manufacturing a semiconductor device.

Through the above steps, a thin film transistor 170 including the semiconductor layer 103 to which the metal element is added as a channel formation region can be manufactured. FIG. 6A is a cross-sectional view at this stage. A top view at this stage is illustrated in FIG. 9.

Then, heat treatment is preferably performed at 200° C. to 600° C., typically, 300° C. to 500° C. For example, heat treatment is performed using a furnace at 350° C. for one hour in a nitrogen atmosphere. By this heat treatment, rearrangement at an atomic level of the In—Ga—Zn—O-based non-single-crystal film is performed. This heat treatment (including photo annealing and the like) is important because this heat treatment enables release of distortion which interrupts transfer of carriers. Note that there is no particular limitation on the timing of heat treatment as long as it is performed after formation of the second In—Ga—Zn—O-based non-single-crystal film, and for example, heat treatment may be performed after formation of a pixel electrode.

Furthermore, the exposed part of the channel formation region of the semiconductor layer 103 may be subjected to oxygen radical treatment, so that a normally-off thin film transistor can be obtained. In addition, the radical treatment can repair damage due to the etching in the semiconductor layer 103. The radical treatment is preferably performed in an atmosphere of $O_2$ or $N_2O$, preferably an atmosphere of $N_2$, He, or Ar which contains oxygen. The radical treatment may also be performed under the above atmosphere to which $Cl_2$ or $CF_4$ is added. Note that the radical treatment is preferably performed with no bias applied.

In the fourth photolithography step, the second terminal 122 that is made of the same material as the source or drain electrode layers 105a and 105b remains in the terminal portion. Note that the second terminal 122 is electrically connected to a source wiring (a source wiring including the source or drain electrode layers 105a and 105b).

If using a resist mask having a plurality of regions with different thicknesses (typically, two kinds of thicknesses) formed using a multi-tone mask, the number of resist masks can be reduced, resulting in a simplified process and lower cost.

Next, the resist mask 131 is removed and a protective insulating layer 107 is formed to cover the thin film transistor 170. The protective insulating layer 107 can be formed using a silicon nitride film, a silicon oxide film, a silicon oxynitride film, an aluminum oxide film, a tantalum oxide film, or the like which is obtained by a sputtering method or the like.

Then, a fifth photolithography step is performed to form a resist mask, and the protective insulating layer 107 is etched to form a contact hole 125 reaching the source electrode layer or drain electrode layer 105b. In addition, a contact hole 127 reaching the second terminal 122 and a contact hole 126 reaching the first terminal 121 are also formed in the same etching step. A cross-sectional view at this stage is illustrated in FIG. 6B.

Next, the resist mask is removed, and then a transparent conductive film is formed. The transparent conductive film is formed of indium oxide ($In_2O_3$), indium oxide-tin oxide alloy ($In_2O_3$—$SnO_2$, abbreviated to ITO), or the like by a sputtering method, a vacuum evaporation method, or the like. Such a material is etched with a hydrochloric acid-based solution. However, since a residue is easily generated particularly in etching ITO, indium oxide-zinc oxide alloy ($In_2O_3$—ZnO) may be used to improve etching processability.

Next, a sixth photolithography step is performed to form a resist mask, and unnecessary portions are removed by etching, thereby forming a pixel electrode layer 110.

In the sixth photolithography step, a storage capacitor is formed between a capacitor wiring 108 and the pixel electrode layer 110 with the gate insulating layer 102 and the protective insulating layer 107 in the capacitor portion as dielectrics.

Furthermore, in the sixth photolithography step, the first terminal and the second terminal are covered with the resist mask so that transparent conductive films 128 and 129 in the terminal portions remain. The transparent conductive films 128 and 129 serve as an electrode or a wiring connected to an FPC. The transparent conductive film 128 formed over the first terminal 121 is a connecting terminal electrode serving as an input terminal of a gate wiring. The transparent conductive film 129 formed over the second terminal 122 is a connecting terminal electrode serving as an input terminal of a source wiring.

Figure 10:
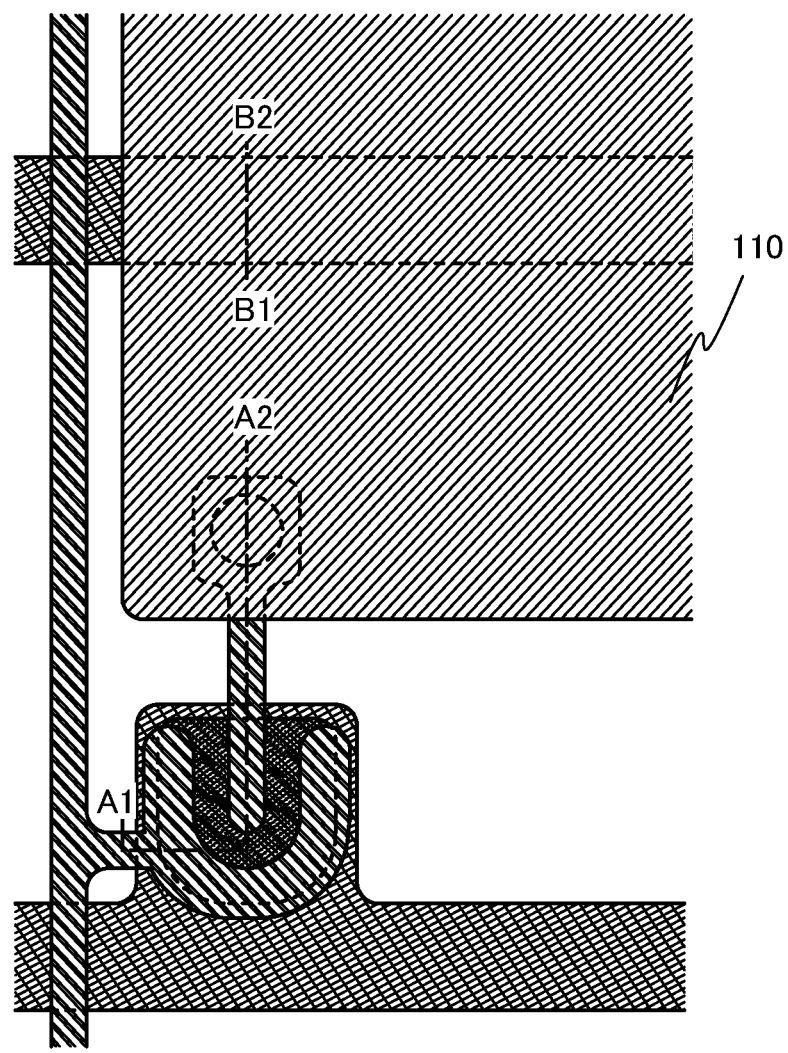
FIG. 10 illustrates a semiconductor device.

Then, the resist mask is removed. A cross-sectional view at this stage is illustrated in FIG. 6C. Note that FIG. 10 is a top view at this stage.

FIGS. 11A1 and 11A2 are respectively a cross-sectional view and a top view of a gate wiring terminal portion at this stage. FIG. 11A1 is a cross-sectional view along line E1-E2 of FIG. 11A2. In FIG. 11A1, a transparent conductive film 155 formed over a protective insulating film 154 is a connecting terminal electrode serving as an input terminal. Furthermore, in the terminal portion of FIG. 11A1, a first terminal 151 made of the same material as a gate wiring and a connection electrode layer 153 made of the same material as a source wiring overlap with each other with a gate insulating layer 152 interposed therebetween, and are electrically connected to each other through the transparent conductive film 155. Note that a part of FIG. 6C where the transparent conductive film 128 is in contact with the first terminal 121 corresponds to a part of FIG. 11A1 where the transparent conductive film 155 is in contact with the first terminal 151.

FIGS. 11B1 and 11B2 are respectively a cross-sectional view and a top view of a source wiring terminal portion which is different from that illustrated in FIG. 6C. FIG. 11B1 is a cross-sectional view along line F1-F2 of FIG. 11B2. In FIG. 11B1, a transparent conductive film 155 formed over a protective insulating film 154 is a connecting terminal electrode serving as an input terminal. Furthermore, in the terminal portion of FIG. 11B1, an electrode layer 156 made of the same material as a gate wiring is formed under a second terminal 150 electrically connected to the source wiring and overlaps with the second terminal 150 with a gate insulating layer 152 interposed therebetween. The electrode layer 156 is not electrically connected to the second terminal 150, and a capacitor to prevent noise or static electricity can be formed if the potential of the electrode layer 156 is set to be a potential different from that of the second terminal 150, such as floating, GND, or 0 V. The second terminal 150 is electrically connected to the transparent conductive film 155 and the protective insulating film 154 is interposed between the second terminal 150 and the transparent conductive film 155.

A plurality of gate wirings, source wirings, and capacitor wirings are provided depending on the pixel density. Also in the terminal portion, a plurality of the first terminals at the same potential as the gate wirings, a plurality of the second terminals at the same potential as the source wirings, a plurality of the third terminals at the same potential as the capacitor wirings, and the like are arranged. The numbers of the first to third terminals may be each a given number and determined by a practitioner as appropriate.

Through these six photolithography steps, a pixel thin film transistor portion including the thin film transistor 170 which is a bottom-gate n-channel thin film transistor, and a storage capacitor can be completed using the six photomasks. When these pixel thin film transistor portion and storage capacitor are arranged in a matrix corresponding to their respective pixels, a pixel portion can be formed and one of the substrates for manufacturing an active matrix display device can be obtained. In this specification, such a substrate is referred to as an active matrix substrate for convenience.

In the case of manufacturing an active matrix liquid crystal display device, an active matrix substrate and a counter substrate provided with a counter electrode are bonded to each other with a liquid crystal layer interposed therebetween. Note that a common electrode electrically connected to the counter electrode on the counter substrate is provided over the active matrix substrate, and a fourth terminal electrically connected to the common electrode is provided in the terminal portion. The fourth terminal is provided so that the common electrode is fixed to a predetermined potential such as GND or 0 V.

Figure 12:
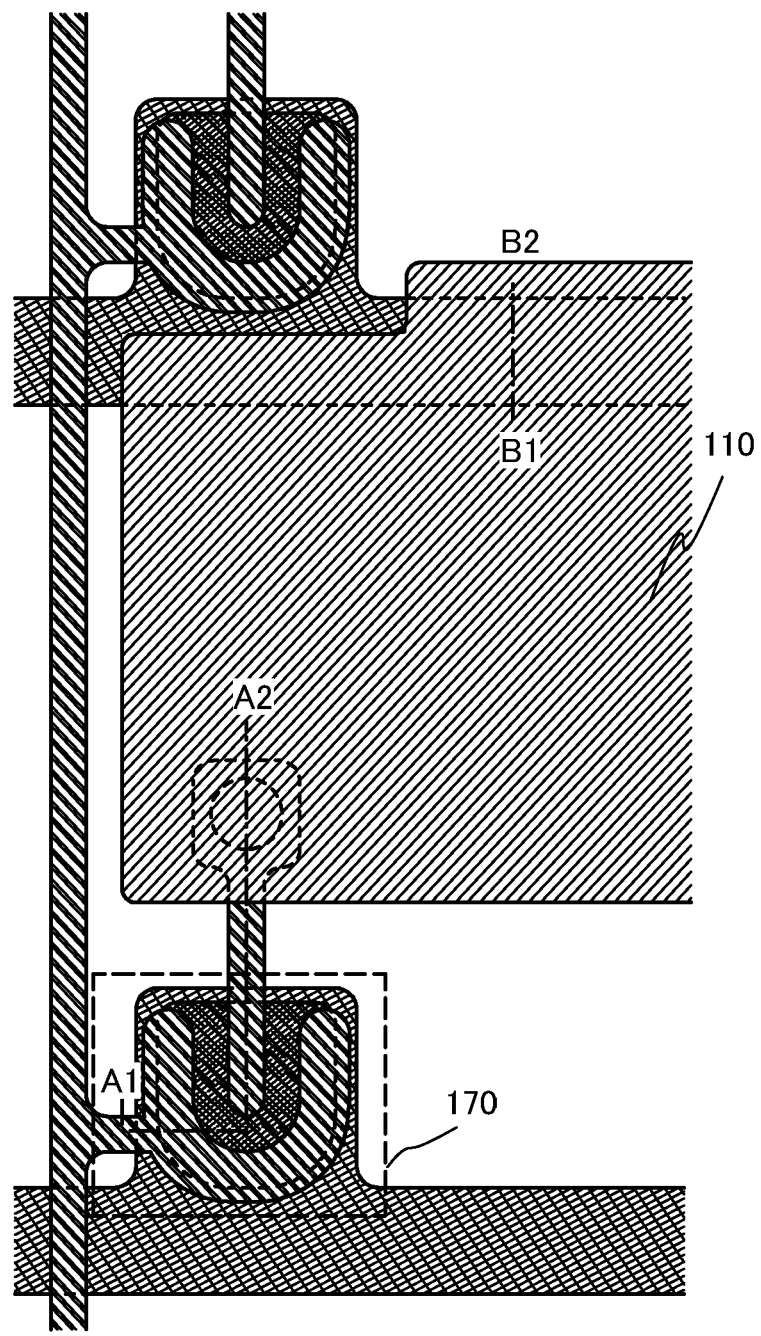
FIG. 12 illustrates a semiconductor device.

An embodiment of the present invention is not limited to the pixel structure of FIG. 10, and an example of the top view different from FIG. 10 is illustrated in FIG. 12. FIG. 12 illustrates an example in which a capacitor wiring is not provided and a pixel electrode overlaps with a gate wiring of an adjacent pixel with a protective insulating film and a gate insulating layer interposed therebetween to form a storage capacitor. In that case, the capacitor wiring and the third terminal connected to the capacitor wiring can be omitted. Note that in FIG. 12, the same portions as in FIG. 10 are denoted by the same reference numerals.

In an active matrix liquid crystal display device, pixel electrodes arranged in a matrix are driven to form a display pattern on a screen. Specifically, voltage is applied between a selected pixel electrode and a counter electrode corresponding to the pixel electrode, so that a liquid crystal layer provided between the pixel electrode and the counter electrode is optically modulated and this optical modulation is recognized as a display pattern by an observer.

In displaying moving images, a liquid crystal display device has a problem in that a long response time of liquid crystal molecules themselves causes afterimages or blurring of moving images. In order to improve the moving-image characteristics of a liquid crystal display device, a driving method called black insertion is employed in which black is displayed on the whole screen every other frame period.

Alternatively, a driving method called double-frame rate driving may be employed in which frequency of the vertical cycle is 1.5 times or more, preferably, 2 times or more as long as that of a usual vertical cycle to improve the moving-image characteristics.

Further alternatively, in order to improve the moving-image characteristics of a liquid crystal display device, a driving method may be employed in which a plurality of LED (light-emitting diode) light sources or a plurality of EL light sources are used to form a surface light source as a backlight, and each light source of the surface light source is independently driven in a pulsed manner in one frame period. As the surface light source, three or more kinds of LEDs may be used or an LED emitting white light may be used. Since a plurality of LEDs can be controlled independently, the light emission timing of LEDs can be synchronized with the timing at which a liquid crystal layer is optically modulated. According to this driving method, LEDs can be partly turned off; therefore, an effect of reducing power consumption can be obtained particularly in the case of displaying an image having a large part of black display on one screen.

By combining these driving methods, the display characteristics of a liquid crystal display device, such as moving-image characteristics, can be improved as compared to those of conventional liquid crystal display devices.

The n-channel transistor disclosed in this specification includes an oxide semiconductor film to which a metal element is added for a channel formation region and has good dynamic characteristics. Accordingly, these driving methods can be applied in combination to the n-channel transistor disclosed in this specification.

In the case of manufacturing a light-emitting display device, one electrode (also referred to as a cathode) of an organic light-emitting element is set to be a low power source potential such as GND or 0 V; thus, a terminal portion is provided with a fourth terminal for setting the cathode to a low power source potential such as GND or 0 V. In addition, in the case of manufacturing a light-emitting display device, a power supply line is provided in addition to a source wiring and a gate wiring. Accordingly, a terminal portion is provided with a fifth terminal electrically connected to the power supply line.

The use of an oxide semiconductor for a thin film transistor leads to reduction in manufacturing cost.

A thin film transistor with stable electric characteristics can be obtained by adding a metal element to an oxide semiconductor layer, and a thin film transistor with favorable dynamic characteristics can be manufactured. Therefore, a semiconductor device including a highly reliable thin film transistor can be provided.

This embodiment can be combined with the structure disclosed in other embodiments, as appropriate.

Embodiment 7

Instead of the oxide semiconductor layer ($InMO_3(ZnO)_m$ (m>0) film) which is the In—Ga—Zn—O-based non-single-crystal film in Embodiments 1 to 6, an $InMO_3(ZnO)_m$ (m>0) film in which M is a different metal element may be used.

As an oxide semiconductor used in this specification, a thin film of a material denoted by $InMO_3(ZnO)_m$ (m>0) is formed, and a thin film transistor in which the thin film is used as a semiconductor layer is manufactured. Note that M denotes one or more of metal elements, selected from gallium (Ga), iron (Fe), nickel (Ni), manganese (Mn), and cobalt (Co). There is a case where Ga and the above metal elements other than Ga, for example, Ga and Ni or Ga and Fe are contained as M. Moreover, in the oxide semiconductor, in some cases, a transition metal element such as Fe or Ni or an oxide of the transition metal is contained as an impurity element in addition to the metal element contained as M. Note that the metal element denoted by M and the above impurity element are contained during deposition of the oxide semiconductor film, so that the $InMO_3(ZnO)_m$ (m>0) film is obtained.

At least one of metal elements of iron, nickel, cobalt, copper, gold, manganese, molybdenum, tungsten, niobium, and tantalum is added to the thin oxide semiconductor layer such as the $InMO_3(ZnO)_m$ (m>0) film. By selecting a condition and a method for adding the metal element, a region to which the metal element is added or a concentration distribution of the metal element in the oxide semiconductor layer can be controlled.

When the metal element is added to the oxide semiconductor layer, the metal element becomes a recombination center in the oxide semiconductor layer, whereby the photosensitivity of the oxide semiconductor layer can be lowered. The low photosensitivity can stabilize electric characteristics of the thin film transistor and can prevent an increase in off current due to variation in threshold voltage or the like.

The metal element becomes a recombination center of the film of $InMO_3(ZnO)_m$ (m>0) by being added thereto, whereby the photosensitivity can be lowered. As the metal element, at least one of metal elements of iron, nickel, cobalt, copper, gold, manganese, molybdenum, tungsten, niobium, and tantalum can be used. By adding these metals regardless of the kind of a metal element contained in the film of $InMO_3(ZnO)_m$ (m>0), electric characteristics of the thin film transistor can be stabilized. In addition, a region to which the metal element is added or a concentration distribution of the metal element in the oxide semiconductor layer can be controlled, whereby the photosensitivity can be lowered and electric characteristics of the thin film transistor can be stabilized efficiently.

A thin film transistor with stable electric characteristics can be obtained by adding a metal element to an oxide semiconductor layer, and a thin film transistor with favorable dynamic characteristics can be manufactured. Therefore, a semiconductor device including a highly reliable thin film transistor can be provided.

Embodiment 8

An example will be described below, in which at least a part of a driver circuit and a thin film transistor arranged in a pixel portion are formed over the same substrate in a display device which is one example of a semiconductor device.

The thin film transistor to be disposed in the pixel portion is formed according to Embodiments 1 to 7. Further, the thin film transistor described in Embodiments 1 to 7 is an n-channel TFT, and thus a part of a driver circuit that can include an n-channel TFT among driver circuits is formed over the same substrate as the thin film transistor of the pixel portion.

Figure 14A:
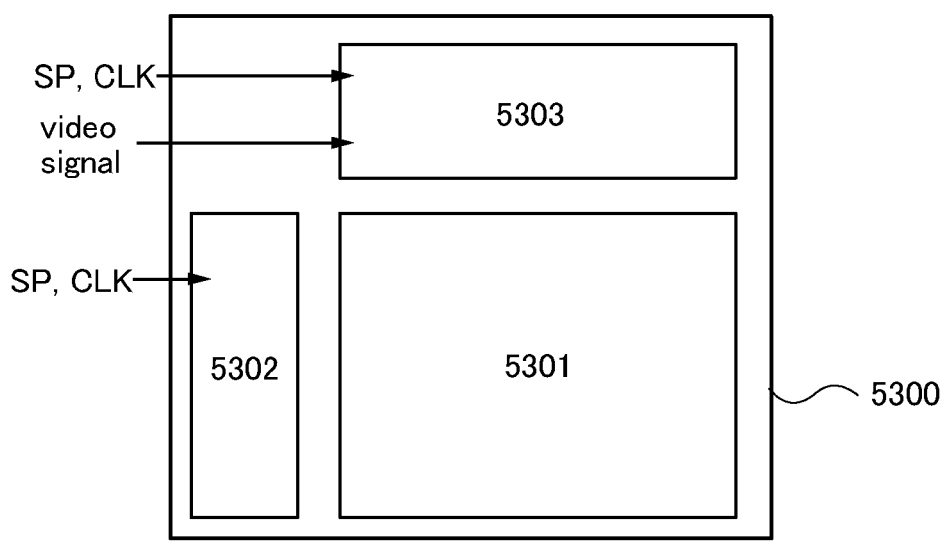
FIGS. 14A and 14B are block diagrams of a semiconductor device.

FIG. 14A is an example of a block diagram of an active matrix liquid crystal display device which is an example of a semiconductor device. The display device illustrated in FIG. 14A includes, over a substrate 5300, a pixel portion 5301 including a plurality of pixels that are each provided with a display element; a scan line driver circuit 5302 that selects a pixel; and a signal line driver circuit 5303 that controls a video signal input to the selected pixel.

The pixel portion 5301 is connected to the signal line driver circuit 5303 by a plurality of signal lines S1 to Sm (not illustrated) which extend in a column direction from the signal line driver circuit 5303, and to the scan line driver circuit 5302 by a plurality of scan lines G1 to Gn (not illustrated) that extend in a row direction from the scan line driver circuit 5302. The pixel portion 5301 includes a plurality of pixels (not illustrated) arranged in matrix so as to correspond to the signal lines S1 to Sm and the scan lines G1 to Gn. Each pixel is connected to a signal line Sj (one of the signal lines S1 to Sm) and a scan line Gj (one of the scan lines G1 to Gn).

In addition, the thin film transistor described in Embodiments 1 to 7 is an n-channel TFT, and a signal line driver circuit including the n-channel TFT is described with reference to FIG. 15.

Figure 15:
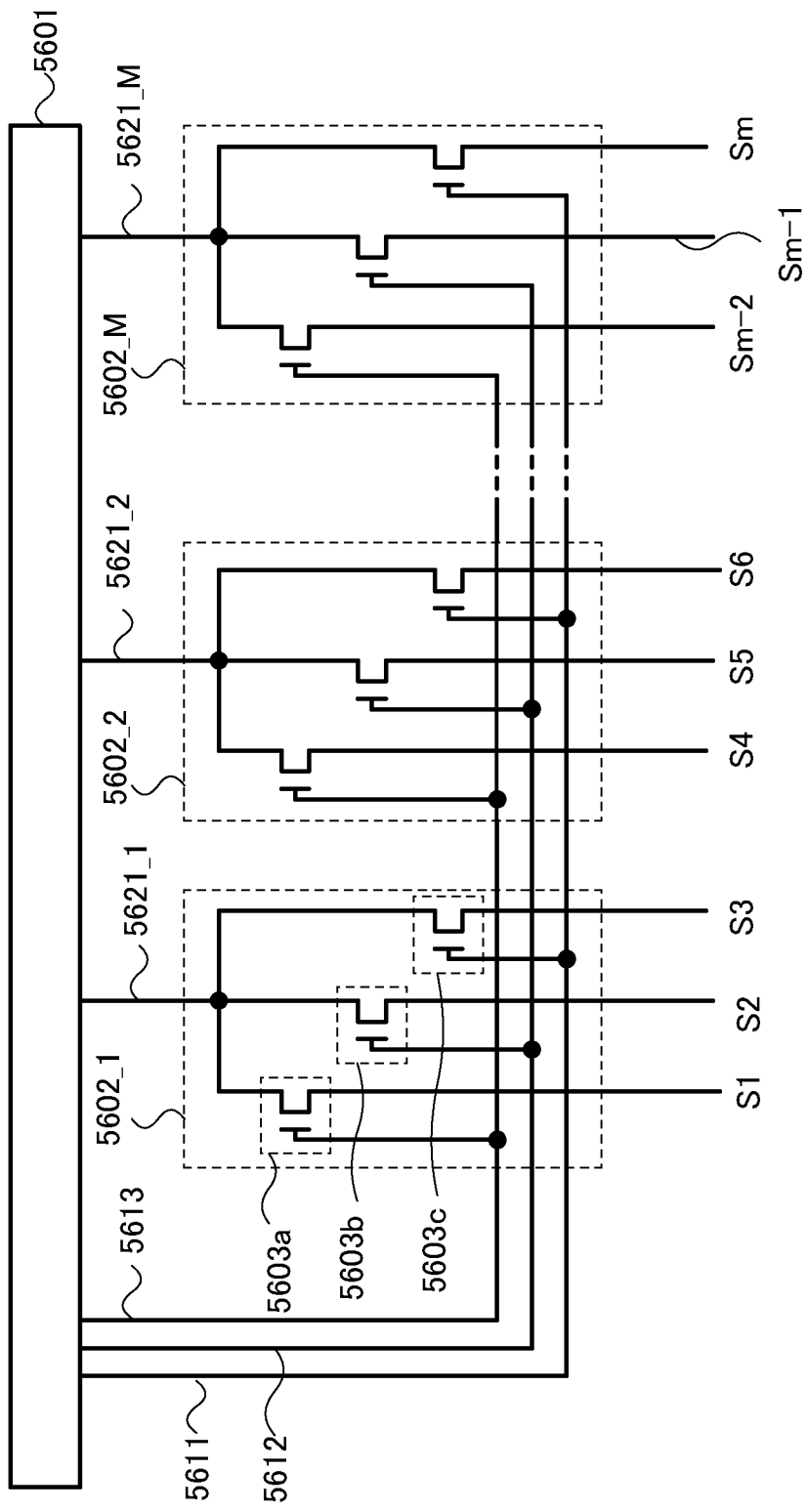
FIG. 15 shows a structure of a signal line driver circuit.

The signal line driver circuit illustrated in FIG. 15 includes a driver IC 5601, switch groups 5602_1 to 5602_M, a first wiring 5611, a second wiring 5612, a third wiring 5613, and wirings 5621_1 to 5621_M. Each of the switch groups 5602_1 to 5602_M includes a first thin film transistor 5603a, a second thin film transistor 5603b, and a third thin film transistor 5603c.

The driver IC 5601 is connected to the first wiring 5611, the second wiring 5612, the third wiring 5613, and the wirings 5621_1 to 5621_M. Each of the switch groups 5602_1 to 5602_M is connected to the first wiring 5611, the second wiring 5612, and the third wiring 5613, and the wirings 5621_1 to 5621_M are connected to the switch groups 5602_1 to 5602_M, respectively. Each of the wirings 5621_1 to 5621_M is connected to three signal lines via the first thin film transistor 5603a, the second thin film transistor 5603b, and the third thin film transistor 5603c. For example, the wiring 5621_J of the J-th column (one of the wirings 5621_1 to 5621_M) is connected to a signal line Sj−1, a signal line Sj, and a signal line Sj+1 via the first thin film transistor 5603a, the second thin film transistor 5603b, and the third thin film transistor 5603c, respectively, which are included in the switch group 5602_J.

A signal is input to each of the first wiring 5611, the second wiring 5612, and the third wiring 5613.

Note that the driver IC 5601 is preferably formed over a single crystal substrate. Further, the switch groups 5602_1 to 5602_M are preferably formed over the same substrate as the pixel portion is. Therefore, the driver IC 5601 and the switch groups 5602_1 to 5602_M are preferably connected through an FPC or the like.

Figure 16:
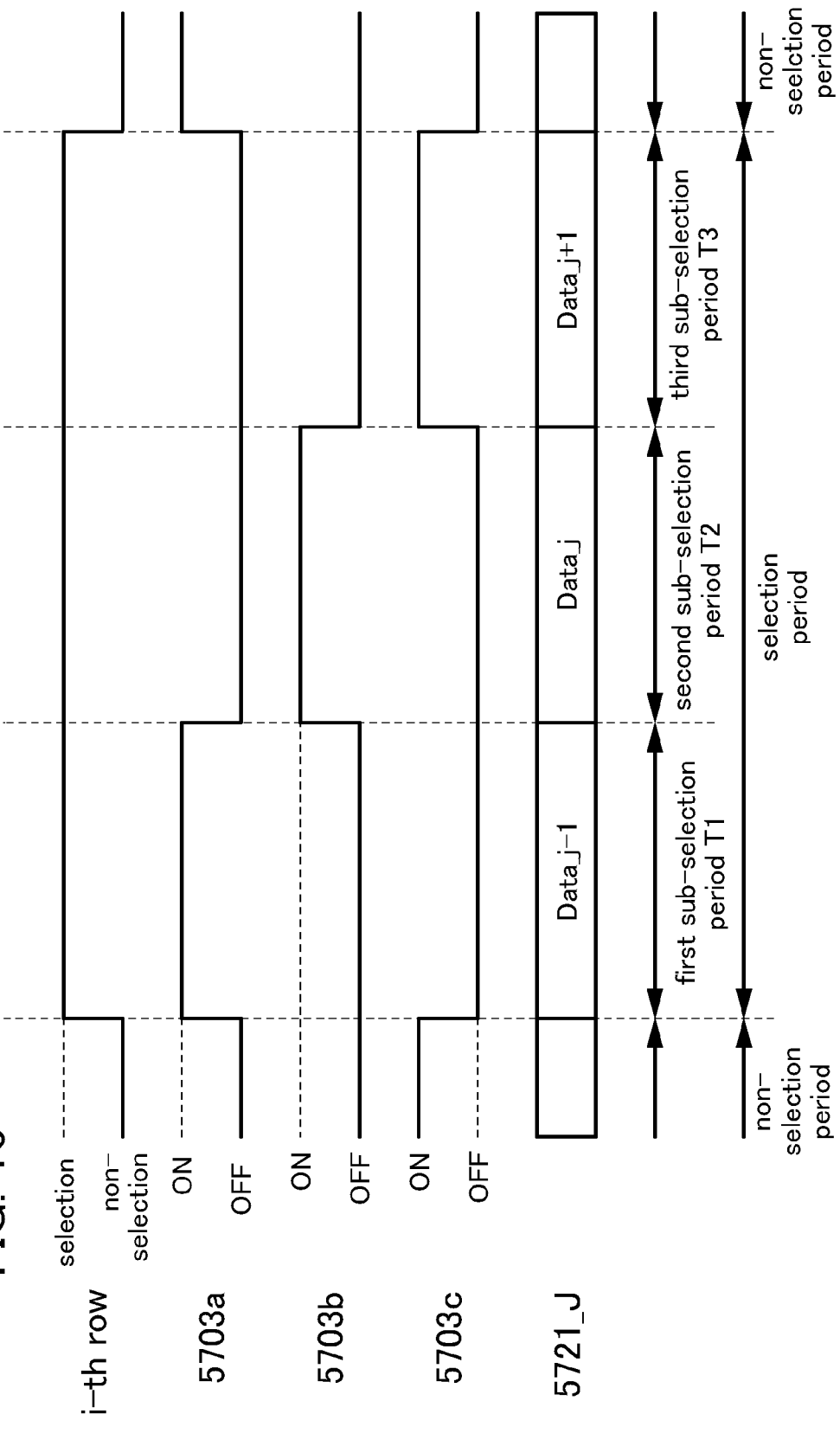
FIG. 16 is a timing chart of an operation of a signal line driver circuit.

Next, an operation of the signal line driver circuit illustrated in FIG. 15 is described with reference to a timing chart in FIG. 16. The timing chart in FIG. 16 illustrates the case where the scan line Gi of the i-th row is selected. A selection period of the scan line Gi of the i-th row is divided into a first sub-selection period T1, a second sub-selection period T2, and a third sub-selection period T3. In addition, even when a scan line of another row is selected, the signal line driver circuit in FIG. 15 operates in a manner similar to FIG. 16.

Note that the timing chart in FIG. 16 shows the case where the wiring 5621_J of the J-th column is connected to the signal line Sj−1, the signal line Sj, and the signal line Sj+1 via the first thin film transistor 5603a, the second thin film transistor 5603b, and the third thin film transistor 5603c, respectively.

Note that the timing chart in FIG. 16 shows timing at which the scan line Gi of the i-th row is selected, timing 5703a of on/off of the first thin film transistor 5603a, timing 5703b of on/off of the second thin film transistor 5603b, timing 5703c of on/off of the third thin film transistor 5603c, and a signal 5721_J input to the wiring 5621_J of the J-th column.

In the first sub-selection period T1, the second sub-selection period T2, and the third sub-selection period T3, different video signals are input to the wirings 5621_1 to 5621_M. For example, a video signal input to the wiring 5621_J in the first sub-selection period T1 is input to the signal line Sj−1, a video signal input to the wiring 5621_J in the second sub-selection period T2 is input to the signal line Sj, and a video signal input to the wiring 5621_J in the third sub-selection period T3 is input to the signal line Sj+1. In addition, the video signals input to the wiring 5621_J in the first sub-selection period T1, the second sub-selection period T2, and the third sub-selection period T3 are denoted by Data_j−1, Data_j, and Data_j+1.

As shown in FIG. 16, in the first sub-selection period T1, the first thin film transistor 5603a is turned on, and the second thin film transistor 5603b and the third thin film transistor 5603c are turned off. At this time, Data_j−1 input to the wiring 5621_J is input to the signal line Sj−1 via the first thin film transistor 5603a. In the second sub-selection period T2, the second thin film transistor 5603b is turned on, and the first thin film transistor 5603a and the third thin film transistor 5603c are turned off. At this time, Data_j input to the wiring 5621_J is input to the signal line Sj via the second thin film transistor 5603b. In the third sub-selection period T3, the third thin film transistor 5603c is turned on, and the first thin film transistor 5603a and the second thin film transistor 5603b are turned off. At this time, Data_j+1 input to the wiring 5621_J is input to the signal line Sj+1 via the third thin film transistor 5603c.

As described above, in the signal line driver circuit in FIG. 15, by dividing one gate selection period into three, video signals can be input to three signal lines from one wiring 5621 in one gate selection period. Therefore, in the signal line driver circuit in FIG. 15, the number of connections between the substrate provided with the driver IC 5601 and the substrate provided with the pixel portion can be approximately ⅓ of the number of signal lines. The number of connections is reduced to approximately ⅓ of the number of the signal lines, so that reliability, yield, etc., of the signal line driver circuit in FIG. 15 can be improved.

Note that there are no particular limitation on the arrangement, the number, a driving method, and the like of the thin film transistors, as long as one gate selection period is divided into a plurality of sub-selection periods and video signals are input to a plurality of signal lines from one wiring in the respective sub-selection periods as shown in FIG. 15.

For example, when video signals are input to three or more signal lines from one wiring in three or more sub-selection periods, it is only necessary to add a thin film transistor and a wiring for controlling the thin film transistor. Note that when one gate selection period is divided into four or more sub-selection periods, one sub-selection period becomes shorter. Therefore, one gate selection period is preferably divided into two or three sub-selection periods.

Figure 17:
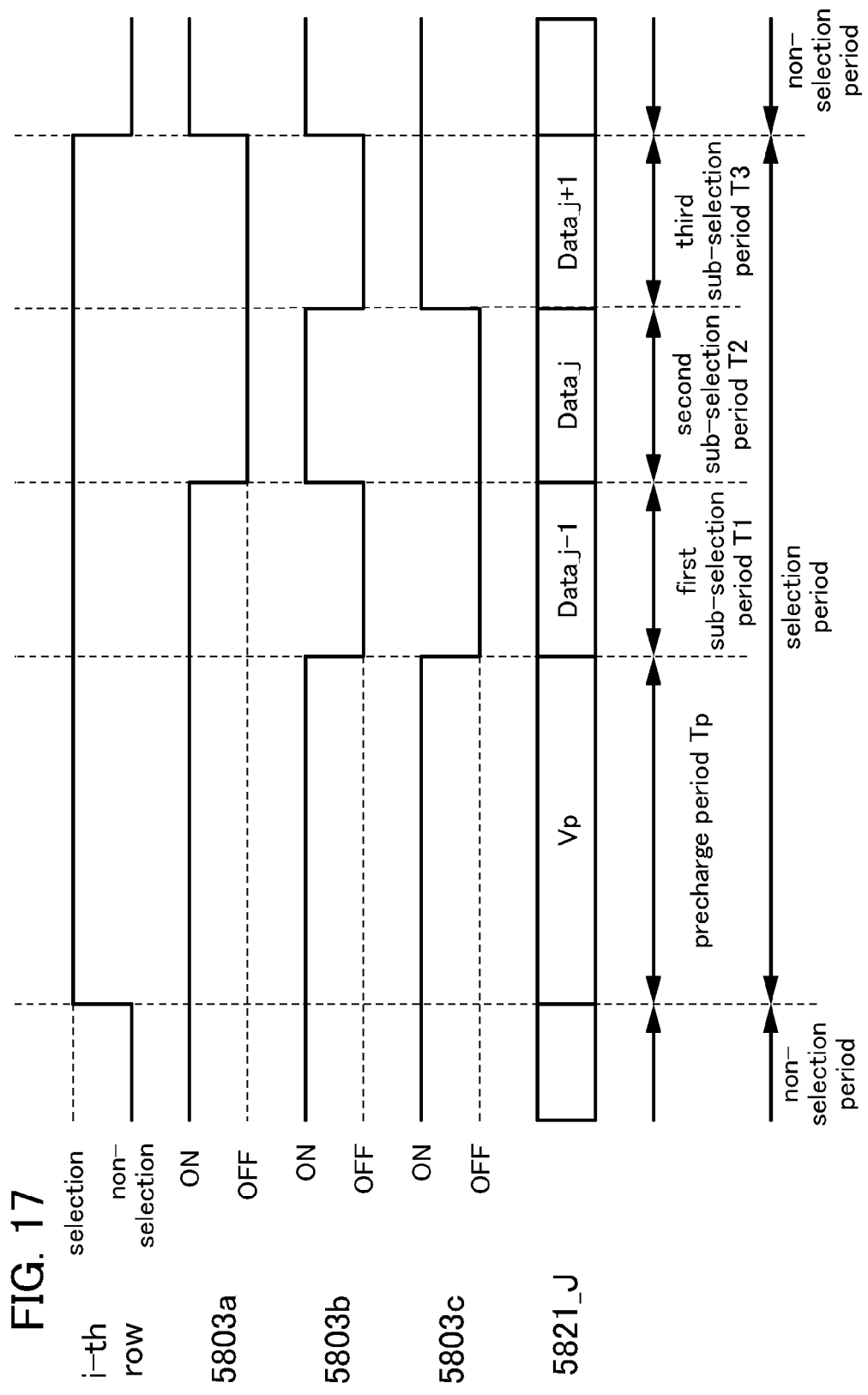
FIG. 17 is a timing chart of an operation of a signal line driver circuit.

As another example, one selection period may be divided into a precharge period Tp, the first sub-selection period T1, the second sub-selection period T2, and the third sub-selection period T3 as shown in a timing chart of FIG. 17. The timing chart of FIG. 17 shows the timing at which the scan line Gi of the i-th row is selected, timing 5803a of on/off of the first thin film transistor 5603a, timing 5803b of on/off of the second thin film transistor 5603b, timing 5803c of on/off of the third thin film transistor 5603c, and a signal 5821_J input to the wiring 5621_J of the J-th column. As shown in FIG. 17, the first thin film transistor 5603a, the second thin film transistor 5603b, and the third thin film transistor 5603c are tuned on in the precharge period Tp. At this time, precharge voltage Vp input to the wiring 5621_J is input to the signal line Sj−1, the signal line Sj, and the signal line Sj+1 via the first thin film transistor 5603a, the second thin film transistor 5603b, and the third thin film transistor 5603c, respectively. In the first sub-selection period T1, the first thin film transistor 5603a is turned on, and the second thin film transistor 5603b and the third thin film transistor 5603c are turned off. At this time, Data_j−1 input to the wiring 5621_J is input to the signal line Sj−1 via the first thin film transistor 5603a. In the second sub-selection period T2, the second thin film transistor 5603b is turned on, and the first thin film transistor 5603a and the third thin film transistor 5603c are turned off. At this time, Data_j input to the wiring 5621_J is input to the signal line Sj via the second thin film transistor 5603b. In the third sub-selection period T3, the third thin film transistor 5603c is turned on, and the first thin film transistor 5603a and the second thin film transistor 5603b are turned off. At this time, Data_j+1 input to the wiring 5621_J is input to the signal line Sj+1 via the third thin film transistor 5603c.

As described above, in the signal line driver circuit of FIG. 15 to which the timing chart of FIG. 17 is applied, the video signal can be written to the pixel at high speed because the signal line can be precharged by providing a precharge selection period before a sub-selection period. Note that portions of FIG. 17 which are similar to those of FIG. 16 are denoted by common reference numerals and detailed description of like portions and portions having similar functions is omitted.

Further, a structure of a scan line driver circuit is described. The scan line driver circuit includes a shift register and a buffer. Additionally, the scan line driver circuit may include a level shifter. In the scan line driver circuit, when a clock signal (CLK) and a start pulse signal (SP) are input to the shift register, a selection signal is generated. The generated selection signal is buffered and amplified by the buffer, and the resulting signal is supplied to a corresponding scan line. Gate electrodes of transistors in pixels of one line are connected to the scan line. Since the transistors in the pixels of one line have to be turned on all at once, a buffer which can supply a large current is used.

One mode of a shift register used for a part of the scan line driver circuit will be described with reference to FIG. 18 and FIG. 19.

Figure 18:
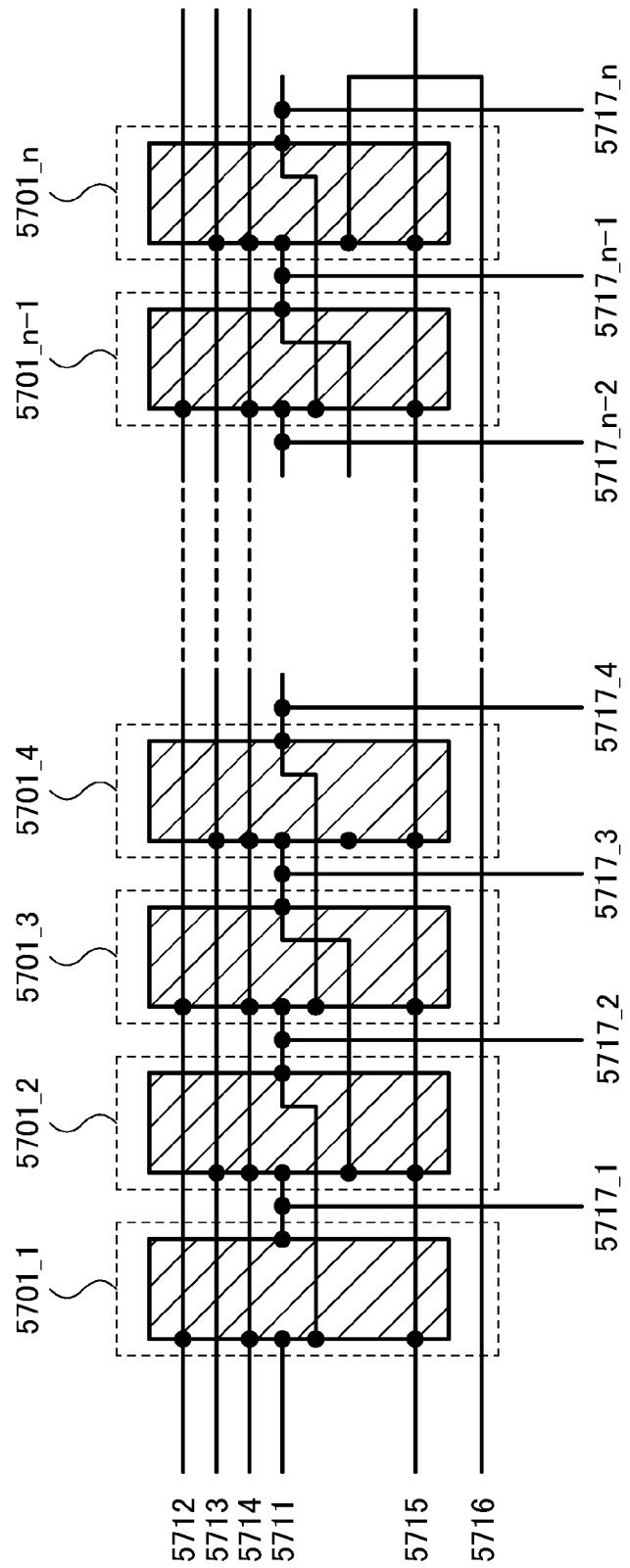
FIG. 18 shows a structure of a shift register.

FIG. 18 illustrates a circuit structure of the shift register. The shift register illustrated in FIG. 18 includes a plurality of flip-flops: flip-flops 5701_i to 5701_n. The shift register is operated with input of a first clock signal, a second clock signal, a start pulse signal, and a reset signal.

The connection relationship of the shift register of FIG. 18 will be described. In the i-th stage flip-flop 5701_i (one of the flip-flops 5701_1 to 5701_n) in the shift register of FIG. 18, a first wiring 5501 shown in FIG. 19 is connected to a seventh wiring 5717_i−1, a second wiring 5502 shown in FIG. 19 is connected to a seventh wiring 5717_i+1, a third wiring 5503 shown in FIG. 19 is connected to a seventh wiring 5717_i, and a sixth wiring 5506 shown in FIG. 19 is connected to a fifth wiring 5715.

Figure 19:
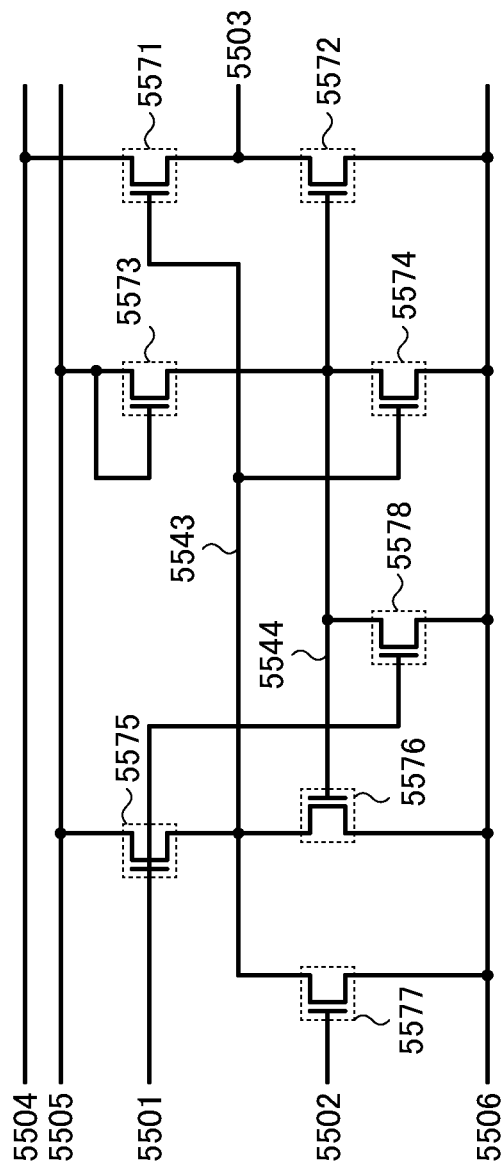
FIG. 19 shows a connection structure of a flip-flop in FIG. 18.

Further, a fourth wiring 5504 shown in FIG. 19 is connected to a second wiring 5712 in flip-flops of odd-numbered stages, and is connected to a third wiring 5713 in flip-flops of even-numbered stages. A fifth wiring 5505 shown in FIG. 19 is connected to a fourth wiring 5714.

Note that the first wiring 5501 of the first stage flip-flop 5701_1 which is shown in FIG. 19 is connected to a first wiring 5711. Moreover, the second wiring 5502 of the n-th stage flip-flop 5701_n which is shown in FIG. 19 is connected to a sixth wiring 5716.

Note that the first wiring 5711, the second wiring 5712, the third wiring 5713, and the sixth wiring 5716 may be referred to as a first signal line, a second signal line, a third signal line, and a fourth signal line, respectively. The fourth wiring 5714 and the fifth wiring 5715 may be referred to as a first power source line and a second power source line, respectively.

Next, FIG. 19 illustrates details of the flip-flop shown in FIG. 18. A flip-flop shown in FIG. 19 includes a first thin film transistor 5571, a second thin film transistor 5572, a third thin film transistor 5573, a fourth thin film transistor 5574, a fifth thin film transistor 5575, a sixth thin film transistor 5576, a seventh thin film transistor 5577, and an eighth thin film transistor 5578. Each of the first thin film transistor 5571, the second thin film transistor 5572, the third thin film transistor 5573, the fourth thin film transistor 5574, the fifth thin film transistor 5575, the sixth thin film transistor 5576, the seventh thin film transistor 5577, and the eighth thin film transistor 5578 is an n-channel transistor and is turned on when the gate-source voltage ($V_{gs}$) exceeds the threshold voltage ($V_{th}$).

Next, connection structures of the flip-flops shown in FIG. 18 will be described below.

A first electrode (one of a source electrode and a drain electrode) of the first thin film transistor 5571 is connected to the fourth wiring 5504. A second electrode (the other of the source electrode and the drain electrode) of the first thin film transistor 5571 is connected to the third wiring 5503.

A first electrode of the second thin film transistor 5572 is connected to the sixth wiring 5506. A second electrode of the second thin film transistor 5572 is connected to the third wiring 5503.

A first electrode of the third thin film transistor 5573 is connected to the fifth wiring 5505, and a second electrode of the third thin film transistor 5573 is connected to a gate electrode of the second thin film transistor 5572. A gate electrode of the third thin film transistor 5573 is connected to the fifth wiring 5505.

A first electrode of the fourth thin film transistor 5574 is connected to the sixth wiring 5506. A second electrode of the fourth thin film transistor 5574 is connected to the gate electrode of the second thin film transistor 5572. A gate electrode of the fourth thin film transistor 5574 is connected to a gate electrode of the first thin film transistor 5571.

A first electrode of the fifth thin film transistor 5575 is connected to the fifth wiring 5505. A second electrode of the fifth thin film transistor 5575 is connected to the gate electrode of the first thin film transistor 5571. A gate electrode of the fifth thin film transistor 5575 is connected to the first wiring 5501.

A first electrode of the sixth thin film transistor 5576 is connected to the sixth wiring 5506. A second electrode of the sixth thin film transistor 5576 is connected to the gate electrode of the first thin film transistor 5571. A gate electrode of the sixth thin film transistor 5576 is connected to the gate electrode of the second thin film transistor 5572.

A first electrode of the seventh thin film transistor 5577 is connected to the sixth wiring 5506. A second electrode of the seventh thin film transistor 5577 is connected to the gate electrode of the first thin film transistor 5571. A gate electrode of the seventh thin film transistor 5577 is connected to the second wiring 5502. A first electrode of the eighth thin film transistor 5578 is connected to the sixth wiring 5506. A second electrode of the eighth thin film transistor 5578 is connected to the gate electrode of the second thin film transistor 5572. A gate electrode of the eighth thin film transistor 5578 is connected to the first wiring 5501.

Note that the point at which the gate electrode of the first thin film transistor 5571, the gate electrode of the fourth thin film transistor 5574, the second electrode of the fifth thin film transistor 5575, the second electrode of the sixth thin film transistor 5576, and the second electrode of the seventh thin film transistor 5577 are connected is referred to as a node 5543. The point at which the gate electrode of the second thin film transistor 5572, the second electrode of the third thin film transistor 5573, the second electrode of the fourth thin film transistor 5574, the gate electrode of the sixth thin film transistor 5576, and the second electrode of the eighth thin film transistor 5578 are connected is referred to as a node 5544.

Note that the first wiring 5501, the second wiring 5502, the third wiring 5503, and the fourth wiring 5504 may be referred to as a first signal line, a second signal line, a third signal line, and a fourth signal line, respectively. The fifth wiring 5505 and the sixth wiring 5506 may be referred to as a first power source line and a second power source line, respectively.

In addition, the signal line driver circuit and the scan line driver circuit can be formed using only the n-channel TFTs described in Embodiment 1. The n-channel TFT described in Embodiment 1 has a high mobility of the transistor, and thus a driving frequency of a driver circuit can be increased. Further, parasitic capacitance is reduced by the source or drain region which is an In—Ga—Zn—O-based non-single-crystal film; thus, the n-channel TFT described in Embodiment 1 has high frequency characteristics (referred to as f characteristics). For example, a scan line driver circuit using the n-channel TFT described in Embodiment 1 can operate at high speed, and thus a frame frequency can be increased and insertion of black images can be realized.

In addition, when the channel width of the transistor in the scan line driver circuit is increased or a plurality of scan line driver circuits are provided, for example, higher frame frequency can be realized. When a plurality of scan line driver circuits are provided, a scan line driver circuit for driving scan lines of even-numbered rows is provided on one side and a scan line driver circuit for driving scan lines of odd-numbered rows is provided on the opposite side; thus, an increase in frame frequency can be realized. Furthermore, the use of the plurality of scan line driver circuits for output of signals to the same scan line is advantageous in increasing the size of a display device.

Figure 14B:
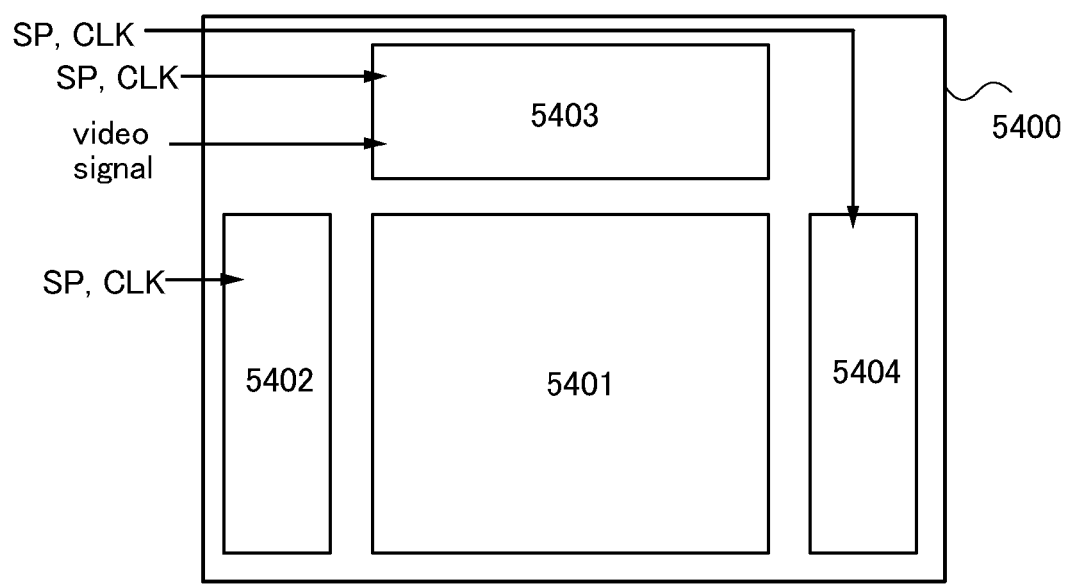

Further, when an active matrix light-emitting display device which is an example of a semiconductor device is manufactured, a plurality of thin film transistors are arranged in at least one pixel, and thus a plurality of scan line driver circuits are preferably arranged. FIG. 14B illustrates an example of a block diagram of an active matrix light-emitting display device.

The light-emitting display device illustrated in FIG. 14B includes, over a substrate 5400, a pixel portion 5401 including a plurality of pixels each provided with a display element, a first scan line driver circuit 5402 and a second scan line driver circuit 5404 for selecting a pixel, and a signal line driver circuit 5403 for controlling a video signal input to the selected pixel.

When the video signal input to a pixel of the light-emitting display device illustrated in FIG. 14B is a digital signal, a pixel emits light or does not emit light by switching a transistor on/off. Thus, grayscale can be displayed using an area grayscale method or a time grayscale method. An area grayscale method refers to a driving method in which one pixel is divided into a plurality of sub-pixels and each sub-pixel is driven independently based on a video signal so that grayscale is displayed. Further, a time grayscale method refers to a driving method in which a period during which a pixel emits light is controlled so that grayscale is displayed.

Since the response time of a light-emitting element is higher than that of a liquid crystal element or the like, the light-emitting element is more suitable for a time grayscale method than the liquid crystal element. Specifically, in the case of displaying with a time grayscale method, one frame period is divided into a plurality of sub-frame periods. Then, in accordance with video signals, the light-emitting element in the pixel is brought into a light-emitting state or a non-light-emitting state in each sub-frame period. By dividing one frame period into a plurality of sub-frame periods, the total length of time of a period, in which a pixel actually emits light in one frame period, can be controlled by video signals so that grayscale can be displayed.

Note that in the example of the light-emitting display device illustrated in FIG. 14B, when two switching TFTs are arranged in one pixel, the first scan line driver circuit 5402 generates a signal which is input to a first scan line serving as a gate wiring of one of the two switching TFTs, and the second scan line driver circuit 5404 generates a signal which is input to a second scan line serving as a gate wiring of the other of the two switching TFTs; however, one scan line driver circuit may generate both the signal which is input to the first scan line and the signal which is input to the second scan line. In addition, for example, there is a possibility that a plurality of scan lines used for controlling the operation of the switching element are provided in each pixel, depending on the number of the switching TFTs included in one pixel. In this case, one scan line driver circuit may generate all signals that are input to the plurality of scan lines, or a plurality of scan line driver circuits may generate signals that are input to the plurality of scan lines.

Also in the light-emitting display device, a part of a driver circuit that can include an n-channel TFT among driver circuits can be formed over the same substrate as the thin film transistor of the pixel portion. Alternatively, the signal line driver circuit and the scan line driver circuit can be formed using only the n-channel TFTs described in Embodiment 1 to 7.

Moreover, the above-described driver circuit can be used for electronic paper that drives electronic ink using an element electrically connected to a switching element, without being limited to applications to a liquid crystal display device or a light-emitting display device. The electronic paper is also referred to as an electrophoretic display device (an electrophoretic display) and is advantageous in that it has the same level of readability as plain paper, it has lower power consumption than other display devices, and it can be made thin and lightweight.

Electrophoretic displays can have various modes. Electrophoretic displays contain a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display is a display that utilizes a so-called dielectrophoretic effect by which a substance having a high dielectric constant moves to a high-electric field region. An electrophoretic display device does not need to use a polarizer or a counter substrate, which is required in a liquid crystal display device, and both the thickness and weight of the electrophoretic display device can be reduced to a half of those of a liquid crystal display device.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

In addition, if a plurality of the above microcapsules are arranged as appropriate over an active matrix substrate so as to be interposed between two electrodes, an active matrix display device can be completed, and display can be performed by application of an electric field to the microcapsules. For example, the active matrix substrate obtained by the thin film transistors described in Embodiment 1 to 7 can be used.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

Through the above process, a highly reliable display device can be manufactured as a semiconductor device.

This embodiment can be implemented in appropriate combination with the structures described in the other embodiments.

Embodiment 9

When a thin film transistor is manufactured and used for a pixel portion and further for a driver circuit, a semiconductor device having a display function (also referred to as a display device) can be manufactured. Furthermore, when a part or whole of a driver circuit using a thin film transistor is formed over the same substrate as that for a pixel portion, a system-on-panel can be obtained.

The display device includes a display element. As the display element, a liquid crystal element (also referred to as a liquid crystal display element) or a light-emitting element (also referred to as a light-emitting display element) can be used. Light-emitting elements include, in its category, an element whose luminance is controlled by current or voltage, and specifically include an inorganic electroluminescent (EL) element, an organic EL element, and the like. Furthermore, a display medium whose contrast is changed by an electric effect, such as electronic ink, can be used.

In addition, the display device includes a panel in which the display element is sealed, and a module in which an IC or the like including a controller is mounted on the panel. The present invention also relates to an element substrate, which corresponds to one mode before the display element is completed in a manufacturing process of the display device, and the element substrate is provided with means for supplying current to the display element in each of a plurality of pixels. Specifically, the element substrate may be in a state after only a pixel electrode of the display element is formed, a state after a conductive film to be a pixel electrode is formed and before the conductive film is etched to form the pixel electrode, or any of other states.

Note that a display device in this specification means an image display device, a display device, or a light source (including a lighting device). Furthermore, the display device also includes the following modules in its category: a module to which a connector such as an FPC (flexible printed circuit), a TAB (tape automated bonding) tape, or a TCP (tape carrier package) is attached; a module having a TAB tape or a TCP at the tip of which a printed wiring board is provided; and a module in which an IC (integrated circuit) is directly mounted on a display element by a COG (chip on glass) method.

The appearance and a cross section of a liquid crystal display panel, which is one embodiment of a semiconductor device, will be described with reference to FIGS. 22A1, 22A2, and 22B. FIGS. 22A1 and 22A2 are each a top view of a panel in which highly reliable thin film transistors 4010 and 4011 formed over a first substrate 4001 and a liquid crystal element 4013 are sealed between the first substrate 4001 and a second substrate 4006 with a sealant 4005. The thin film transistors 4010 and 4011 each include, as a semiconductor layer, an oxide semiconductor film to which a metal element is added as described in Embodiment 1. FIG. 22B is a cross-sectional view along line M-N of FIGS. 22A1 and 22A2.

The sealant 4005 is provided to surround a pixel portion 4002 and a scan line driver circuit 4004 that are provided over the first substrate 4001. The second substrate 4006 is provided over the pixel portion 4002 and the scan line driver circuit 4004. Therefore, the pixel portion 4002 and the scan line driver circuit 4004 are sealed together with a liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region different from the region surrounded by the sealant 4005 over the first substrate 4001.

Note that there is no particular limitation on the connection method of a driver circuit which is separately formed, and a COG method, a wire bonding method, a TAB method, or the like can be used. FIG. 22A1 illustrates an example of mounting the signal line driver circuit 4003 by a COG method, and FIG. 22A2 illustrates an example of mounting the signal line driver circuit 4003 by a TAB method.

The pixel portion 4002 and the scan line driver circuit 4004 provided over the first substrate 4001 each include a plurality of thin film transistors. FIG. 22B illustrates the thin film transistor 4010 included in the pixel portion 4002 and the thin film transistor 4011 included in the scan line driver circuit 4004. Insulating layers 4020 and 4021 are provided over the thin film transistors 4010 and 4011.

As each of the thin film transistors 4010 and 4011, a highly reliable thin film transistor including an oxide semiconductor film to which a metal element is added as a semiconductor layer as described in Embodiment 1 can be employed. Alternatively, the thin film transistor described in Embodiments 2 to 7 may be employed. In this embodiment, the thin film transistors 4010 and 4011 are n-channel thin film transistors.

A pixel electrode layer 4030 included in the liquid crystal element 4013 is electrically connected to the thin film transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033, respectively, each of which functions as an alignment film. The liquid crystal layer 4008 is sandwiched between the pixel electrode layer 4030 and the counter electrode layer 4031 with the insulating layers 4032 and 4033 therebetween.

Note that the first substrate 4001 and the second substrate 4006 can be made of glass, metal (typically, stainless steel), ceramic, or plastic. As plastic, an FRP (fiberglass-reinforced plastics) plate, a PVF (polyvinyl fluoride) film, a polyester film, or an acrylic resin film can be used. Alternatively, a sheet with a structure in which an aluminum foil is sandwiched between PVF films or polyester films can be used.

A columnar spacer denoted by reference numeral 4035 is obtained by selective etching of an insulating film and is provided in order to control the distance (a cell gap) between the pixel electrode layer 4030 and the counter electrode layer 4031. Note that a spherical spacer may also be used. The counter electrode layer 4031 is electrically connected to a common potential line provided over the same substrate as the thin film transistor 4010. With the use of a common connection portion, the counter electrode layer 4031 can be electrically connected to the common potential line through conductive particles provided between the pair of substrates. Note that the conductive particles are contained in the sealant 4005.

Alternatively, a liquid crystal showing a blue phase for which an alignment film is unnecessary may be used. A blue phase is one of the liquid crystal phases, which is generated just before a cholesteric phase changes into an isotropic phase while the temperature of cholesteric liquid crystal is increased. Since the blue phase is only generated within a narrow range of temperatures, a liquid crystal composition containing a chiral agent at 5 wt % or more is used for the liquid crystal layer 4008 in order to broaden the temperature range. The liquid crystal composition which includes a liquid crystal showing a blue phase and a chiral agent has a short response time of 10 μs to 100 μs, has optical isotropy which makes the alignment process unneeded, and has a small viewing angle dependence.

An embodiment of the present invention can also be applied to a reflective liquid crystal display device or a semi-transmissive liquid crystal display device, in addition to a transmissive liquid crystal display device.

An example of the liquid crystal display device is described in which a polarizing plate is provided on the outer surface of the substrate (on the viewer side) and a coloring layer and an electrode layer used for a display element are provided on the inner surface of the substrate; however, the polarizing plate may be provided on the inner surface of the substrate. The stack structure of the polarizing plate and the coloring layer is not limited to that described in this embodiment and may be set as appropriate depending on materials of the polarizing plate and the coloring layer or conditions of manufacturing steps. Furthermore, a light-blocking film serving as a black matrix may be provided.

In addition, in order to reduce the surface roughness of the thin film transistor and to improve the reliability of the thin film transistor, the thin film transistor obtained by Embodiment 1 is covered with the insulating layers (the insulating layer 4020 and the insulating layer 4021) serving as a protective film or a planarizing insulating film. Note that the protective film is provided to prevent entry of impurities contained in the air, such as an organic substance, a metal substance, or water vapor, and is preferably a dense film. The protective film may be formed by a sputtering method to be a single-layer film or a stack using any of a silicon oxide film, a silicon nitride film, a silicon oxynitride film, a silicon nitride oxide film, an aluminum oxide film, an aluminum nitride film, an aluminum oxynitride film, and an aluminum nitride oxide film. Although an example in which the protective film is formed by a sputtering method is described in this embodiment, an embodiment of the present invention is not limited to this method and a variety of methods may be employed.

Here, the insulating layer 4020 having a stack structure is formed as the protective film. As a first layer of the insulating layer 4020, a silicon oxide film is formed by a sputtering method. The use of the silicon oxide film as the protective film has the effect of preventing a hillock of an aluminum film used for the source and drain electrode layers.

In addition, an insulating layer is formed as a second layer of the protective film. In this embodiment, as a second layer of the insulating layer 4020, a silicon nitride film is formed by a sputtering method. The use of the silicon nitride film as the protective film can prevent mobile ions such as sodium ions from entering a semiconductor region, thereby suppressing variations in electric characteristics of the TFT.

After the protective film is formed, the semiconductor layer may be subjected to annealing (300° C. to 400° C.).

The insulating layer 4021 is formed as the planarizing insulating film. As the insulating layer 4021, an organic material having heat resistance such as polyimide, acrylic, benzocyclobutene, polyamide, or epoxy can be used. Other than such organic materials, it is also possible to use a low-dielectric constant material (a low-k material), a siloxane-based resin, PSG (phosphosilicate glass), BPSG (borophosphosilicate glass), or the like. Note that the insulating layer 4021 may be formed by stacking a plurality of insulating films formed of these materials.

Note that a siloxane resin is a resin formed from a siloxane material as a starting material and having a Si—O—Si bond. As a substituent, an organic group (e.g., an alkyl group or an aryl group) or a fluoro group may be used. The organic group may include a fluoro group.

There is no particular limitation on the method for forming the insulating layer 4021, and the insulating layer 4021 can be formed, depending on the material, by using a sputtering method, an SOG method, a spin coating method, a dipping method, a spray coating method, a droplet discharge method (e.g., an inkjet method, screen printing, offset printing, or the like), a doctor knife, a roll coater, a curtain coater, a knife coater, or the like. In the case where the insulating layer 4021 is formed using a material solution, the semiconductor layer may be annealed (at 300° C. to 400° C.) at the same time as a baking step. The baking step of the insulating layer 4021 also serves as the annealing step of the semiconductor layer, whereby a semiconductor device can be manufactured efficiently.

The pixel electrode layer 4030 and the counter electrode layer 4031 can be made of a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

A conductive composition containing a conductive high molecule (also referred to as a conductive polymer) can be used for the pixel electrode layer 4030 and the counter electrode layer 4031. The pixel electrode made of the conductive composition preferably has a sheet resistance of 10000 ohms per square or less and a transmittance of 70% or more at a wavelength of 550 nm. Furthermore, the resistivity of the conductive high molecule contained in the conductive composition is preferably 0.1 Ω·cm or less.

As the conductive high molecule, a so-called π-electron conjugated conductive polymer can be used. For example, it is possible to use polyaniline or a derivative thereof, polypyrrole or a derivative thereof, polythiophene or a derivative thereof, or a copolymer of two or more kinds of them.

In addition, a variety of signals and potentials are supplied to the signal line driver circuit 4003 that is formed separately, and the scan line driver circuit 4004 or the pixel portion 4002 from an FPC 4018.

A connection terminal electrode 4015 is formed from the same conductive film as the pixel electrode layer 4030 included in the liquid crystal element 4013, and a terminal electrode 4016 is formed from the same conductive film as source and drain electrode layers of the thin film transistors 4010 and 4011.

The connection terminal electrode 4015 is electrically connected to a terminal included in the FPC 4018 through an anisotropic conductive film 4019.

Note that FIGS. 22A1, 22A2, and 22B illustrate an example in which the signal line driver circuit 4003 is formed separately and mounted on the first substrate 4001; however, the present invention is not limited to this structure. The scan line driver circuit may be separately formed and then mounted, or only a part of the signal line driver circuit or a part of the scan line driver circuit may be separately formed and then mounted.

Figure 23:
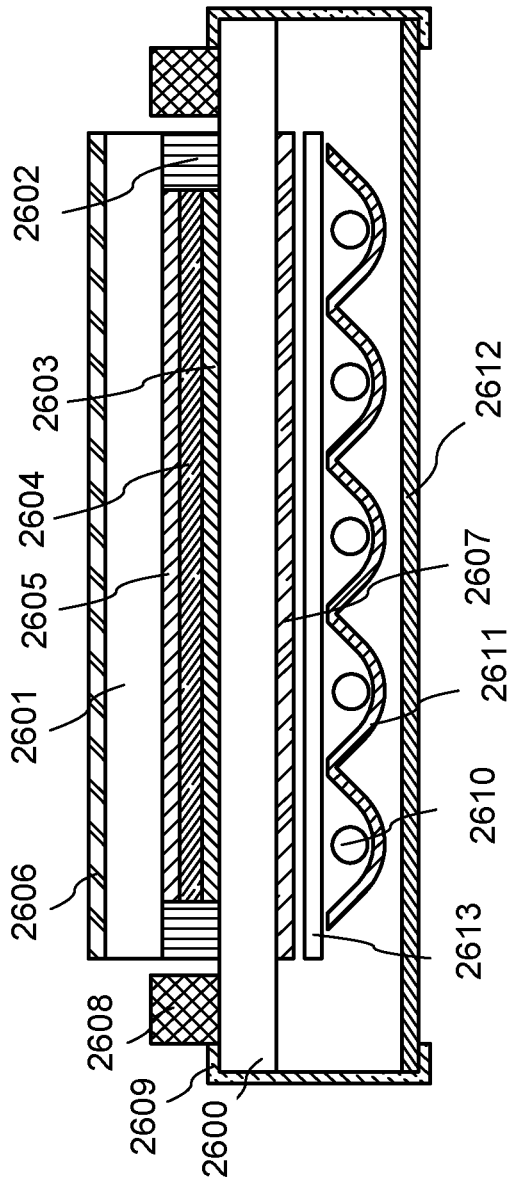
FIG. 23 illustrates a semiconductor device.

FIG. 23 illustrates an example of a liquid crystal display module which is formed as a semiconductor device by using a TFT substrate manufactured according to a manufacturing method disclosed in this specification.

FIG. 23 illustrates an example of a liquid crystal display module, in which a substrate 2600 and a counter substrate 2601 are bonded to each other with a sealant 2602, and a pixel portion 2603 including a TFT or the like, a display element 2604 including a liquid crystal layer, and a coloring layer 2605 are provided between the substrates to form a display region. The coloring layer 2605 is necessary to perform color display. In the case of the RGB system, respective coloring layers corresponding to colors of red, green, and blue are provided for respective pixels. Polarizing plates 2606 and 2607 and a diffusion plate 2613 are provided outside the substrate 2600 and the counter substrate 2601. A light source includes a cold cathode tube 2610 and a reflective plate 2611. A circuit board 2612 is connected to a wiring circuit portion 2608 of the substrate 2600 through a flexible wiring board 2609 and includes an external circuit such as a control circuit or a power source circuit. The polarizing plate and the liquid crystal layer may be stacked with a retardation plate interposed therebetween.

For the liquid crystal display module, a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned micro-cell) mode, an OCB (optical compensated birefringence) mode, an FLC (ferroelectric liquid crystal) mode, an AFLC (antiferroelectric liquid crystal) mode, or the like can be used.

Through the above process, a highly reliable liquid crystal display panel can be manufactured as a semiconductor device.

This embodiment can be implemented in appropriate combination with the structures described in the other embodiments.

Embodiment 10

An example of electronic paper will be described as a semiconductor device.

Figure 13:
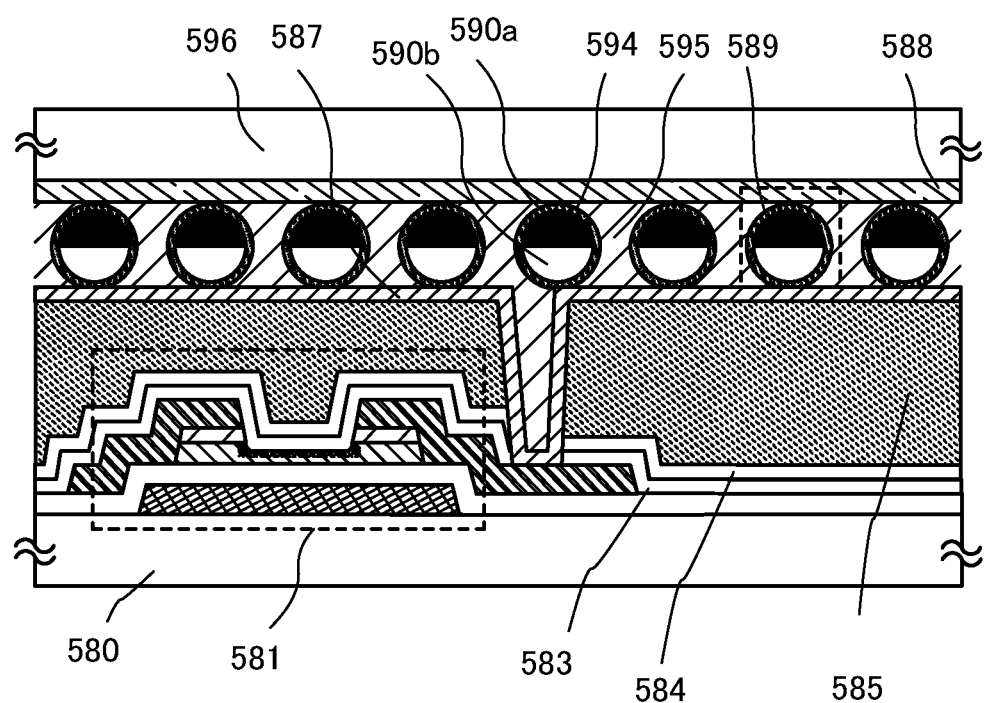
FIG. 13 illustrates a semiconductor device.

FIG. 13 illustrates active matrix electronic paper as an example of a semiconductor device. A thin film transistor 581 used for the semiconductor device can be manufactured in a manner similar to that of the thin film transistor described in Embodiment 1 and is a highly reliable thin film transistor including an oxide semiconductor film to which a metal element is added as a semiconductor layer. The thin film transistor described in Embodiments 2 to 7 can also be used as the thin film transistor 581 of this embodiment.

The electronic paper in FIG. 13 is an example of a display device using a twisting ball display system. The twisting ball display system refers to a method in which spherical particles each colored in black or white are arranged between a first electrode layer and a second electrode layer which are electrode layers used for a display element, and a potential difference is generated between the first electrode layer and the second electrode layer to control orientation of the spherical particles, so that display is performed.

The thin film transistor 581 provided for a substrate 580 is a bottom gate thin film transistor, and a source or drain electrode layer thereof is in contact with a first electrode layer 587 through an opening formed in insulating layers 583, 584, and 585, whereby the thin film transistor 581 is electrically connected to the first electrode layer 587. Between the first electrode layer 587 and a second electrode layer 588 provided for a counter substrate 596, spherical particles 589 each having a black region 590*a*, a white region 590*b*, and a cavity 594 which is filled with liquid around the regions are provided. A space around the spherical particles 589 is filled with a filler 595 such as a resin (FIG. 13). The first electrode layer 587 corresponds to a pixel electrode, and the second electrode layer 588 corresponds to a common electrode. The second electrode layer 588 is electrically connected to a common potential line provided over the same substrate as that for the thin film transistor 581. With the use of a common connection portion, the second electrode layer 588 can be electrically connected to the common potential line through conductive particles provided between a pair of substrates.

Instead of the twisting ball, an electrophoretic element can also be used. A microcapsule having a diameter of about 10 μm to 200 μm in which transparent liquid, positively- or negatively-charged white microparticles, and negatively- or positively-charged black microparticles (having polarity opposite to that of the white microparticles) are encapsulated, is used. In the microcapsule which is provided between the first electrode layer and the second electrode layer, when an electric field is applied by the first electrode layer and the second electrode layer, the white microparticles and the black microparticles move to opposite sides from each other, so that white or black can be displayed. A display element using this principle is an electrophoretic display element and is generally called electronic paper. The electrophoretic display element has higher reflectance than a liquid crystal display element, and thus, an auxiliary light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source.

Through this process, highly reliable electronic paper can be manufactured as a semiconductor device.

This embodiment can be implemented in appropriate combination with the structures described in the other embodiments.

Embodiment 11

An example of a light-emitting display device will be described as a semiconductor device. As a display element included in a display device, a light-emitting element utilizing electroluminescence is described here. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of a voltage to a light-emitting element, electrons and holes are separately injected from a pair of electrodes into a layer containing a light-emitting organic compound, and a current flows. Then, the carriers (electrons and holes) recombine, so that the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. The dispersion-type inorganic EL element has a light-emitting layer where particles of a light-emitting material are dispersed in a binder, and its light emission mechanism is donor-acceptor recombination type light emission which utilizes a donor level and an acceptor level. The thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that description is made here using an organic EL element as a light-emitting element.

Figure 20:
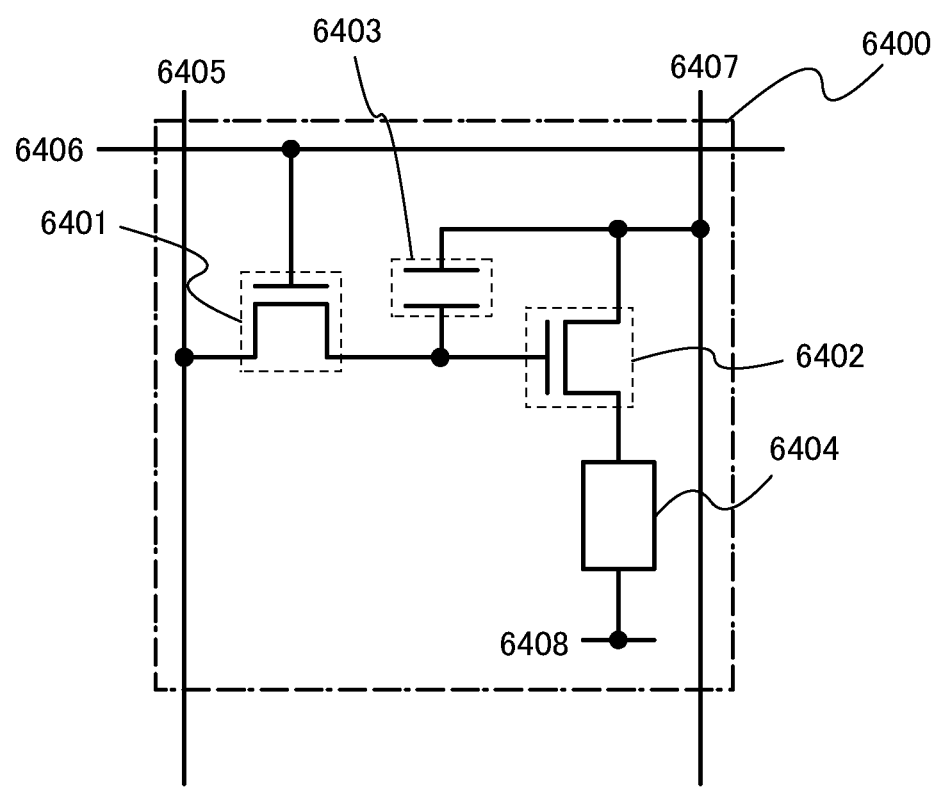
FIG. 20 shows a pixel equivalent circuit of a semiconductor device.

FIG. 20 illustrates an example of a pixel structure as an example of a semiconductor device which can be driven by a digital time grayscale method.

The structure and operation of a pixel which can be driven by a digital time grayscale method will be described. An example is described here in which one pixel includes two n-channel transistors each using an oxide semiconductor layer (an In—Ga—Zn—O-based non-single-crystal film) for a channel formation region.

A pixel 6400 includes a switching transistor 6401, a driving transistor 6402, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driving transistor 6402. The gate of the driving transistor 6402 is connected to a power source line 6407 through the capacitor 6403, a first electrode of the driving transistor 6402 is connected to the power source line 6407, and a second electrode of the driving transistor 6402 is connected to a first electrode (pixel electrode) of the light-emitting element 6404. A second electrode of the light-emitting element 6404 corresponds to a common electrode 6408. The common electrode 6408 is electrically connected to a common potential line provided over the same substrate.

Note that the second electrode (common electrode 6408) of the light-emitting element 6404 is set to be a low power source potential. The low power source potential is lower than a high power source potential which is supplied to the power source line 6407. For example, GND, 0 V, or the like may be set as the low power source potential. The difference between the high power source potential and the low power source potential is applied to the light-emitting element 6404 so that a current flows through the light-emitting element 6404, whereby the light-emitting element 6404 emits light. Thus, each potential is set so that the difference between the high power source potential and the low power source potential is greater than or equal to a forward threshold voltage of the light-emitting element 6404.

When the gate capacitance of the driving transistor 6402 is used as a substitute for the capacitor 6403, the capacitor 6403 can be omitted. The gate capacitance of the driving transistor 6402 may be formed between a channel region and a gate electrode.

Here, in the case of using a voltage-input voltage-driving method, a video signal is input to the gate of the driving transistor 6402 to make the driving transistor 6402 completely turned on or off. That is, the driving transistor 6402 operates in a linear region, and thus, a voltage higher than the voltage of the power source line 6407 is applied to the gate of the driving transistor 6402. Note that a voltage greater than or equal to (power source line voltage+$V_{th}$ of the driving transistor 6402) is applied to the signal line 6405.

In the case of using an analog grayscale method instead of the digital time grayscale method, the same pixel structure as in FIG. 20 can be employed by inputting signals in a different way.

In the case of using the analog grayscale driving method, a voltage greater than or equal to (forward voltage of the light-emitting element 6404+$V_{th}$ of the driving transistor 6402) is applied to the gate of the driving transistor 6402. The forward voltage of the light-emitting element 6404 refers to a voltage to obtain a desired luminance, and includes at least a forward threshold voltage. By inputting a video signal to enable the driving transistor 6402 to operate in a saturation region, a current can flow through the light-emitting element 6404. In order that the driving transistor 6402 can operate in the saturation region, the potential of the power source line 6407 is higher than a gate potential of the driving transistor 6402. With the analog video signal, a current in accordance with the video signal flows through the light-emitting element 6404, and the analog grayscale driving method can be performed.

Note that the pixel structure is not limited to that illustrated in FIG. 20. For example, the pixel in FIG. 20 can further include a switch, a resistor, a capacitor, a transistor, a logic circuit, or the like.

Next, structures of the light-emitting element will be described with reference to FIGS. 21A to 21C. Here, a cross-sectional structure of a pixel will be described by taking an n-channel driving TFT as an example. Driving TFTs 7001, 7011, and 7021 used for semiconductor devices illustrated in FIGS. 21A to 21C can be manufactured in a manner similar to that of the thin film transistor described in Embodiment 1 and are highly reliable thin film transistors each including an oxide semiconductor film to which a metal element is added as a semiconductor layer. Alternatively, the thin film transistor described in Embodiments 2 to 7 can be employed as the driving TFTs 7001, 7011, and 7021.

In order to extract light emitted from the light-emitting element, at least one of an anode and a cathode is required to transmit light. A thin film transistor and a light-emitting element are formed over a substrate. A light-emitting element can have a top emission structure in which light is extracted through the surface opposite to the substrate, a bottom emission structure in which light is extracted through the surface on the substrate side, or a dual emission structure in which light is extracted through the surface opposite to the substrate and the surface on the substrate side. The pixel structure can be applied to a light-emitting element having any of these emission structures.

A light-emitting element having a top emission structure will be described with reference to FIG. 21A.

Figure 21A:
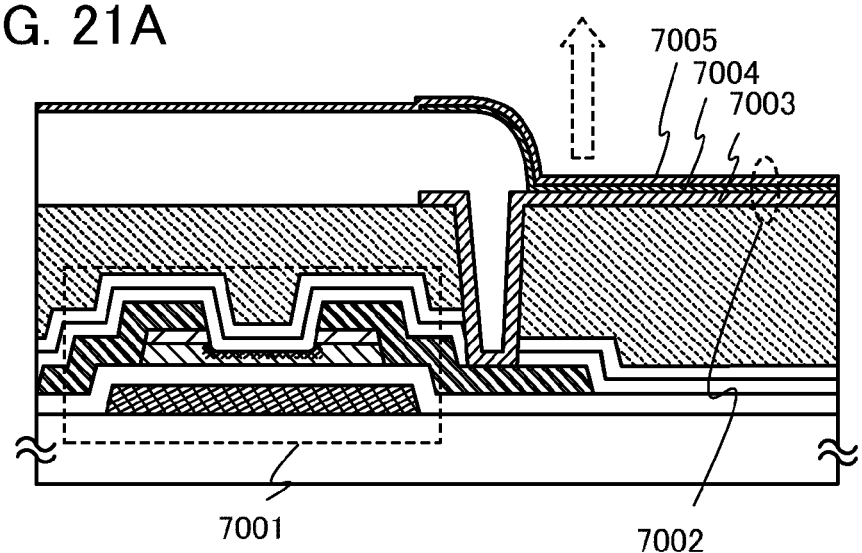
FIGS. 21A to 21C each illustrate a semiconductor device.

FIG. 21A is a cross-sectional view of a pixel in the case where the driving TFT 7001 is of an n-type and light is emitted from a light-emitting element 7002 to an anode 7005 side. In FIG. 21A, a cathode 7003 of the light-emitting element 7002 is electrically connected to the driving TFT 7001, and a light-emitting layer 7004 and the anode 7005 are stacked in this order over the cathode 7003. The cathode 7003 can be made of a variety of conductive materials as long as they have a low work function and reflect light. For example, Ca, Al, CaF, MgAg, AlLi, or the like is preferably used. The light-emitting layer 7004 may be formed as a single layer or a plurality of layers stacked. When the light-emitting layer 7004 is formed as a plurality of layers, the light-emitting layer 7004 is formed by stacking an electron-injecting layer, an electron-transporting layer, a light-emitting layer, a hole-transporting layer, and a hole-injecting layer in this order over the cathode 7003. Note that not all of these layers need to be provided. The anode 7005 is made of a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

The light-emitting element 7002 corresponds to a region where the light-emitting layer 7004 is sandwiched between the cathode 7003 and the anode 7005. In the case of the pixel illustrated in FIG. 21A, light is emitted from the light-emitting element 7002 to the anode 7005 side as indicated by an arrow.

Next, a light-emitting element having a bottom emission structure will be described with reference to FIG. 21B. FIG. 21B is a cross-sectional view of a pixel in the case where the driving TFT 7011 is of an n-type and light is emitted from a light-emitting element 7012 to a cathode 7013 side. In FIG. 21B, the cathode 7013 of the light-emitting element 7012 is formed over a light-transmitting conductive film 7017 which is electrically connected to the driving TFT 7011, and a light-emitting layer 7014 and an anode 7015 are stacked in this order over the cathode 7013. Note that a light-blocking film 7016 for reflecting or blocking light may be formed to cover the anode 7015 when the anode 7015 has a light-transmitting property. For the cathode 7013, various materials can be used, as in the case of FIG. 21A, as long as they are conductive materials having a low work function. Note that the cathode 7013 is formed to have a thickness that can transmit light (preferably, approximately 5 nm to 30 nm). For example, an aluminum film with a thickness of 20 nm can be used as the cathode 7013. Similarly to the case of FIG. 21A, the light-emitting layer 7014 may be formed using either a single layer or a plurality of layers stacked. The anode 7015 is not required to transmit light, but can be made of a light-transmitting conductive material as in the case of FIG. 21A. As the light-blocking film 7016, a metal which reflects light can be used for example; however, it is not limited to a metal film. For example, a resin to which a black pigment is added can also be used.

The light-emitting element 7012 corresponds to a region where the light-emitting layer 7014 is sandwiched between the cathode 7013 and the anode 7015. In the case of the pixel illustrated in FIG. 21B, light is emitted from the light-emitting element 7012 to the cathode 7013 side as indicated by an arrow.

Next, a light-emitting element having a dual emission structure will be described with reference to FIG. 21C. In FIG. 21C, a cathode 7023 of a light-emitting element 7022 is formed over a light-transmitting conductive film 7027 which is electrically connected to the driving TFT 7021, and a light-emitting layer 7024 and an anode 7025 are stacked in this order over the cathode 7023. As in the case of FIG. 21A, the cathode 7023 can be made of a variety of conductive materials as long as they have a low work function. Note that the cathode 7023 is formed to have a thickness that can transmit light. For example, an aluminum film with a thickness of 20 nm can be used as the cathode 7023. As in FIG. 21A, the light-emitting layer 7024 may be formed as either a single layer or a plurality of layers stacked. The anode 7025 can be made of a light-transmitting conductive material as in the case of FIG. 21A.

The light-emitting element 7022 corresponds to a region where the cathode 7023, the light-emitting layer 7024, and the anode 7025 overlap with one another. In the case of the pixel illustrated in FIG. 21C, light is emitted from the light-emitting element 7022 to both the anode 7025 side and the cathode 7023 side as indicated by arrows.

Although an organic EL element is described here as a light-emitting element, an inorganic EL element can also be provided as a light-emitting element.

Note that the example is described in which a thin film transistor (a driving TFT) which controls the driving of a light-emitting element is electrically connected to the light-emitting element; however, a structure may be employed in which a TFT for current control is connected between the driving TFT and the light-emitting element.

Figure 21B:
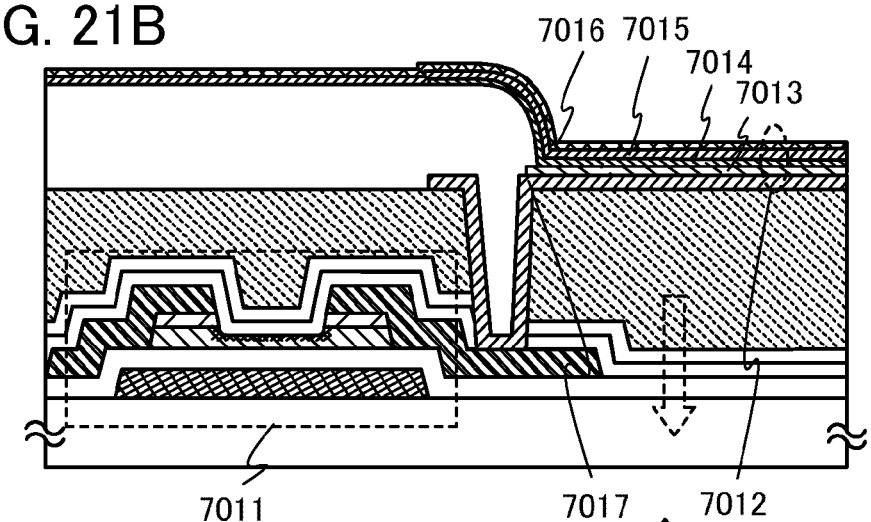
Figure 21C:
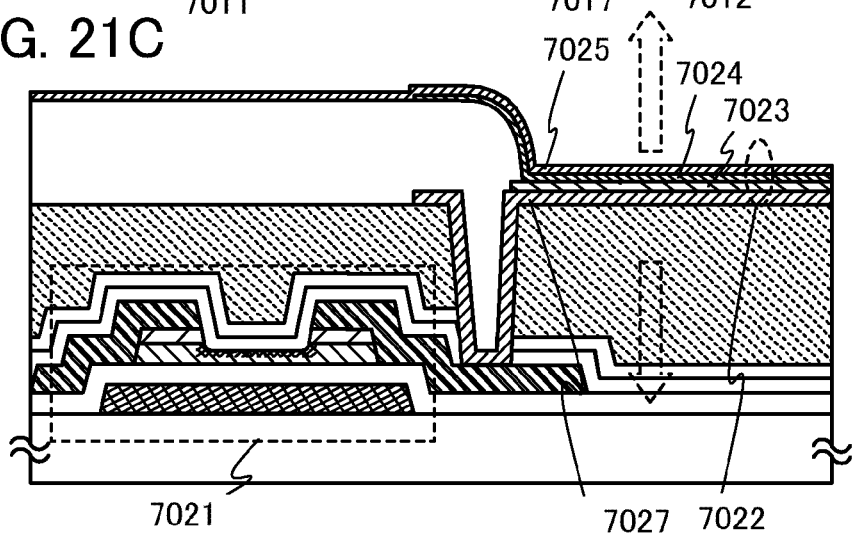

Note that the structure of the semiconductor device is not limited to those illustrated in FIGS. 21A to 21C and can be modified in various ways based on techniques disclosed in this specification.

Figure 24A:
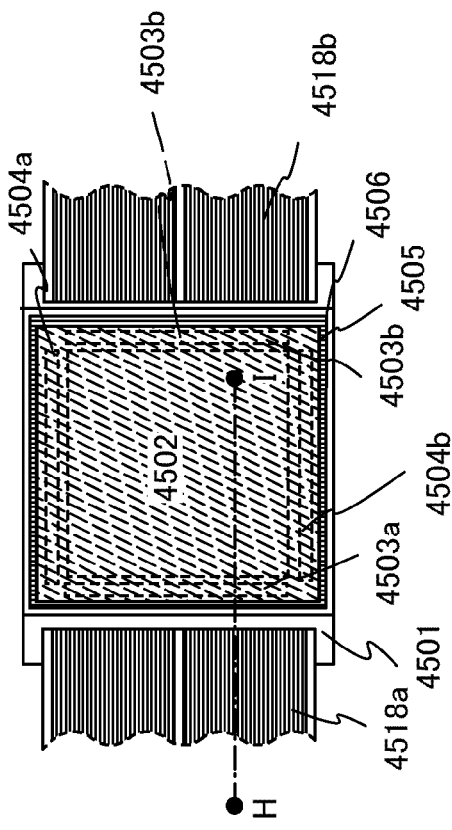
FIGS. 24A and 24B illustrate a semiconductor device.
Figure 24B:
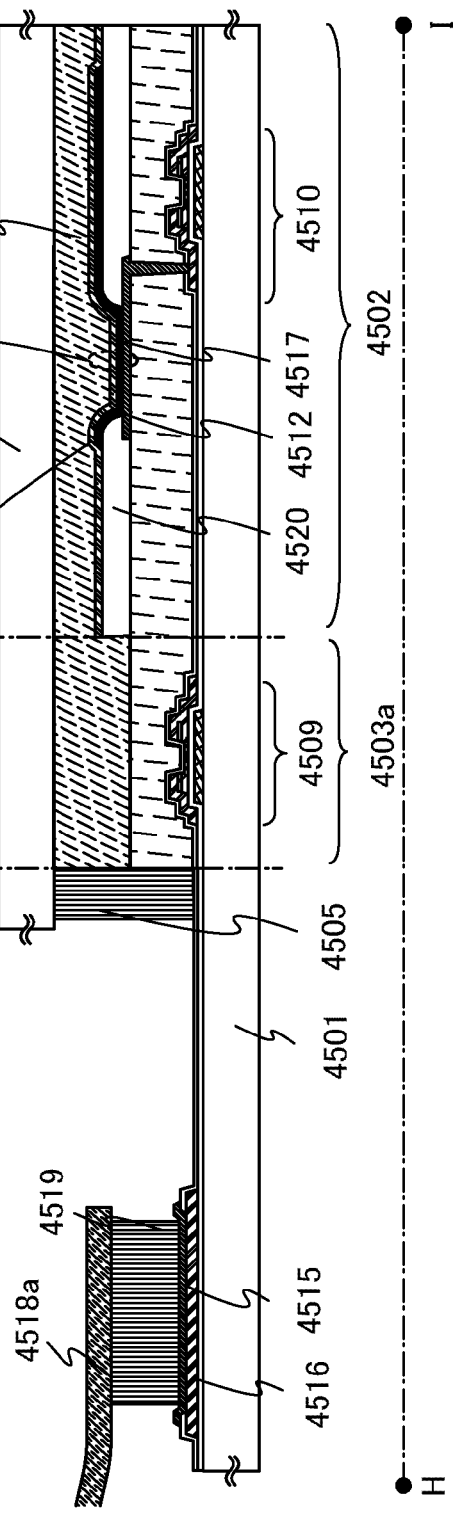

Next, the appearance and a cross section of a light-emitting display panel (also referred to as a light-emitting panel), which is one embodiment of the semiconductor device, will be described with reference to FIGS. 24A and 24B. FIG. 24A is a top view of a panel in which a thin film transistor and a light-emitting element formed over a first substrate are sealed between the first substrate and a second substrate with a sealant. FIG. 24B is a cross-sectional view along line H-I of FIG. 24A.

A sealant 4505 is provided to surround a pixel portion 4502, signal line driver circuits 4503a and 4503b, and scan line driver circuits 4504a and 4504b, which are provided over a first substrate 4501. In addition, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed together with a filler 4507, by the first substrate 4501, the sealant 4505, and the second substrate 4506. It is preferable that a display device be thus packaged (sealed) with a protective film (such as a bonding film or an ultraviolet curable resin film) or a cover material with high air-tightness and little degasification so that the display device is not exposed to the outside air.

The pixel portion 4502, the signal line driver circuits 4503a and 4503b, and the scan line driver circuits 4504a and 4504b formed over the first substrate 4501 each include a plurality of thin film transistors, and a thin film transistor 4510 included in the pixel portion 4502 and a thin film transistor 4509 included in the signal line driver circuit 4503a are illustrated as an example in FIG. 24B.

As each of the thin film transistors 4509 and 4510, the thin film transistor including an oxide semiconductor film to which a metal element is added as a semiconductor layer which is described in Embodiment 1 can be employed. Alternatively, the thin film transistor described in Embodiments 2 to 7 can be employed. The thin film transistors 4509 and 4510 are n-channel thin film transistors.

Moreover, reference numeral 4511 denotes a light-emitting element. A first electrode layer 4517 that is a pixel electrode included in the light-emitting element 4511 is electrically connected to a source electrode layer or a drain electrode layer of the thin film transistor 4510. Note that the structure of the light-emitting element 4511 is, but not limited to, the stack structure which includes the first electrode layer 4517, an electroluminescent layer 4512, and the second electrode layer 4513. The structure of the light-emitting element 4511 can be changed as appropriate depending on the direction in which light is extracted from the light-emitting element 4511, or the like.

A partition wall 4520 is made of an organic resin film, an inorganic insulating film, or organic polysiloxane. It is particularly preferable that the partition wall 4520 be formed of a photosensitive material to have an opening over the first electrode layer 4517 so that a sidewall of the opening is formed as an inclined surface with continuous curvature.

The electroluminescent layer 4512 may be formed as a single layer or a plurality of layers stacked.

A protective film may be formed over the second electrode layer 4513 and the partition wall 4520 in order to prevent oxygen, hydrogen, moisture, carbon dioxide, or the like from entering the light-emitting element 4511. As the protective film, a silicon nitride film, a silicon nitride oxide film, a DLC film, or the like can be formed.

A variety of signals and potentials are supplied to the signal line driver circuits 4503a and 4503b, the scan line driver circuits 4504a and 4504b, or the pixel portion 4502 from FPCs 4518a and 4518b.

A connection terminal electrode 4515 is formed from the same conductive film as the first electrode layer 4517 included in the light-emitting element 4511, and a terminal electrode 4516 is formed from the same conductive film as the source and drain electrode layers included in the thin film transistors 4509 and 4510.

The connection terminal electrode 4515 is electrically connected to a terminal of the FPC 4518a through an anisotropic conductive film 4519.

The second substrate 4506 located in the direction in which light is extracted from the light-emitting element 4511 needs to have a light-transmitting property. In that case, a light-transmitting material such as a glass plate, a plastic plate, a polyester film, or an acrylic film is used.

As the filler 4507, an ultraviolet curable resin or a thermosetting resin can be used, in addition to an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used. For example, nitrogen is used for the filler.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Furthermore, the polarizing plate or the circularly polarizing plate may be provided with an anti-reflection film. For example, anti-glare treatment by which reflected light can be diffused by projections and depressions on the surface so as to reduce the glare can be performed.

The signal line driver circuits 4503a and 4503b and the scan line driver circuits 4504a and 4504b may be mounted as driver circuits formed using a single crystal semiconductor film or a polycrystalline semiconductor film over a substrate separately prepared. Alternatively, only the signal line driver circuits or part thereof, or only the scan line driver circuits or part thereof may be separately formed and mounted. This embodiment is not limited to the structure illustrated in FIGS. 24A and 24B.

Through the above process, a highly reliable light-emitting display device (display panel) can be manufactured as a semiconductor device.

This embodiment can be implemented in appropriate combination with the structures described in the other embodiments.

Embodiment 12

A semiconductor device disclosed in this specification can be applied to electronic paper. Electronic paper can be used for electronic appliances of a variety of fields as long as they display data. For example, electronic paper can be applied to an electronic book device (electronic book), a poster, an advertisement in a vehicle such as a train, or displays of various cards such as a credit card. Examples of the electronic appliances are illustrated in FIGS. 25A and 25B and FIG. 26.

Figure 25A:
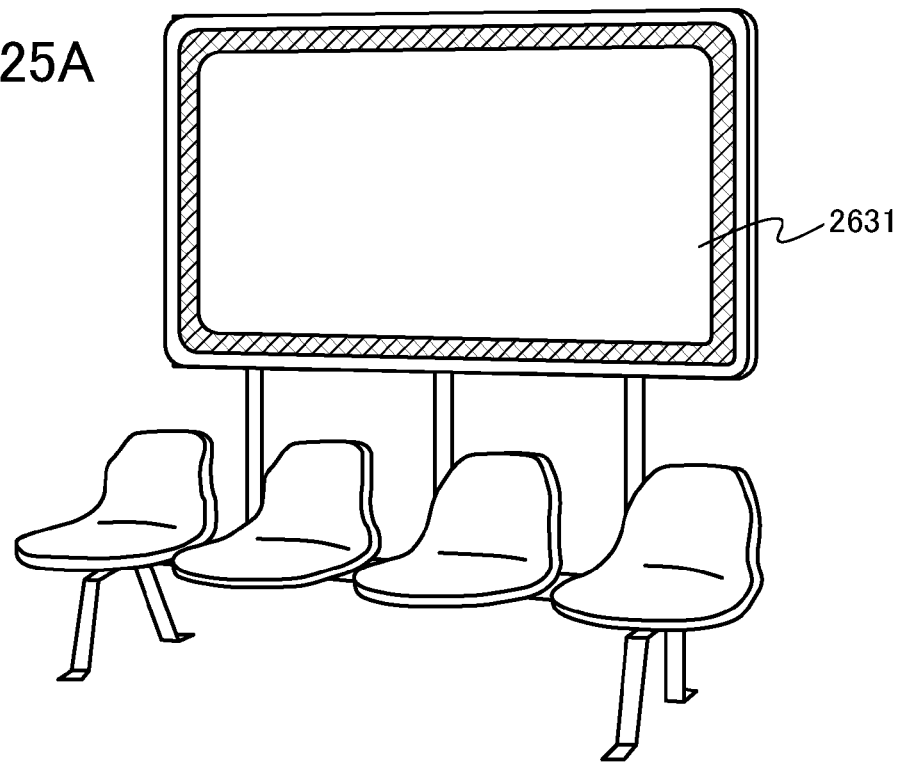
FIGS. 25A and 25B illustrate examples of a usage mode of electronic paper.

FIG. 25A illustrates a poster 2631 using electronic paper. In the case where an advertising medium is printed paper, the advertisement is replaced by hands; however, by using electronic paper disclosed in this specification, the advertising display can be changed in a short time. Furthermore, stable images can be obtained without display defects. Note that the poster may have a configuration capable of wirelessly transmitting and receiving data.

Figure 25B:
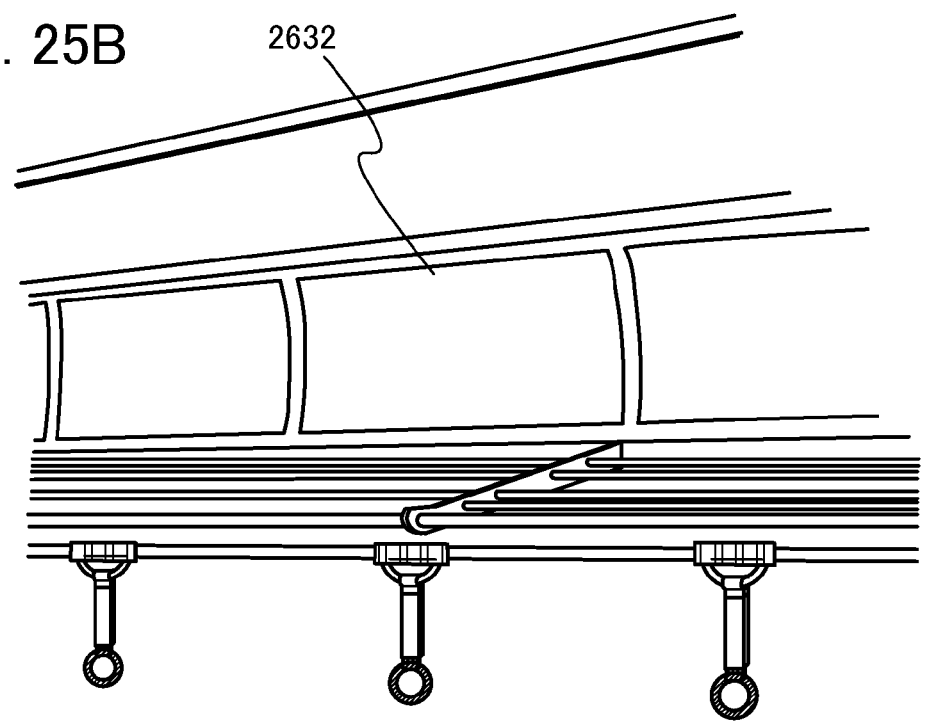

FIG. 25B illustrates an advertisement 2632 in a vehicle such as a train. In the case where an advertising medium is printed paper, the advertisement is replaced by hands; however, by using electronic paper disclosed in this specification, the advertising display can be changed in a short time with less manpower. Furthermore, stable images can be obtained without display defects. Note that the advertisement in a vehicle may have a configuration capable of wirelessly transmitting and receiving data.

Figure 26:
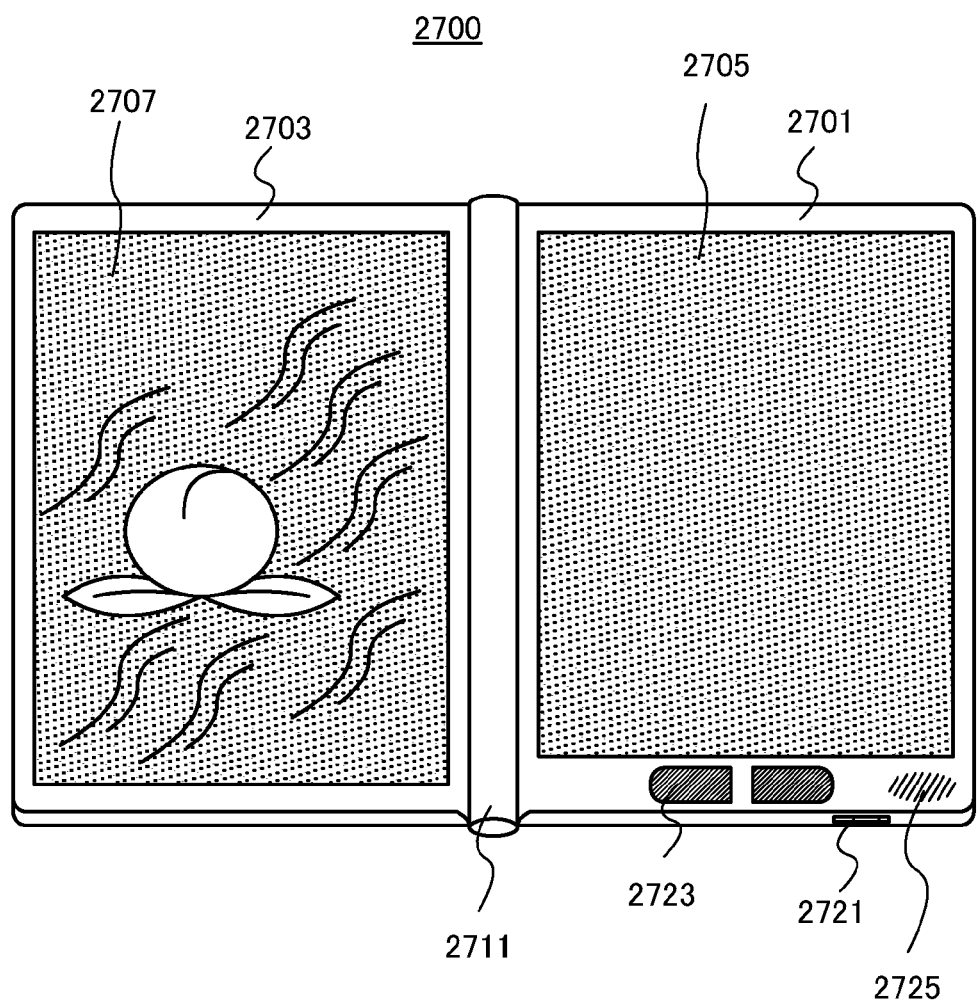
FIG. 26 is an external view of an example of an electronic book device

FIG. 26 illustrates an example of an electronic book device 2700. For example, the electronic book device 2700 includes two housings, a housing 2701 and a housing 2703. The housing 2701 and the housing 2703 are combined with a hinge 2711 so that the electronic book device 2700 can be opened and closed with the hinge 2711 as an axis. With such a structure, the electronic book device 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, text can be displayed on a display portion on the right side (the display portion 2705 in FIG. 26) and graphics can be displayed on a display portion on the left side (the display portion 2707 in FIG. 26).

FIG. 26 illustrates an example in which the housing 2701 is provided with an operation portion and the like. For example, the housing 2701 is provided with a power switch 2721, an operation key 2723, a speaker 2725, and the like. With the operation key 2723, pages can be turned. A keyboard, a pointing device, and the like may be provided on the same surface as the display portion of the housing. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Moreover, the electronic book device 2700 may have a function of an electronic dictionary.

The electronic book device 2700 may have a configuration capable of wirelessly transmitting and receiving data. Through wireless communication, desired book data or the like can be purchased and downloaded from an electronic book server.

Embodiment 13

A semiconductor device disclosed in this specification can be applied as a variety of electronic appliances (including amusement machines). Examples of electronic appliances include television sets (also referred to as televisions or television receivers), monitor of computers or the like, cameras such as digital cameras or digital video cameras, digital photo frames, cellular phones (also referred to as mobile phones or mobile phone sets), portable game consoles, portable information terminals, audio reproducing devices, large-sized game machines such as pachinko machines, and the like.

Figure 27A:
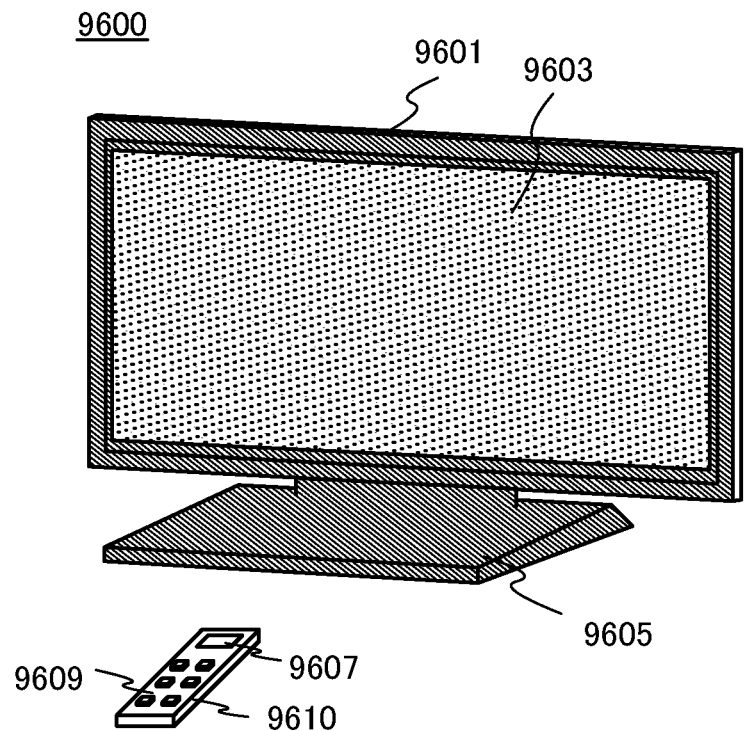
FIGS. 27A and 27B are external views of an example of a television device and an example of a digital photo frame, respectively.

FIG. 27A illustrates an example of a television set 9600. In the television set 9600, a display portion 9603 is incorporated in a housing 9601. Images can be displayed on the display portion 9603. Here, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With the receiver, a general television broadcast can be received. Furthermore, when the television set 9600 is connected to a communication network by wired or wireless connection via the modem, one-way (from a transmitter to a receiver) or two-way (between a transmitter and a receiver, between receivers, or the like) data communication can be performed.

Figure 27B:
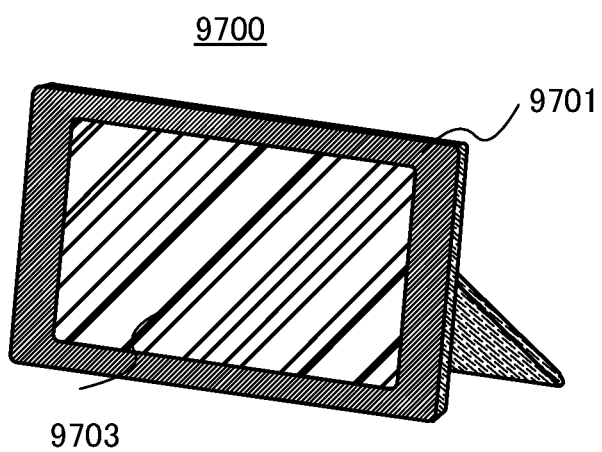

FIG. 27B illustrates an example of a digital photo frame 9700. For example, in the digital photo frame 9700, a display portion 9703 is incorporated in a housing 9701. Various images can be displayed on the display portion 9703. For example, the display portion 9703 can display data of an image shot by a digital camera or the like to function as a normal photo frame.

Note that the digital photo frame 9700 is provided with an operation portion, an external connection portion (a USB terminal, a terminal that can be connected to various cables such as a USB cable, or the like), a recording medium insertion portion, and the like. Although they may be provided on the same surface as the display portion, it is preferable to provide them on the side surface or the back surface for the design of the digital photo frame 9700. For example, a memory storing data of an image shot by a digital camera is inserted in the recording medium insertion portion of the digital photo frame, whereby the image data can be transferred and displayed on the display portion 9703.

The digital photo frame 9700 may have a configuration capable of wirelessly transmitting and receiving data. Through wireless communication, desired image data can be transferred to be displayed.

Figure 28A:
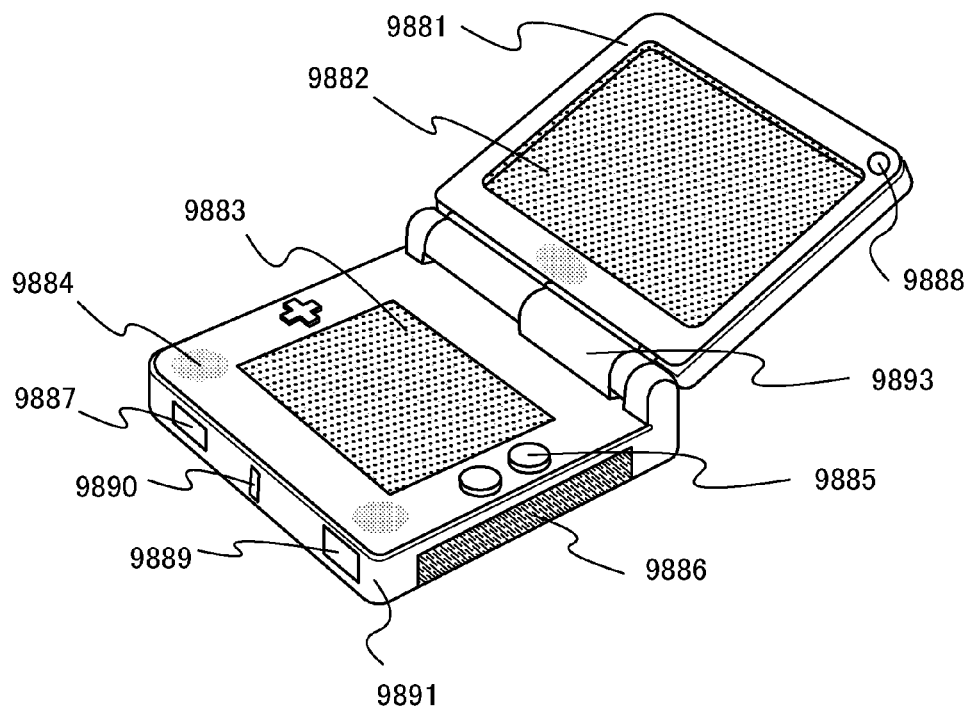
FIGS. 28A and 28B are external views of examples of an amusement machine.

FIG. 28A illustrates a portable amusement machine including two housings: a housing 9881 and a housing 9891. The housings 9881 and 9891 are connected with a connection portion 9893 so as to be opened and closed. A display portion 9882 and a display portion 9883 are incorporated in the housing 9881 and the housing 9891, respectively. In addition, the portable amusement machine illustrated in FIG. 28A includes a speaker portion 9884, a recording medium insertion portion 9886, an LED lamp 9890, an input means (an operation key 9885, a connection terminal 9887, a sensor 9888 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), or a microphone 9889), and the like. It is needless to say that the structure of the portable amusement machine is not limited to the above and other structures provided with at least a semiconductor device disclosed in this specification can be employed. The portable amusement machine may include other accessory equipment as appropriate. The portable amusement machine illustrated in FIG. 28A has a function of reading a program or data stored in a recording medium to display it on the display portion, and a function of sharing information with another portable amusement machine by wireless communication. The portable amusement machine illustrated in FIG. 28A can have various functions without limitation to the above.

Figure 28B:
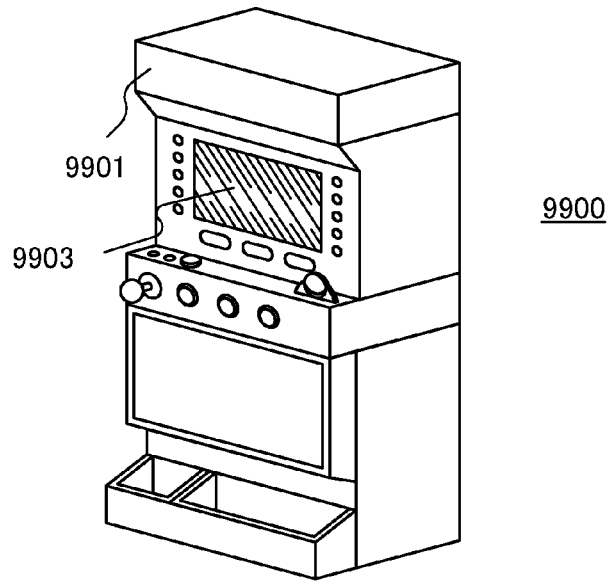

FIG. 28B illustrates an example of a slot machine 9900 which is a large-sized amusement machine. In the slot machine 9900, a display portion 9903 is incorporated in a housing 9901. In addition, the slot machine 9900 includes an operation means such as a start lever or a stop switch, a coin slot, a speaker, and the like. It is needless to say that the structure of the slot machine 9900 is not limited to the above and other structures provided with at least a semiconductor device disclosed in this specification may be employed. The slot machine 9900 may include other accessory equipment as appropriate.

Figure 29A:
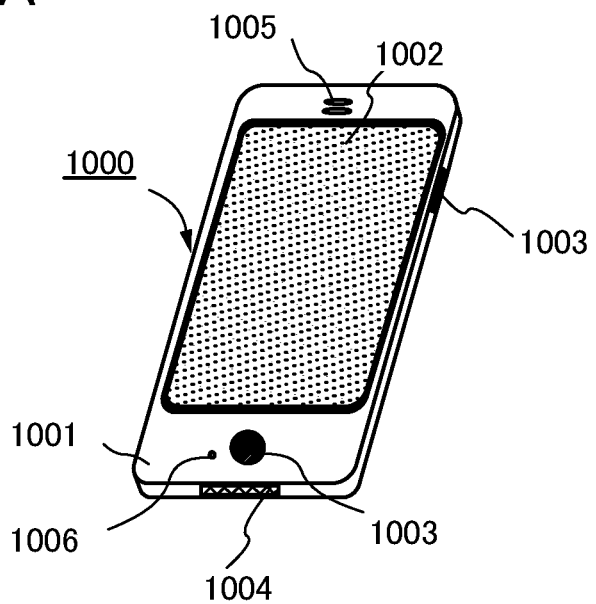
FIGS. 29A and 29B are external views of examples of a cellular phone.

FIG. 29A illustrates an example of a cellular phone 1000. The cellular phone 1000 is provided with a display portion 1002 incorporated in a housing 1001, an operation button 1003, an external connection port 1004, a speaker 1005, a microphone 1006, and the like.

When the display portion 1002 of the cellular phone 1000 illustrated in FIG. 29A is touched with a finger or the like, data can be input into the cellular phone 1000. Furthermore, operations such as making calls and composing mails can be performed by touching the display portion 1002 with a finger or the like.

There are mainly three screen modes for the display portion 1002. The first mode is a display mode mainly for displaying images. The second mode is an input mode mainly for inputting data such as text. The third mode is a display-and-input mode in which two modes of the display mode and the input mode are combined.

For example, in the case of making a call or composing a mail, a text input mode mainly for inputting text is selected for the display portion 1002 so that text displayed on a screen can be input. In that case, it is preferable to display a keyboard or number buttons on almost all the area of the screen of the display portion 1002.

When a detection device including a sensor for detecting inclination, such as a gyroscope or an acceleration sensor, is provided inside the cellular phone 1000, display on the screen of the display portion 1002 can be automatically switched by determining the orientation of the cellular phone 1000 (whether the cellular phone 1000 is placed horizontally or vertically for a landscape mode or a portrait mode).

The screen mode is switched by touching the display portion 1002 or operating the operation button 1003 of the housing 1001. Alternatively, the screen mode may be switched depending on the kind of images displayed on the display portion 1002. For example, when a signal of an image displayed on the display portion is of moving image data, the screen mode is switched to the display mode. When the signal is of text data, the screen mode is switched to the input mode.

Furthermore, in the input mode, when input by touching the display portion 1002 is not performed for a certain period of time while a signal is detected by an optical sensor in the display portion 1002, the screen mode may be controlled so as to be switched from the input mode to the display mode.

The display portion 1002 may function as an image sensor. For example, an image of a palm print, a fingerprint, or the like is taken by touching the display portion 1002 with the palm or the finger, whereby personal authentication can be performed. Furthermore, by providing a backlight or a sensing light source emitting a near-infrared light for the display portion, an image of a finger vein, a palm vein, or the like can also be taken.

Figure 29B:
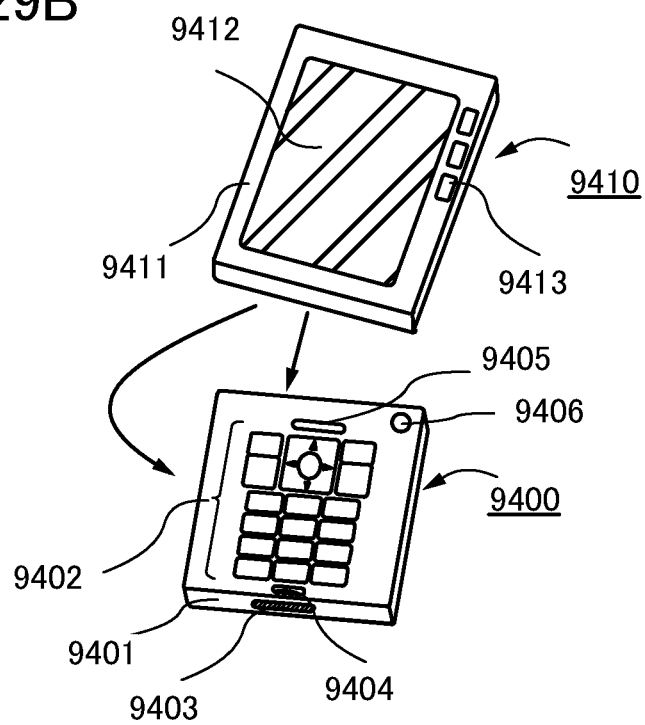

FIG. 29B illustrates another example of a cellular phone. The cellular phone in FIG. 29B has a display device 9410 in a housing 9411, which includes a display portion 9412 and operation buttons 9413, and a communication device 9400 in a housing 9401, which includes operation buttons 9402, an external input terminal 9403, a microphone 9404, a speaker 9405, and a light-emitting portion 9406 that emits light when a phone call is received. The display device 9410 which has a display function can be detached from or attached to the communication device 9400 which has a phone function by moving in two directions represented by arrows. Thus, the display device 9410 and the communication device 9400 can be attached to each other along their short sides or long sides. In addition, when only the display function is needed, the display device 9410 can be detached from the communication device 9400 and used alone. Images or input information can be transmitted or received by wireless or wire communication between the communication device 9400 and the display device 9410, each of which has a rechargeable battery.

This application is based on Japanese Patent Application serial no. 2008-286384 filed with Japan Patent Office on Nov. 7, 2008, the entire contents of which are hereby incorporated by reference.

What is claimed is:

1. A method for manufacturing a semiconductor device, comprising the steps of:
  forming an oxide semiconductor layer;
  performing a plasma treatment under an atmosphere containing $Cl_2$ on the oxide semiconductor layer; and
  performing an oxygen radical treatment on the oxide semiconductor layer.

2. The method for manufacturing a semiconductor device according to claim 1, wherein the oxygen radical treatment is performed under an atmosphere containing $N_2O$.

3. The method for manufacturing a semiconductor device according to claim 1, further comprising a step of adding a metal element to the oxide semiconductor layer,
  wherein the metal element is at least one selected from the group consisting of iron, nickel, cobalt, copper, gold, manganese, molybdenum, tungsten, niobium, and tantalum.

4. The method for manufacturing a semiconductor device according to claim 3,
  wherein the oxide semiconductor layer comprises a first region and a second region,
  wherein the first region contains the metal element,
  wherein the second region does not contain the metal element, and
  wherein the first region is formed in a surface of the oxide semiconductor layer.

5. The method for manufacturing a semiconductor device according to claim 3, wherein the metal element is added by an ion implantation method.

6. A method for manufacturing a semiconductor device, comprising the steps of:
  forming a gate electrode layer over a substrate having an insulating surface;
  forming a gate insulating layer over the gate electrode layer;
  forming an oxide semiconductor layer over the gate insulating layer;
  performing a plasma treatment under an atmosphere containing $Cl_2$ on the oxide semiconductor layer;
  forming a source electrode layer and a drain electrode layer over the oxide semiconductor layer; and
  performing an oxygen radical treatment on a first region of the oxide semiconductor layer which does not overlap the source electrode layer and the drain electrode layer.

7. The method for manufacturing a semiconductor device according to claim 6, wherein the oxygen radical treatment is performed under an atmosphere containing $N_2O$.

8. The method for manufacturing a semiconductor device according to claim 6, further comprising a step of adding a metal element to the first region of the oxide semiconductor layer,
  wherein the metal element is at least one selected from the group consisting of iron, nickel, cobalt, copper, gold, manganese, molybdenum, tungsten, niobium, and tantalum.

9. The method for manufacturing a semiconductor device according to claim 8, wherein the metal element is added by an ion implantation method.

10. The method for manufacturing a semiconductor device according to claim 6, further comprising a step of forming an insulating film so as to cover the oxide semiconductor layer, the source electrode layer, and the drain electrode layer,
  wherein the insulating film is formed in contact with the first region of the oxide semiconductor layer.

* * * * *